(12) United States Patent
Kim et al.

(10) Patent No.: US 12,550,528 B2
(45) Date of Patent: Feb. 10, 2026

(54) DISPLAY APPARATUS WITH EXPANDED DISPLAY AREA

(71) Applicant: Samsung Display Co., Ltd., Yongin-si (KR)

(72) Inventors: Kyongjun Kim, Yongin-si (KR); Yongbin Kim, Yongin-si (KR); Sohyun Shin, Yongin-si (KR); Gunwoo Yang, Yongin-si (KR); Dongjin Lee, Yongin-si (KR); Heejin Jeon, Yongin-si (KR); Hyunyoung Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 666 days.

(21) Appl. No.: 17/891,986

(22) Filed: Aug. 19, 2022

(65) Prior Publication Data
US 2023/0232660 A1 Jul. 20, 2023

(30) Foreign Application Priority Data

Jan. 17, 2022 (KR) .................. 10-2022-0006800

(51) Int. Cl.
| | |
|---|---|
| H01L 29/08 | (2006.01) |
| G09G 3/3233 | (2016.01) |
| H10K 59/121 | (2023.01) |
| H10K 59/126 | (2023.01) |
| H10K 59/65 | (2023.01) |

(52) U.S. Cl.
CPC ......... *H10K 59/121* (2023.02); *G09G 3/3233* (2013.01); *H10K 59/126* (2023.02);
(Continued)

(58) Field of Classification Search
CPC .... H10K 59/121; H10K 59/65; H10K 59/126; G09G 3/3233; G09G 2300/0426;
(Continued)

(56) References Cited

U.S. PATENT DOCUMENTS

| | | |
|---|---|---|
| 2010/0182303 A1 | 7/2010 | Takasugi et al. |
| 2020/0312934 A1* | 10/2020 | Bae .................. H10K 59/124 |

(Continued)

FOREIGN PATENT DOCUMENTS

| | | | |
|---|---|---|---|
| CN | 109872636 A | * 6/2019 | |
| CN | 110189700 A | * 8/2019 | ........... G09G 3/3225 |

(Continued)

OTHER PUBLICATIONS

Cite the machine translation Peng C (CN-109872636-A).*
(Continued)

*Primary Examiner* — Phuc T Dang
(74) *Attorney, Agent, or Firm* — Womble Bond Dickinson (US) LLP

(57) ABSTRACT

A display apparatus includes a first pixel circuit and a second pixel circuit. The first pixel circuit includes a first driving transistor and a first storage capacitor having a first lower storage electrode connected to a gate of the first driving transistor and a first upper storage electrode overlapping the first lower storage electrode. The second pixel circuit includes a second driving transistor and a second storage capacitor including a second lower storage electrode connected to a gate of the second driving transistor and a second upper storage electrode overlapping the second lower storage electrode. A second overlapping area of the second lower storage electrode and the second upper storage electrode is about twice to about four times a first overlapping area of the first lower storage electrode and the first upper storage electrode.

12 Claims, 32 Drawing Sheets

(52) U.S. Cl.
CPC ............... *G09G 2300/0426* (2013.01); *G09G 2300/0819* (2013.01); *G09G 2300/0852* (2013.01); *G09G 2300/0861* (2013.01); *G09G 2320/0233* (2013.01); *G09G 2320/0242* (2013.01); *H10K 59/65* (2023.02)

(58) Field of Classification Search
CPC ... G09G 2300/0819; G09G 2300/0852; G09G 2300/0861
USPC .......................................................... 257/40
See application file for complete search history.

(56) References Cited

U.S. PATENT DOCUMENTS

| | | |
|---|---|---|
| 2021/0074780 A1 | 3/2021 | Woo et al. |
| 2021/0193781 A1 | 6/2021 | Shim et al. |
| 2021/0305521 A1 | 9/2021 | Han et al. |

FOREIGN PATENT DOCUMENTS

| | | |
|---|---|---|
| CN | 112038381 A | 12/2020 |
| CN | 112271205 A | 1/2021 |
| JP | 6555381 B2 | 8/2019 |
| KR | 10-1103615 B1 | 1/2012 |
| KR | 10-2021-0055146 A | 5/2021 |
| KR | 10-2021-0078650 A | 6/2021 |
| KR | 10-2021-0118383 A | 9/2021 |
| KR | 10-2021-0120177 A | 10/2021 |

OTHER PUBLICATIONS

Cite the machine translation Chai H (CN-110189700-A).*
Cite the machine translation Peng C (CN-109872636-A) Nov. 16, 2019.*
Cite the machine translation Chai H (CN-110189700-A) Aug. 30, 2019.*

* cited by examiner

DISPLAY APPARATUS WITH EXPANDED DISPLAY AREA

CROSS-REFERENCE TO RELATED APPLICATION

This application claims priority to and the benefit of Korean Patent Application No. 10-2022-0006800, filed on Jan. 17, 2022, in the Korean Intellectual Property Office (KIPO), the entire disclosure of which is incorporated by reference herein.

BACKGROUND

1. Field

One or more embodiments relate to a display apparatus.

2. Description of the Related Art

A display apparatus is an apparatus that visually displays data. A display apparatus may be used as a display of a small-sized product, such as a cellular phone, or a display of a large-sized product, such as a television.

The display apparatus may include a plurality of pixels, which receive an electrical signal and then emit light, to display an image to the outside. Each pixel may include a display element. For example, in the case of an organic light-emitting display apparatus, an organic light-emitting diode may be included as the display element. Generally, an organic light-emitting display apparatus may include a thin-film transistor and an organic light-emitting diode on a substrate, and the organic light-emitting diode may directly emit light.

Recently, with the diversified usage of a display apparatus, various attempts have been made to develop designs to improve the quality of a display apparatus.

SUMMARY

Aspects of one or more embodiments of the present disclosure are directed to a display apparatus, in which a display area is expanded.

The technical objectives to be achieved by the disclosure are not limited thereto. Other technical objectives that are not mentioned herein would be clearly understood by one of ordinary skill in the art based on the description of the disclosure.

Additional aspects will be set forth in part in the description which follows and, in part, will be apparent from the description, or may be learned by practice of the presented embodiments of the disclosure.

According to one or more embodiments, a display apparatus includes a first pixel circuit, a first display element connected to the first pixel circuit, a second pixel circuit, and a second display element connected to the second pixel circuit, wherein the first pixel circuit includes a first driving transistor configured to control a first current flowing to the first display element, and a first storage capacitor having a first lower storage electrode connected to a gate of the first driving transistor and a first upper storage electrode overlapping the first lower storage electrode. The second pixel circuit includes a second driving transistor configured to control a second current flowing to the second display element, and a second storage capacitor having a second lower storage electrode connected to a gate of the second driving transistor and a second upper storage electrode overlapping the second lower storage electrode. A second overlapping area of the second lower storage electrode and the second upper storage electrode is about twice to about four times a first overlapping area of the first lower storage electrode and the first upper storage electrode.

The first pixel circuit may further include a first compensation transistor configured to connect a drain of the first driving transistor with the gate of the first driving transistor in response to a first scan signal and a first boosting capacitor having a first upper boosting electrode connected to the gate of the first driving transistor and a first lower boosting electrode connected to a gate of the first compensation transistor and overlapping the first upper boosting electrode. The second pixel circuit may further include a second compensation transistor configured to connect a drain of the second driving transistor with the gate of the second driving transistor in response to a second scan signal and a second boosting capacitor having a second upper boosting electrode connected to the gate of the second driving transistor and a second lower boosting electrode connected to a gate of the second compensation transistor and overlapping the second upper boosting electrode. A fourth overlapping area of the second upper boosting electrode and the second lower boosting electrode may be about five times to about eight times a third overlapping area of the first upper boosting electrode and the first lower boosting electrode.

The first boosting capacitor may have a first boosting capacitance. The second boosting capacitor may have a second boosting capacitance, the second boosting capacitance being about one time to about five times the first boosting capacitance.

The first storage capacitor may have a first storage capacitance. The second storage capacitor may have a second storage capacitance. The first boosting capacitor may have a first boosting capacitance. The second boosting capacitor may have a second boosting capacitance. A ratio of the second boosting capacitance to the second storage capacitance may be greater than a ratio of the first boosting capacitance to the first storage capacitance.

The second storage capacitor may have a second storage capacitance. The second boosting capacitor may have a second boosting capacitance. A ratio of the second boosting capacitance to the second storage capacitance may be about 4% to about 9%.

The first pixel circuit may further include a first scan transistor configured to transmit a first data voltage to the first driving transistor in response to a third scan signal and a third boosting capacitor having a third upper boosting electrode connected to the gate of the first driving transistor and a third lower boosting electrode connected to a gate of the first scan transistor and overlapping the third upper boosting electrode. The second pixel circuit may further include a second scan transistor configured to transmit a second data voltage to the second driving transistor in response to a fourth scan signal and a fourth boosting capacitor having a fourth upper boosting electrode connected to the gate of the second driving transistor and a fourth lower boosting electrode connected to a gate of the second scan transistor and overlapping the fourth upper boosting electrode. A sixth overlapping area of the fourth upper boosting electrode and the fourth lower boosting electrode may be about six times to about nine times a fifth overlapping area of the third upper boosting electrode and the third lower boosting electrode.

The first storage capacitor may have a first storage capacitance. The second storage capacitor may have a second storage capacitance. The third boosting capacitor may have a third boosting capacitance. The fourth boosting capacitor may have a fourth boosting capacitance. A ratio of the fourth boosting capacitance to the second storage capacitance may be less than a ratio of the third boosting capacitance to the first storage capacitance.

The second storage capacitor may have a second storage capacitance. The fourth boosting capacitor may have a fourth boosting capacitance. A ratio of the fourth boosting capacitance to the second storage capacitance may be about 1% to about 3%.

Conductive types of the first compensation transistor and the second compensation transistor may be opposite to conductive types of the first scan transistor and the second scan transistor.

The first storage capacitor may have a first storage capacitance. The second storage capacitor may have a second storage capacitance, the second storage capacitance being about one and a half times to about five times the first storage capacitance.

The first driving transistor may include a first semiconductor layer and the first lower storage electrode on the first semiconductor layer and functioning as the gate of the first driving transistor. The second driving transistor may include a second semiconductor layer and the second lower storage electrode on the second semiconductor layer and functioning as the gate of the second driving transistor. The first semiconductor layer may include a first channel area overlapping the first lower storage electrode and having a Ω shape. The second semiconductor layer may include a second channel area overlapping the second lower storage electrode and having a square shape.

The display apparatus may further include a first area, in which the first pixel circuit and the first display element are arranged, a second area, in which the second display element is arranged, the second area being at least partially surrounded by the first area and having a light transmittance that is greater than a light transmittance of the first area, and a third area, which is between the first area and the second area, and in which the second pixel circuit is arranged.

The display apparatus may further include a third pixel circuit in the third area and a third display element in the third area and connected to the third pixel circuit. The third pixel circuit includes a third driving transistor configured to control a third current flowing to the third display element and a third storage capacitor having a third lower storage electrode connected to a gate of the third driving transistor and a third upper storage electrode overlapping the third lower storage electrode. A third overlapping area of the third lower storage electrode and the third upper storage electrode may be about twice to about four times the first overlapping area.

According to one or more embodiments, a display apparatus includes a first pixel circuit, a first display element connected to the first pixel circuit, a second pixel circuit, and a second display element connected to the second pixel circuit, wherein the first pixel circuit include a first driving transistor configured to control a first current flowing to the first display element and a first storage capacitor connected to a gate of the first driving transistor and having a first storage capacitance. The second pixel circuit includes a second driving transistor configured to control a second current flowing to the second display element and a second storage capacitor connected to a gate of the second driving transistor and having a second storage capacitance, the second storage capacitance being about one and a half times to about five times the first storage capacitance.

The first pixel circuit may further include a first compensation transistor configured to connect a drain of the first driving transistor with the gate of the first driving transistor in response to a first scan signal and a first boosting capacitor connected between the gate of the first driving transistor and a gate of the first compensation transistor and having a first boosting capacitance. The second pixel circuit may further include a second compensation transistor configured to connect a drain of the second driving transistor with the gate of the second driving transistor in response to a second scan signal and a second boosting capacitor connected between the gate of the second driving transistor and a gate of the second compensation transistor and having a second boosting capacitance.

The second boosting capacitance may be about one time to about five times the first boosting capacitance.

A ratio of the second boosting capacitance to the second storage capacitance may be greater than a ratio of the first boosting capacitance to the first storage capacitance.

A ratio of the second boosting capacitance to the second storage capacitance may be about 4% to about 9%.

The first pixel circuit may further include a first scan transistor configured to transmit a first data voltage to the first driving transistor in response to a third scan signal and a third boosting capacitor connected between the gate of the first driving transistor and a gate of the first scan transistor and having a third boosting capacitance. The second pixel circuit may further include a second scan transistor configured to transmit a second data voltage to the second driving transistor in response to a fourth scan signal and a fourth boosting capacitor connected between the gate of the second driving transistor and a gate of the second scan transistor and having a fourth boosting capacitance.

A ratio of the fourth boosting capacitance to the second storage capacitance may be less than a ratio of the third boosting capacitance to the first storage capacitance.

A ratio of the fourth boosting capacitance to the second storage capacitance may be about 1% to about 3%.

Conductive types of the first compensation transistor and the second compensation transistor may be opposite to conductive types of the first scan transistor and the second scan transistor.

The display apparatus may further include a first area, in which the first pixel circuit and the first display element are arranged, a second area, in which the second display element is arranged, the second area being at least partially surrounded by the first area and having a light transmittance that is greater than a light transmittance of the first area, and a third area, which is between the first area and the second area, and in which the second pixel circuit is arranged.

The display apparatus may further include a third pixel circuit in the third area and a third display element in the third area and connected to the third pixel circuit. The third pixel circuit includes a third driving transistor configured to control a third current flowing to the third display element and a third storage capacitor connected to a gate of the third driving transistor and having a third storage capacitance, the third storage capacitor being about one and a half times to about five times the first storage capacitance.

According to one or more embodiments, a display apparatus, in which an optical device is included, and in which a component area overlapping the optical device, a main area at least partially surrounding the component area, and a middle area between the component area and the main area are defined, includes a first pixel circuit in the main area of a substrate and including a first driving transistor having a first semiconductor layer and a first lower storage electrode on the first semiconductor layer, a first display element in the main area of the substrate and connected to the first pixel circuit, a second pixel circuit in the middle area of the substrate and including a second driving transistor having a second semiconductor layer and a second lower storage electrode on the second semiconductor layer, and a second display element in the component area of the substrate and connected to the second pixel circuit. The first semiconductor layer includes a first channel area overlapping the first lower storage electrode and having a Ω shape. The second semiconductor layer includes a second channel area overlapping the second lower storage electrode and having a square shape.

The display apparatus may further include a third pixel circuit in the middle area of the substrate and including a third driving transistor having a third semiconductor layer and a third lower storage electrode on the third semiconductor layer and a third display element in the middle area of the substrate and connected to the third pixel circuit. The third semiconductor layer includes a third channel area overlapping the third lower storage electrode and having a square shape.

The first pixel circuit may further include a first storage capacitor having the first lower storage electrode and a first upper storage electrode on the first lower storage electrode. The second pixel circuit may further include a second storage capacitor having the second lower storage electrode and a second upper storage electrode on the second lower storage electrode. A second overlapping area of the second lower storage electrode and the second upper storage electrode may be about twice to about four times a first overlapping area of the first lower storage electrode and the first upper storage electrode.

The first pixel circuit may further include a first compensation transistor configured to connect a drain of the first driving transistor with a gate of the first driving transistor in response to a first scan signal and a first boosting capacitor having a first upper boosting electrode connected to the gate of the first driving transistor and a first lower boosting electrode connected to a gate of the first compensation transistor and overlapping the first upper boosting electrode. The second pixel circuit may further include a second compensation transistor configured to connect a drain of the second driving transistor with a gate of the second driving transistor in response to a second scan signal and a second boosting capacitor having a second upper boosting electrode connected to the gate of the second driving transistor and a second lower boosting electrode connected to a gate of the second compensation transistor and overlapping the second upper boosting electrode. A fourth overlapping area of the second upper boosting electrode and the second lower boosting electrode may be about five times to about eight times a third overlapping area of the first upper boosting electrode and the first lower boosting electrode.

The first pixel circuit may further include a first scan transistor configured to transmit a first data voltage to the first driving transistor in response to a third scan signal and a third boosting capacitor having a third upper boosting electrode connected to a gate of the first driving transistor and a third lower boosting electrode connected to a gate of the first scan transistor and overlapping the third upper boosting electrode. The second pixel circuit may further include a second scan transistor configured to transmit a second data voltage to the second driving transistor in response to a fourth scan signal and a fourth boosting capacitor including a fourth upper boosting electrode connected to a gate of the second driving transistor and a fourth lower boosting electrode connected to a gate of the second scan transistor and overlapping the fourth upper boosting electrode. A sixth overlapping area of the fourth upper boosting electrode and the fourth lower boosting electrode may be about six times to about nine times a fifth overlapping area of the third upper boosting electrode and the third lower boosting electrode.

These general and specific embodiments may be implemented by using a system, a method, a computer program, or a combination of the system, the method, and the computer program.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
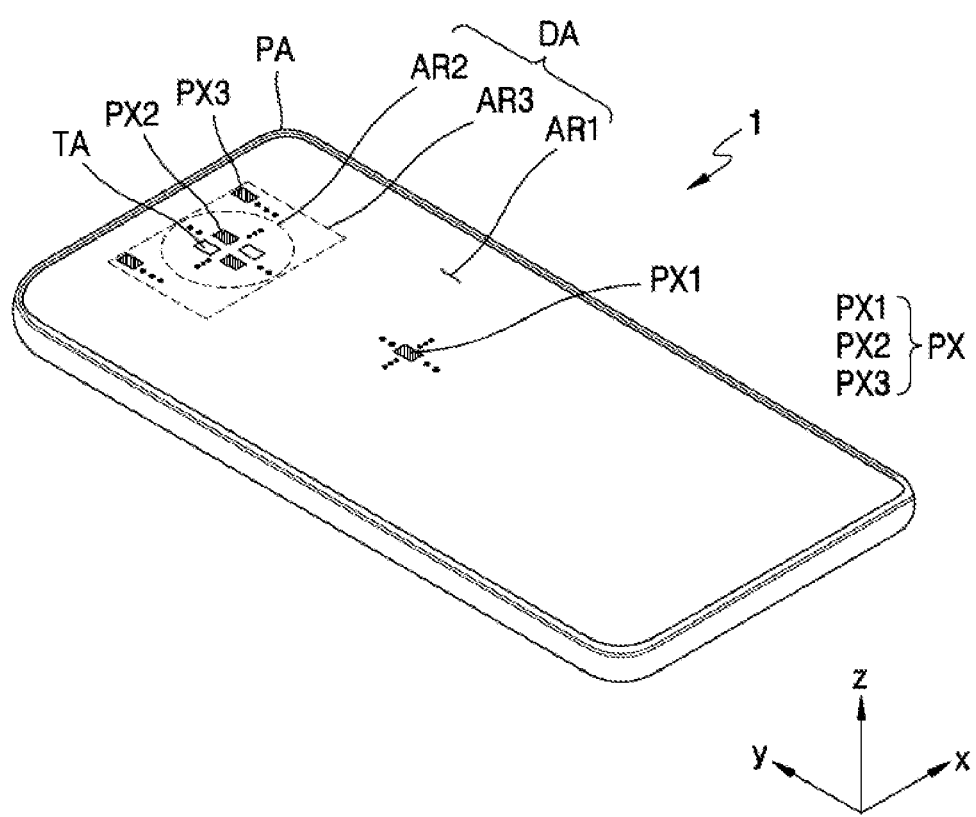
FIG. 1 is a schematic perspective view of a display apparatus according to one or more embodiments.

Reference will now be made in more detail to embodiments, examples of which are illustrated in the accompanying drawings. Like reference numerals refer to like elements throughout, and duplicative descriptions thereof may not be provided. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in more detail. Effects and characteristics of the disclosure, and realizing methods thereof will become apparent by referring to the drawings and embodiments described in more detail below. However, the disclosure is not limited to the embodiments disclosed hereinafter and may be realized in various forms.

Hereinafter, embodiments of the disclosure will be described in more detail by referring to the accompanying drawings. In descriptions with reference to the drawings, the same reference numerals are given to components that are the same or substantially the same and descriptions will not be repeated.

It will be understood that although the terms "first," "second," etc. may be used herein to describe various components, these components should not be limited by these terms. These components are only used to distinguish one component from another.

As used herein, the singular expressions "a," "an," and "the" are intended to include the plural forms as well, unless the context clearly indicates otherwise.

It will be further understood that the terms "includes," "including," "comprises" and/or "comprising" used herein specify the presence of stated features or components, but do not preclude the presence or addition of one or more other features or components.

It will be understood that when a layer, region, or element is referred to as being formed "on" another layer, area, or element, it can be directly or indirectly formed on the other layer, region, or element. That is, for example, intervening layers, regions, or elements may be present.

Sizes of elements in the drawings may be exaggerated for convenience of explanation. For example, sizes and thicknesses of the elements in the drawings are randomly indicated for convenience of explanation, and thus, the disclosure is not necessarily limited to the illustrations of the drawings.

When a certain embodiment may be implemented differently, a specific process order may be performed differently from the described order. For example, two consecutively described processes may be performed substantially at the same time or performed in an order opposite to the described order.

In this specification, the expression "A and/or B" may indicate A, B, or A and B. Also, the expression "at least one of A and B" may indicate A, B, or A and B.

In the embodiments hereinafter, it will be understood that when an element, an area, or a layer is referred to as being connected to another element, area, or layer, it can be directly and/or indirectly connected to the other element, area, or layer. For example, it will be understood in this specification that when an element, an area, or a layer is referred to as being in contact with or being electrically connected to another element, area, or layer, it can be directly and/or indirectly in contact with or electrically connected to the other element, area, or layer.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Further, the use of "may" when describing embodiments of the present disclosure refers to "one or more embodiments of the present disclosure."

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

FIG. 1 is a schematic perspective view of a display apparatus 1 according to one or more embodiments.

Referring to FIG. 1, the display apparatus 1 may include a display area DA and a peripheral area PA outside the display area DA. The display area DA may include a first area (or a main area) AR1, a second area (or a component area) AR2 around or at least partially surrounded by the first area AR1, and a third area (or a middle area) AR3 between the first area AR1 and the second area AR2. The first through third areas AR1 through AR3 may separately or together display an image. The peripheral area PA may be a type of non-display area in which display elements are not arranged. The display area DA may be completely surrounded by the peripheral area PA.

FIG. 1 illustrates that one second area AR2 is located in the first area AR1. According to another embodiment, the display apparatus 1 may include two or more second areas AR2, and the second areas AR2 may have different shapes and sizes from each other. From a direction approximately perpendicular to an upper surface of the display apparatus 1, the second area AR2 may have various suitable shapes, such as a polygonal shape including a circular shape, an oval shape, a quadrangular shape, a star shape, a diamond shape, etc. Also, FIG. 1 illustrates that the second area AR2 is arranged at the upper center side (a +y direction) of the first area AR1 that approximately has a quadrangular shape when seen from a direction approximately perpendicular to the upper surface of the display apparatus 1. However, the second area AR2 may be arranged at a side of the first area AR1 that has the quadrangular shape. The side includes, for example, an upper right side or an upper left side.

The display apparatus 1 may provide an image by using a plurality of pixels PX arranged in the display area DA. The display apparatus 1 may provide an image by using a plurality of first pixels PX1 arranged in the first area AR1, a plurality of second pixels PX2 arranged in the second area AR2, and a plurality of third pixels PX3 arranged in the third area AR3. The first pixels PX1, the second pixels PX2, and the third pixels PX3 may each include display elements. The first pixels PX1, the second pixels PX2, and the third pixels PX3 may each include display elements, such as organic light-emitting diodes OLED. Each pixel PX may emit, for example, red, green, or blue light through the organic light-emitting diode OLED. Each pixel PX may denote a sub-pixel emitting a different color of light, and each pixel PX may be, for example, one of a red sub-pixel, a green sub-pixel, and a blue sub-pixel.

As described below with reference to FIG. 2, a component 50 that is an electronic element may be arranged below a display panel, to correspond to the second area AR2. The component 50 may correspond to a camera using infrared rays or visible rays and may include a capturing device. In one or more embodiments, the component 50 may correspond to a solar battery, a flash device, an illuminance sensor, a proximity sensor, an iris sensor, etc. In one or more embodiments, the component 50 may have a sound-receiving function. To minimize or reduce the limitation of this function of the component 50, the second area AR2 may include a transmission area TA, through which light and/or sound output from the component 50 to the outside or progressing toward the component 50 from the outside may be transmitted. In the case of a display panel and a display apparatus including the display panel according to one or more embodiments, when light is transmitted through the second area AR2, light transmittance may be about 10% or greater, more specifically, about 40% or greater, about 25% or greater, about 50% or greater, about 85% or greater, or about 90% or greater.

As described above, the second pixels PX2 may be arranged in the second area AR2. The second pixels PX2 may emit light to provide a certain image. The image displayed on the second area AR2 may correspond to an auxiliary image, which may have a lower resolution than an image displayed on the first area AR1. For example, when the second area AR2 includes the transmission area TA through which light and/or sound may be transmitted, and pixels are not arranged in the transmission area TA, the number of second pixels PX2 arranged per unit area may be less than the number of first pixels PX1 arranged per unit area.

Also, the third area AR3 may not include a transmission area TA, but as described below, one or more pixel circuits (e.g., a second pixel circuit PC2 of FIG. 2) arranged in the third area AR3 may be configured to drive the second pixels PX2 in the second area AR2, and the number of third pixels PX3 per unit area may be less than the number of first pixels PX1 per unit area.

According to one or more embodiments, the number of second pixels PX2 per unit area may be the same as the number of third pixels PX3 per unit area.

It is described above that the number of second pixels PX2 arranged per unit area may be less than the number of first pixels PX1 arranged per unit area. However, according to another embodiment, the number of second pixels PX2 arranged per unit area may be the same or substantially the same as the number of first pixels PX1 arranged per unit area.

Also, it is described above that the number of third pixels PX3 arranged per unit area may be less than the number of first pixels PX1 arranged per unit area. However, according to another embodiment, the number of third pixels PX3 arranged per unit area may be the same or substantially the same as the number of first pixels PX1 arranged per unit area.

Figure 2:
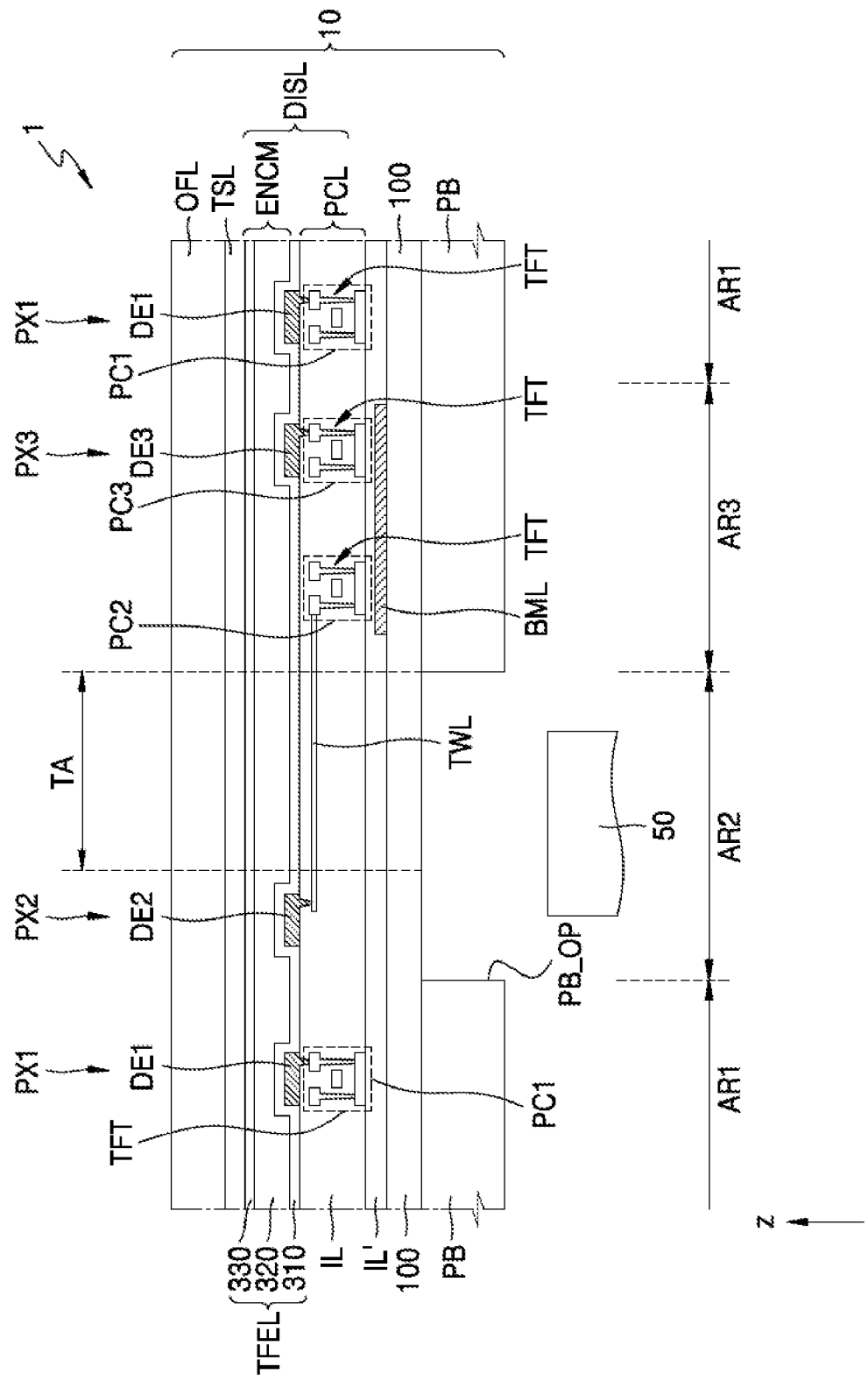
FIG. 2 is a schematic cross-sectional view of a portion of a section of a display apparatus according to one or more embodiments.

FIG. 2 is a schematic cross-sectional view of a portion of a section of the display apparatus 1 according to one or more embodiments.

Referring to FIG. 2, the display apparatus 1 may include a display panel 10 and the component 50 arranged to overlap the display panel 10. A cover window protecting the display panel 10 may further be arranged above the display panel 10.

The display panel 10 may include the first area AR1 on which a main image is displayed, the second area AR2 overlapped by the component 50, and the third area AR3 between the first area AR1 and the second area AR2. The display panel 10 may include a substrate 100, a display layer DISL on the substrate 100, a touch screen layer TSL, an optical functional layer OFL, and a protection member PB below the substrate 100. Because the display panel 10 includes the substrate 100, it may be understood that the first through third areas AR1 through AR3 are defined on the substrate 100.

The display layer DISL may include a circuit layer PCL including a transistor TFT, a display element layer including a first display element DE1, a second display element DE2, and a third display element DE3, and an encapsulation member ENCM, such as a thin-film encapsulation layer TFEL, an encapsulation substrate, etc. Insulating layers IL and IL' may be arranged in the display layer DISL between the substrate 100 and the display layer DISL.

The substrate 100 may include an insulating material, such as glass, quartz, and polymer resins. The substrate 100 may include a rigid substrate or a flexible substrate, which may be bent, folded, or rolled.

The display panel 10 may provide an image by using a plurality of pixels PX. From among the pixels PX, first pixels PX1 may be arranged in the first area AR1, second pixels PX2 may be arranged in the second area AR2, and third pixels PX3 may be arranged in the third area AR3. The first pixel PX1 may be realized by emission of the first display element DE1 connected (e.g., electrically connected) to a first pixel circuit PC1, the second pixel PX2 may be realized by emission of the second display element DE2 connected (e.g., electrically connected) to the second pixel circuit PC2, and the third pixel PX3 may be realized by emission of the third display element DE3 connected (e.g., electrically connected) to a third pixel circuit PC3.

An area (e.g., a portion) of the second area AR2, in which the second pixels PX2 are not arranged, may be defined as a transmission area TA. The transmission area TA may be an area through which light and/or a signal emitted from or incident into the component 50 arranged to correspond to the second area AR2 may be transmitted. According to one or more embodiments, the second pixel PX2 and the transmission area TA may be alternately arranged with respect to the second area AR2.

Each of the first through third pixel circuits PC1 through PC3 may include a transistor TFT. The first pixel circuit PC1 may be arranged in the first area AR1, the second pixel circuit PC2 and the third pixel circuit PC3 may be arranged in the third area AR3. The first display element DE1 may be arranged in the first area AR1, the second display element DE2 may be arranged in the second area AR2, and the third display element DE3 may be arranged in the third area AR3. The second display element DE2 and the second pixel circuit PC2 may be arranged in different areas from each other so as not to overlap each other.

The second display element DE2 may be connected (e.g., electrically connected) with the second pixel circuit PC2 by a connection line TWL. The connection line TWL may include a transparent conductive material. For example, the connection line TWL may include transparent conductive oxide (TCO). The connection line TWL may include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). The connection line TWL may include a transparent conductive material having a high transmittance, and thus, even when the connection line TWL is arranged in the transmission area TA, the transmittance of the transmission area TA may be secured.

Each of the insulating layers IL and IL' arranged in the display layer DISL between the substrate 100 and the display layer DISL may have at least one opening. Light emitted from or progressing toward the component 50 may pass through the opening of each of the insulating layers IL and IL'. The opening of each of the insulating layers IL and IL' may be located in the transmission area TA and may provide a passage of light progressing toward or emitted from the component 50.

The display element layer may be covered by the encapsulation member ENCM. The encapsulation member ENCM may include the thin-film encapsulation layer TFEL or the encapsulation substrate.

According to one or more embodiments, the encapsulation member ENCM may include the thin-film encapsulation layer TFEL. The thin-film encapsulation layer TFEL may include at least one inorganic encapsulation layer and at least one organic encapsulation layer. For example, the thin-film encapsulation layer TFEL may include a first inorganic encapsulation layer 310, a second inorganic encapsulation layer 330, and an organic encapsulation layer 320 therebetween.

The first and second inorganic encapsulation layers 310 and 330 may include at least one inorganic insulating material, such as, $SiO_2$, $SiN_X$, $SiO_XN_Y$, $Al_2O_3$, $TiO_2$, $Ta_2O_5$, $HfO_2$, and $ZnO_2$, and may be formed by using chemical vapor deposition (CVD). The organic encapsulation layer 320 may include a polymer-based material. The polymer-based material may include silicon-based resins, acryl-based resins, epoxy-based resins, polyimide, and polyethylene.

The first inorganic encapsulation layer 310, the organic encapsulation layer 320, and the second inorganic encapsulation layer 330 may be integrally formed with each other to cover the first through third areas AR1 through AR3.

According to another embodiment, the encapsulation member ENCM may include the encapsulation substrate. The encapsulation substrate may be arranged to face the substrate 100 with the display element layer between the encapsulation substrate and the substrate 100. There may be a gap between the encapsulation substrate and the display element layer. The encapsulation substrate may include glass. A sealant including frit, etc. may be arranged between the substrate 100 and the encapsulation substrate, and the sealant may be arranged in the peripheral area PA described with reference to FIG. 1. The sealant arranged in the peripheral area PA may surround the display area DA and prevent or substantially prevent the penetration of water through a side surface of the display area DA.

The touch screen layer TSL may obtain coordinate information based on an external input, for example, a touch event. The touch screen layer TSL may include a touch electrode and touch lines connected to the touch electrode. The touch screen layer TSL may detect an external input based on a magnetic capacitance method or a mutual capacitance method.

The touch screen layer TSL may be formed on the thin-film encapsulation layer TFEL. In one or more embodiments, the touch screen layer TSL may be separately formed on a touch substrate and then may be coupled onto the thin-film encapsulation layer TFEL through an adhesive layer, such as an optical clear adhesive (OCA). According to one or more embodiments, the touch screen layer TSL may be formed directly above the thin-film encapsulation layer TFEL, and in this case, the adhesive layer may not be arranged between the touch screen layer TSL and the thin-film encapsulation layer TFEL.

The optical functional layer OFL may include a reflection prevention layer. The reflection prevention layer may reduce reflectivity of light (external light) incident toward the display apparatus 1 from the outside. In one or more embodiments, the optical functional layer OFL may include a polarization film. In one or more embodiments, the optical functional layer OFL may include a filter plate including a black matrix and color filters.

The protection member PB may be coupled under the substrate 100 to support and protect the substrate 100. The protection member PB may include an opening PB_OP to correspond to the second area AR2. Because the protection member PB includes the opening PB_OP, the light transmittance of the second area AR2 may improve. The protection member PB may include polyethylene terephthalate (PET) or polyimide (PI).

An area of the second area AR2 may be a greater than an area in which the component 50 is arranged. Accordingly, an area of the opening PB_OP provided in the protection member PB may not be the same (e.g., same in size) as the area of the second area AR2.

Also, the component 50 may be arranged in the second area AR2 in a multiple number. The plurality of components 50 may have different functions from one another. For example, the plurality of components 50 may include at least two of a camera (an imaging device), a solar battery, a flash device, a proximity sensor, an illuminance sensor, and an iris sensor.

As illustrated in FIG. 2, a bottom metal layer BML may be arranged below the second pixel circuit PC2 and the third pixel circuit PC3 of the third area AR3. The bottom metal layer BML may be arranged to overlap the pixel circuits to protect the pixel circuits. According to one or more embodiments, the bottom metal layer BML may be arranged to overlap the second and third pixel circuits PC2 and PC3 between the substrate 100 corresponding to the third area AR3, and the second and third pixel circuits PC2 and PC3. The bottom metal layer BML may prevent or substantially prevent external light from reaching the second and third pixel circuits PC2 and PC3. According to another embodiment, the bottom metal layer BML may be formed to correspond to the entire display area DA and may include a bottom hole corresponding to the second area AR2. According to another embodiment, the bottom metal layer BML may not be provided.

Figure 3:
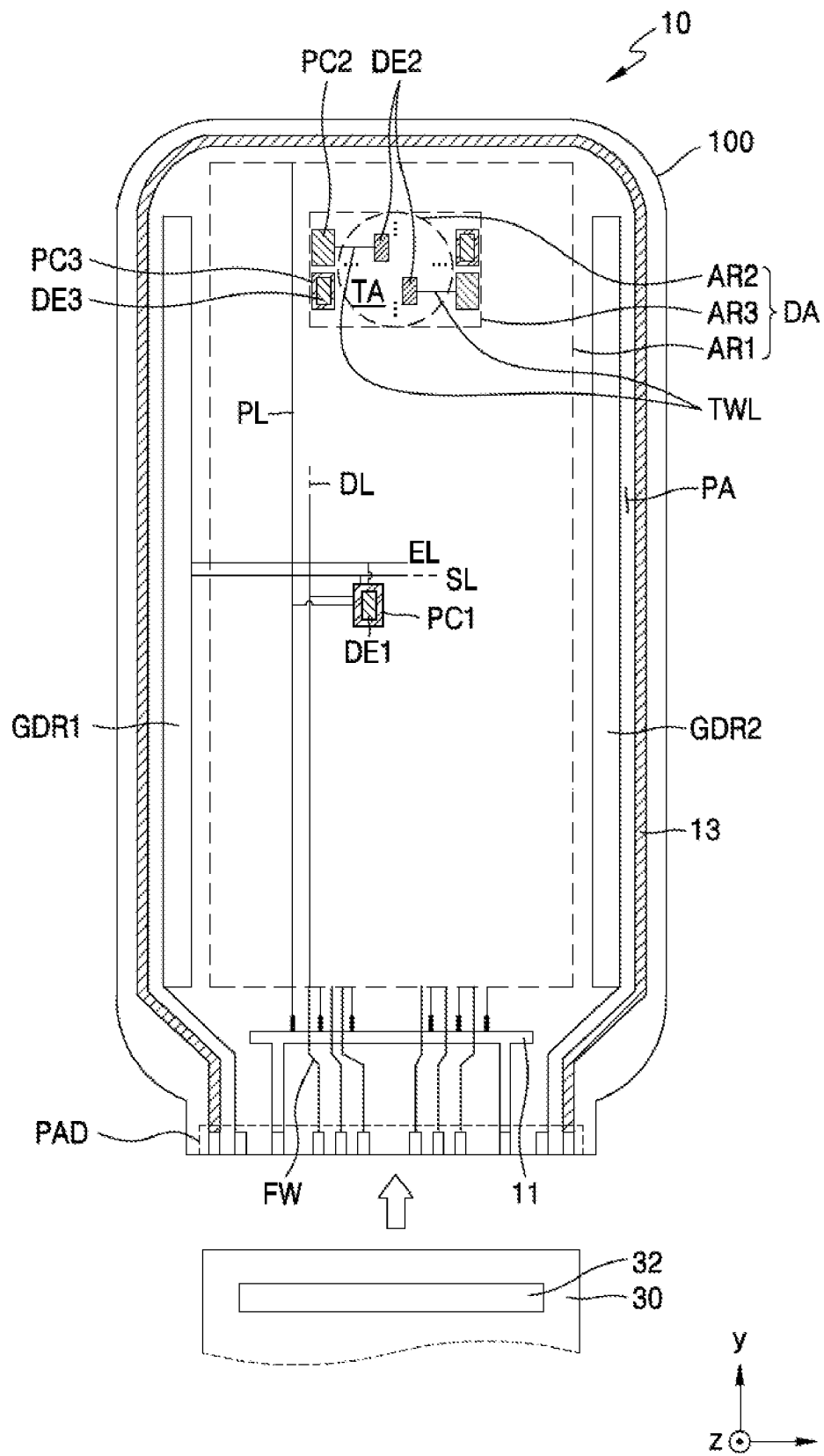
FIG. 3 is a schematic plan view of a display panel, which may be included in the display apparatus of FIG. 1, according to one or more embodiments.

FIG. 3 is a schematic plan view of the display panel 10, which may be included in the display apparatus 1 of FIG. 1, according to one or more embodiments.

Referring to FIG. 3, various suitable components included in the display panel 10 may be arranged on the substrate 100.

A plurality of first display elements DE1 may be arranged in the first area AR1. Each of the first display elements DE1 may be an organic light-emitting diode OLED. A first pixel circuit PC1 configured to drive the first display element DE1 may be arranged in the first area AR1, and the first pixel circuit PC1 may be arranged to overlap the first display element DE1. Each first display element DE1 may emit, for example, red, green, or blue light. The first area AR1 may be covered by an encapsulation member and may be protected from external air, moisture, etc.

The second area AR2 may be located at a side of the first area AR1 as described above, or may be arranged at an inner portion of the display area DA to be surrounded by the first area AR1. The third area AR3 may be arranged between the first area AR1 and the second area AR2. The second area AR2 and the third area AR3 may be covered by an encapsulation member and may be protected from external air, moisture, etc.

A plurality of second display elements DE2 may be arranged in the second area AR2. Each of the second display elements DE2 may include an organic light-emitting diode OLED. A second pixel circuit PC2 configured to drive the second display element DE2 may be arranged in the third area AR3, and the second pixel circuit PC2 may be arranged not to overlap the second display element DE2. Because the second display element DE2 may be arranged in the second area AR2, and the second pixel circuit PC2 may be arranged in the third area AR3, the second display element DE2 may be connected with the second pixel circuit PC2 by a connection line TWL. The connection line TWL may include a transparent conductive material. Each second display element DE2 may emit, for example, red, green, or blue light.

A plurality of third display elements DE3 may be arranged in the third area AR3. Each of the third display elements DE3 may include an organic light-emitting diode OLED. A third pixel circuit PC3 configured to drive the third display element DE3 may be arranged in the third area AR3, and the third pixel circuit PC3 may be arranged to overlap the third display element DE3. Each third display element DE3 may emit, for example, red, green, or blue light.

The second area AR2 may have the transmission area TA. The transmission area TA may be defined as an area in which the second display element DE2 is not arranged. Because the second area AR2 has the transmission area TA, a resolution of the second area AR2 may be lower than a resolution of the first area AR1. For example, the resolution of the second area AR2 may be about ½, about ⅜, about ⅓, about ¼, about ⅖, about ⅛, about ⅑, about 1/16, etc. of the resolution of the first area AR1. For example, the resolution of the first area AR1 may be about 400 ppi or higher, and the resolution of the second area AR2 may be about 200 ppi or about 100 ppi.

The first through third pixel circuits PC1 through PC3 respectively configured to drive the first through third display elements DE1 through DE3 in the display area DA may be connected (e.g., electrically connected) to outer circuits arranged in the peripheral area PA. A first gate driving circuit GDR1, a second gate driving circuit GDR2, a pad portion PAD, a first driving voltage supply line 11, and a second driving voltage supply line 13 may be arranged in the peripheral area PA.

The first gate driving circuit GDR1 may include a scan driving circuit and an emission control driving circuit. The scan driving circuit may transmit, through a scan line SL, a scan signal to the first pixel circuit PC1 configured to drive the first display element DE1. The emission control driving circuit may transmit, through an emission control line EL, an emission control signal to the first pixel circuit PC1 configured to drive the first display element DE1. Although descriptions are given based on the first gate driving circuit GDR1, the same aspects may be applied to the second gate driving circuit GDR2.

The second gate driving circuit GDR2 may be symmetrically arranged with the first gate driving circuit GDR1 with respect to the first area AR1 Some of the first pixel circuits PC1 arranged in the first area AR1 may be connected (e.g., electrically connected) to the first gate driving circuit GDR1, and the others may be connected (e.g., electrically connected) to the second gate driving circuit GDR2.

The pad portion PAD may be arranged at a side of the substrate 100. The pad portion PAD may not be covered by an insulating layer and may be exposed so as to be connected to a display circuit board 30. A display driver 32 may be arranged on the display circuit board 30.

The display driver 32 may generate a control signal to transmit to the first gate driving circuit GDR1 and the second gate driving circuit GDR2. The display driver 32 may generate a data signal, and the generated data signal may be transmitted to the pixel circuits through a fan-out wire FW and a data line DL connected to the fan-out wire FW.

The display driver 32 may supply a first driving voltage ELVDD to the first driving voltage supply line 11 and supply a second driving voltage ELVSS to the second driving voltage supply line 13. The first driving voltage ELVDD may be applied to the pixels PX through a driving voltage line PL connected to the first driving voltage supply line 11, and the second driving voltage ELVSS may be applied to an opposite electrode (or a cathode) of a display element via the second driving voltage supply line 13.

The first driving voltage supply line 11 may extend in a ±x direction under the first area AR1. The second driving voltage supply line 13 may have a loop shape having an open side and may be partially around or partially surround the first area AR1.

Figure 4:
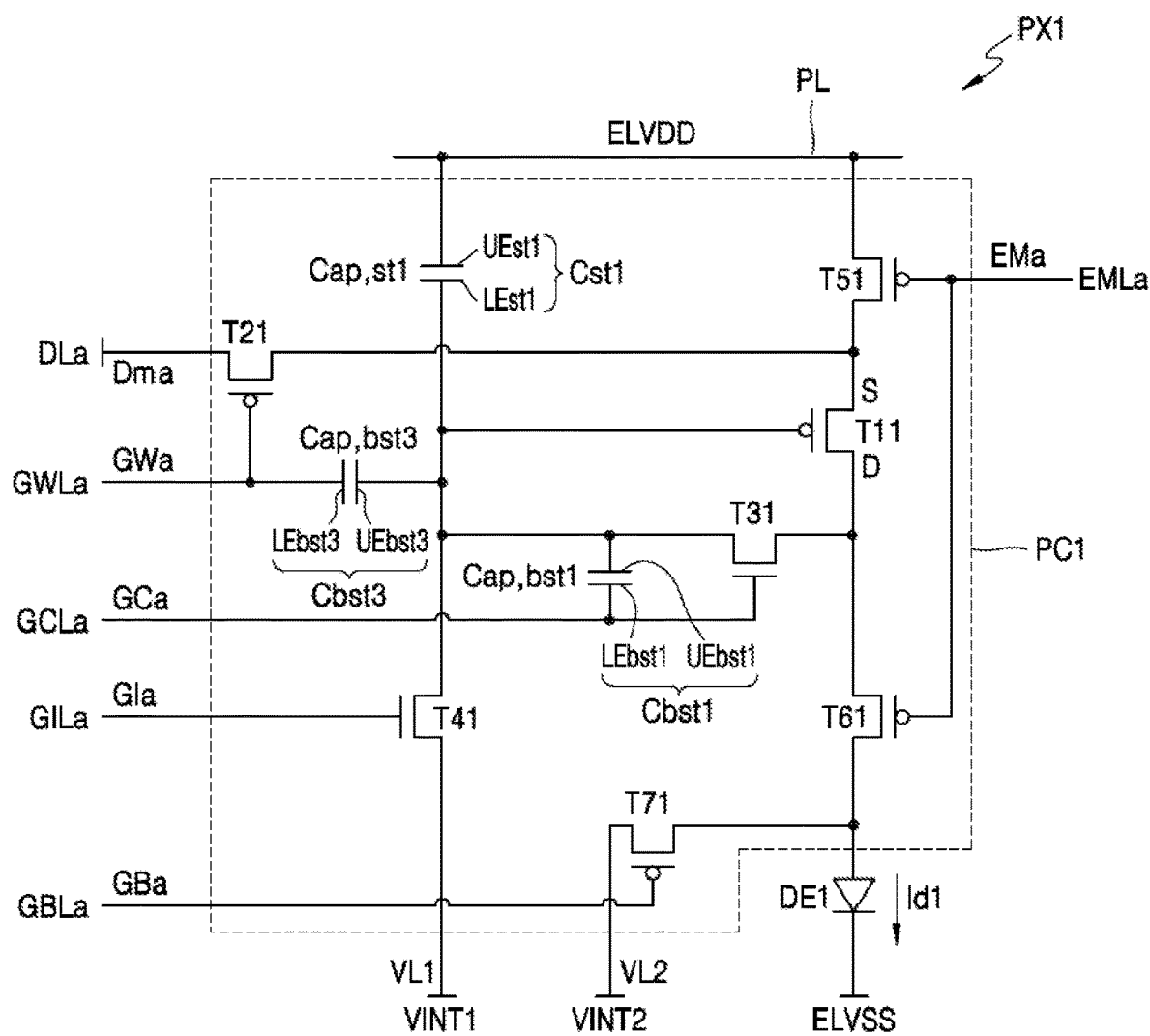
FIG. 4 is an equivalent circuit diagram of a first pixel according to one or more embodiments.

FIG. 4 is an equivalent circuit diagram of a first pixel PX1 according to one or more embodiments.

Referring to FIG. 4, the first pixel PX1 may be connected to: first through fourth scan lines GWLa, GCLa, GILa, and GBLa respectively configured to transmit first through fourth scan signals GWa, GCa, Gla, and GBa; a first data line DLa configured to transmit a first data voltage Dma; and an emission control line EMLa configured to transmit an emission control signal EMa. The first pixel PX1 may be connected to a power line PL configured to transmit a first driving voltage ELVDD, a first voltage line VL1 configured to transmit a first initialization voltage VINT1, and a second voltage line VL2 configured to transmit a second initialization voltage VINT2. The first pixel PX1 may be connected to a common electrode to which a second driving voltage ELVSS is applied.

Hereinafter, devices included in the first pixel PX1 are described.

The first pixel PX1 may include a first display element DE1 and a first pixel circuit PC1. The first pixel circuit PC1 may include first through seventh transistors T11 through T71, a first storage capacitor Cst1, a first boosting capacitor Cbst1, and a third boosting capacitor Cbst3. The first display element DE1 may include an organic light-emitting diode having an anode and a cathode. The cathode thereof may be a common electrode to which the second driving voltage ELVSS is applied.

One or more of the first through seventh transistors T11 through T71 may be provided as n-channel metal-oxide semiconductor field-effect transistors (MOSFETs) (NMOS), and the others may be provided as p-channel MOSFETs (PMOS). For example, the third and fourth transistors T31 and T41 from among the first through seventh transistors T11 through T71 may be provided as NMOS transistors, and the others may be provided as PMOS transistors. In other words, conductive types of the third and fourth transistors T31 and T41 may be the opposite to conductive types of the first transistor T11, the second transistor T21, the fifth transistor T51, the sixth transistor T61, and the seventh transistor T71.

According to another embodiment, the third transistor T31, the fourth transistor T41, and the seventh transistor T71 from among the first through seventh transistors T11 through T71 may be provided as NMOS transistors, and the others may be provided as PMOS transistors. In one or more embodiments, only one of the first through seventh transistors T11 through T71 may be provided as an NMOS transistor, and the others may be provided as PMOS transistors. In one or more embodiments, all of the first through seventh transistors T11 through T71 may be provided as NMOS transistors or PMOS transistors.

The first transistor T11 may be a driving transistor, a magnitude of a drain current of which is determined according to a gate-source voltage, and the second through seventh transistors T21 through T71 may be switching transistors, which are turned on/off according to the gate-source voltage, in reality, a gate voltage.

The first transistor T11 may be referred to as a first driving transistor, the second transistor T21 may be referred to as a first scan transistor, the third transistor T31 may be referred to as a first compensation transistor, the fourth transistor T41 may be referred to as a first gate initialization transistor, the fifth transistor T51 may be referred to as a first operation control transistor, the sixth transistor T61 may be referred to as a first emission control transistor, and the seventh transistor T71 may be referred to as a first anode initialization transistor.

The first storage capacitor Cst1 may be connected between the power line PL and a gate of the first driving transistor T11. The first storage capacitor Cst1 may have a first upper storage electrode UEst1 connected to the power line PL and a first lower storage electrode LEst1 connected to the gate of the first driving transistor T11. The first storage capacitor Cst1 may have a first storage capacitance Cap,st1.

The first driving transistor T11 may be configured to control a magnitude of a first current Id1 flowing from the power line PL to the first display element DE1 according to a gate-source voltage. The first driving transistor T11 may have the gate connected to the first lower storage electrode LEst1 of the first storage capacitor Cst1, a source connected to the power line PL through the first operation control transistor T51, and a drain connected to the first display element DE1 through the first emission control transistor T61.

The first driving transistor T11 may be configured to output the first current Id1 to the first display element DE1 according to the gate-source voltage. The magnitude of the first current Id1 may be determined based on a difference between the gate-source voltage of the first driving transistor T11 and a threshold voltage. The first display element DE1 may receive the first current Id1 from the first driving transistor T11 and may emit light by a brightness based on the magnitude of the first current Id1.

The first scan transistor T21 may be configured to transmit the first data voltage Dma to the source of the first driving transistor T11 in response to the first scan signal GWa. The first scan transistor T21 may have a gate connected to the first scan line GWLa, a source connected to the first data line DLa, and a drain connected to the source of the first driving transistor T11.

The first compensation transistor T31 may be configured to connect the drain and the gate of the first driving transistor T11 with each other in response to the second scan signal GCa. The first compensation transistor T31 may have a gate connected to the second scan line GCLa, a source connected to the gate of the first driving transistor T11, and a drain connected to the drain of the first driving transistor T11.

The first boosting capacitor Cbst1 may be connected between the gate of the first driving transistor T11 and the gate of the first compensation transistor T31. The first boosting capacitor Cbst1 may have a first upper boosting electrode UEbst1 connected to the gate of the first driving transistor T11 and a first lower boosting electrode LEbst1 connected to the gate of the first compensation transistor T31. The first boosting capacitor Cbst1 may have a first boosting capacitance Cap,bst1.

The third boosting capacitor Cbst3 may be connected between the gate of the first driving transistor T11 and a gate of the first scan transistor T21. The third boosting capacitor Cbst3 may have a third upper boosting electrode UEbst3 connected to the gate of the first driving transistor T11 and a third lower boosting electrode LEbst3 connected to the gate of the first scan transistor T21. The third boosting capacitor Cbst3 may have a third boosting capacitance Cap,bst3.

The first gate initialization transistor T41 may be configured to apply the first initialization voltage VINT1 to the gate of the first driving transistor T11 in response to the third scan signal GIa. The first gate initialization transistor T41 may have a gate connected to the third scan line GILa, a source connected to the first voltage line VL1, and a drain connected to the gate of the first driving transistor T11.

The first anode initialization transistor T71 may be configured to apply the second initialization voltage VINT2 to the anode of the first display element DE1 in response to the fourth scan signal GBa. The first anode initialization transistor T71 may have a gate connected to the fourth scan line GBLa, a source connected to the anode of the first display element DE1, and a drain connected to the second voltage line VL2.

FIG. 4 illustrates that the first gate initialization transistor T41 and the first anode initialization transistor T71 are respectively connected to the first voltage line VL1 and the second voltage line VL2. However, according to another embodiment, the first gate initialization transistor T41 and the first anode initialization transistor T71 may be connected to the same voltage line.

The first operation control transistor T51 may be configured to connect the power line PL with the source of the first driving transistor T11 in response to the emission control signal EMa. The first operation control transistor T51 may have a gate connected to the emission control line EMLa, a source connected to the power line PL, and a drain connected to the source of the first driving transistor T11.

The first emission control transistor T61 may connect the drain of the first driving transistor T11 with the anode of the first display element DE1 in response to the emission control signal EMa. The first emission control transistor T61 may have a gate connected to the emission control line EMLa, a source connected to the drain of the first driving transistor T11, and a drain connected to the anode of the first display element DE1.

The first scan signal GWa may be substantially synchronized with the second scan signal GCa. The third scan signal Gla may be substantially synchronized with the first scan signal GWa of a previous row. The fourth scan signal GBa may be substantially synchronized with the first scan signal GWa. As another example, the fourth scan signal GBa may be substantially synchronized with the first scan signal GWa of a next row.

Hereinafter, specific operations of the first pixel PX1, which is one of the pixels of an organic light-emitting display apparatus according to one or more embodiments, are described in more detail.

First, when the emission control signal EMa of a high level is received, the first operation control transistor T51 and the first emission control transistor T61 may be turned off, the first driving transistor T11 may stop outputting the first current Id1, and the first display element DE1 may stop emitting light.

Thereafter, during a gate initialization period during which the third scan signal Gla of a high level is received, the first gate initialization transistor T41 may be turned on, and the first initialization voltage VINT1 may be applied to the gate of the first driving transistor T11, that is, the first lower storage electrode LEst1 of the first storage capacitor Cst1. A difference ELVDD-VINT1 between the first driving voltage ELVDD and the first initialization voltage VINT1 may be stored in the first storage capacitor Cst1.

Thereafter, during a data write period during which the first scan signal GWa of a low level and the second scan signal GCa of a high level are received, the first scan transistor T21 and the first compensation transistor T31 may be turned on, and the first data voltage Dma may be received by the source of the first driving transistor T11. The first driving transistor T11 may be diode-connected by the first compensation transistor T31 and may be biased in a forward direction. A gate voltage of the first driving transistor T11 may rise at the first initialization voltage VINT1. When the gate voltage of the first driving transistor T11 becomes equal to a data compensation voltage Dma−|Vth| obtained by subtracting a threshold voltage Vth of the first driving transistor T11 from the first data voltage Dma, the first driving transistor T11 may be turned off, and the gate voltage of the first driving transistor T11 may stop rising. Therefore, a difference ELVDD−Dma+|Vth| between the first driving voltage ELVDD and the data compensation voltage Dma−|Vth| may be stored in the first storage capacitor Cst1.

Also, during an anode initialization period during which the fourth scan signal GBa of a low level is received, the first anode initialization transistor T71 may be turned on, and the second initialization voltage VINT2 may be applied to the anode of the first display element DE1. By completely making the first display element not emit light by applying the second initialization voltage VINT2 to the anode of the first display element DE1, the phenomenon in which the first display element DE1 minutely emits light in correspondence to a black gray scale in a next frame may be eliminated.

The first scan signal GWa and the fourth scan signal GBa may be substantially synchronized with each other, and in this case, the data write period and the anode initialization period may be the same period.

Thereafter, when the emission control signal EMa of a low level is received, the first operation control transistor T51 and the first emission control transistor T61 may be turned on, the first driving transistor T11 may output the first current Id1 corresponding to the voltage ELVDD-Dma obtained by subtracting the threshold voltage |Vth| of the first driving transistor T11 from the voltage stored in the first storage capacitor Cst1, that is, the source-gate voltage ELVDD−Dma+|Vth| of the first driving transistor T11, and the first display element DE1 may emit light by a brightness corresponding to the magnitude of the first current Id1.

According to the present embodiment, at least one of the first through seventh transistors T11 through T71 may include a semiconductor layer including oxide, and the others may include semiconductor layers including silicon.

In more detail, the first driving thin-film transistor T11, which may directly affect the brightness of a display apparatus, may include a semiconductor layer including polycrystalline silicon having a high reliability, and thus, the display apparatus having a high resolution may be realized.

An oxide semiconductor may have a high carrier mobility and a low leakage current, and thus, even when a driving time is increased, a voltage drop may be insignificant. For example, even during low frequency driving, a color change of an image due to a voltage drop may be insignificant. Accordingly, low frequency driving may be possible.

As described above, the oxide semiconductor may have the benefit of a less leakage current, and thus, at least one of the first compensation transistor T31, the first gate initialization transistor T41, and the first anode initialization transistor T71, connected to the gate of the first driving transistor T11, may be implemented as the oxide semiconductor, in order to prevent or substantially prevent the flow of the leakage current to the gate of the first driving transistor T11 and at the same time, reduce power consumption.

Figure 5:
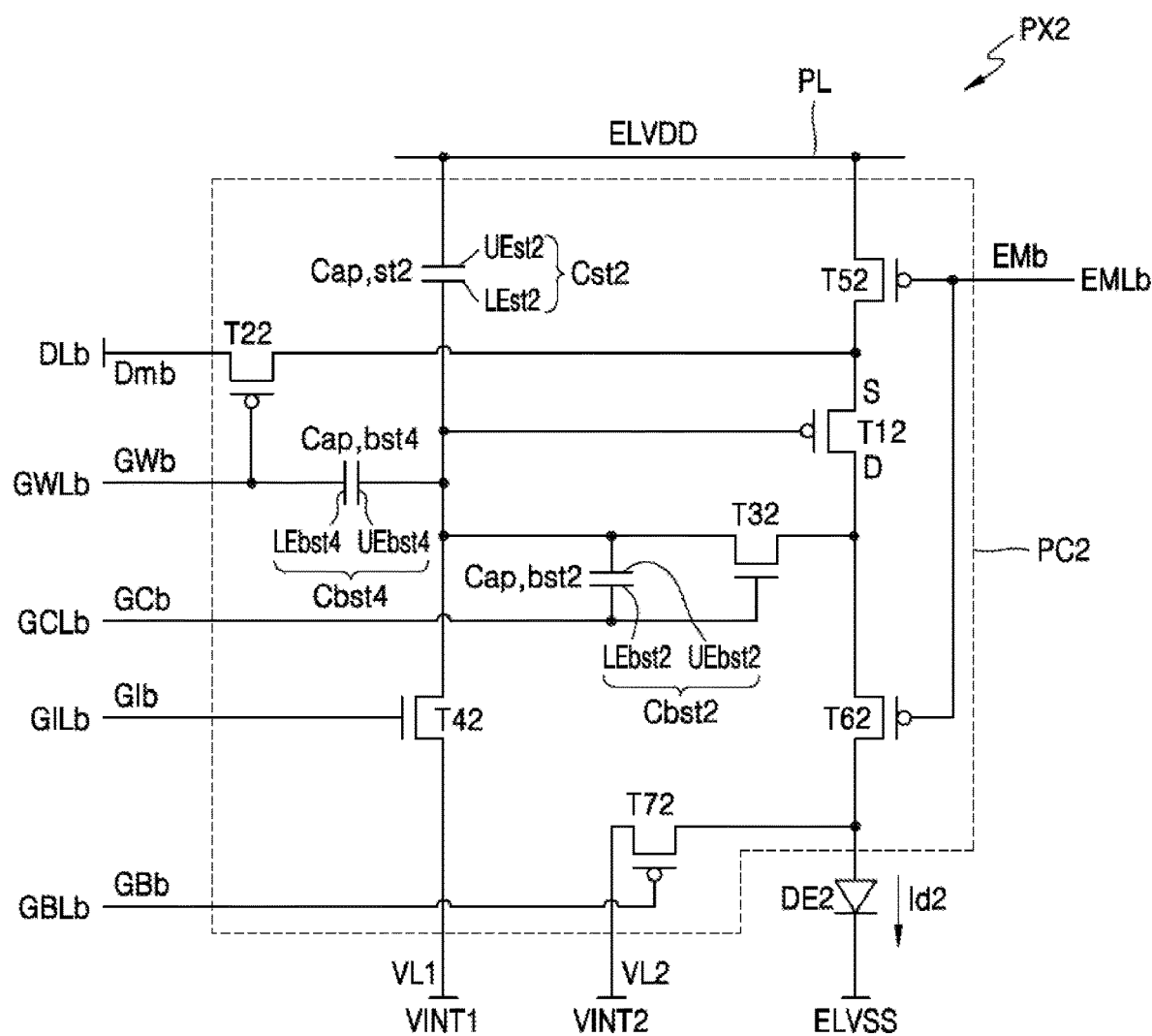
FIG. 5 is an equivalent circuit diagram of a second pixel according to one or more embodiments.

FIG. 5 is an equivalent circuit diagram of a second pixel PX2 according to one or more embodiments.

Referring to FIG. 5, the second pixel PX2 may be connected to: first through fourth scan lines GWLb, GCLb, GILb, and GBLb respectively configured to transmit first through fourth scan signals GWb, GCb, Glb, and GBb; a second data line DLb configured to transmit a second data voltage Dmb; and an emission control line EMLb configured to transmit an emission control signal EMb. The second pixel PX2 may be connected to the power line PL configured to transmit the first driving voltage ELVDD, the first voltage line VL1 configured to transmit the first initialization voltage VINT1, and the second voltage line VL2 configured to transmit the second initialization voltage VINT2. The second pixel PX2 may be connected to the common electrode to which the second driving voltage ELVSS is applied.

The second pixel PX2 may include a second display element DE2 and a second pixel circuit PC2. The second pixel circuit PC2 may include first through seventh transistors T12 through T72, a second storage capacitor Cst2, a second boosting capacitor Cbst2, and a fourth boosting capacitor Cbst4. The second display element DE2 may include an organic light-emitting diode having an anode and a cathode. The cathode thereof may be a common electrode to which the second driving voltage ELVSS is applied.

The first transistor T12 may be a driving transistor, a magnitude of a drain current of which is determined according to a gate-source voltage, and the second through seventh transistors T22 through T72 may be switching transistors, which are turned on/off according to the gate-source voltage, in reality, a gate voltage.

The first transistor T12 may be referred to as a second driving transistor, the second transistor T22 may be referred to as a second scan transistor, the third transistor T32 may be referred to as a second compensation transistor, the fourth transistor T42 may be referred to as a second gate initialization transistor, the fifth transistor T52 may be referred to as a second operation control transistor, the sixth transistor T62 may be referred to as a second emission control transistor, and the seventh transistor T72 may be referred to as a second anode initialization transistor.

The first pixel PX1 illustrated in FIG. 4 and the second pixel PX2 illustrated in FIG. 5 may be different from each other in terms of a shape of the capacitor, a capacitance, a shape of the transistor, etc., as described below. However, the connection relationship among the devices, operations, etc. of the first pixel PX1 and the second pixel PX2 may be substantially the same as each other.

The second driving transistor T12 may correspond to the first driving transistor T11 of FIG. 4, the second scan transistor T22 may correspond to the first scan transistor T21 of FIG. 4, the second compensation transistor T32 may correspond to the first compensation transistor T31 of FIG. 4, the second gate initialization transistor T42 may correspond to the first gate initialization transistor T41 of FIG. 4, the second operation control transistor T52 may correspond to the first operation control transistor T51 of FIG. 4, the second emission control transistor T62 may correspond to the first emission control transistor T61 of FIG. 4, and the second anode initialization transistor T72 may correspond to the first anode initialization transistor T71 of FIG. 4.

For example, the second driving transistor T12 may be configured to output a second current Id2 to the second display element DE2 according to the gate-source voltage. The magnitude of the second current Id2 may be determined based on a difference between the gate-source voltage of the second driving transistor T12 and a threshold voltage. The second display element DE2 may receive the second current Id2 from the second driving transistor T12 and may emit light by a brightness based on the magnitude of the second current Id2.

The second storage capacitor Cst2 may correspond to the first storage capacitor Cst1 of FIG. 4, the second boosting capacitor Cbst2 may correspond to the first boosting capacitor Cbst1 of FIG. 4, and the fourth boosting capacitor Cbst4 may correspond to the third boosting capacitor Cbst3 of FIG. 4.

For example, the second storage capacitor Cst2 may be connected between the power line PL and a gate of the second driving transistor T12. The second storage capacitor Cst2 may have a second upper storage electrode UEst2 connected to the power line PL and a second lower storage electrode LEst2 connected to the gate of the second driving transistor T12. The second storage capacitor Cst2 may have a second storage capacitance Cap,st2.

The second boosting capacitor Cbst2 may be connected between the gate of the second driving transistor T12 and a gate of the second compensation transistor T32. The second boosting capacitor Cbst2 may have a second upper boosting electrode UEbst2 connected to the gate of the second driving transistor T12 and a second lower boosting electrode LEbst2 connected to the gate of the second compensation transistor T32. The second boosting capacitor Cbst2 may have a second boosting capacitance Cap,bst2.

The fourth boosting capacitor Cbst4 may be connected between the gate of the second driving transistor T12 and a gate of the second scan transistor T22. The fourth boosting capacitor Cbst4 may have a fourth upper boosting electrode UEbst4 connected to the gate of the second driving transistor T12 and a fourth lower boosting electrode LEbst4 connected to the gate of the second scan transistor T22. The fourth boosting capacitor Cbst4 may have a fourth boosting capacitance Cap,bst4.

According to one or more embodiments, the second storage capacitance Cap,st2 of the second storage capacitor Cst2 may be about 1.5 times to about 5 times the first storage capacitance Cap,st1 of the first storage capacitor Cst1.

When the second storage capacitance Cap,st2 is less than about 1.5 times the first storage capacitance Cap,st1, the brightness distribution of the second display elements DE2 respectively configured to be driven by the second pixel circuits PC2 including the second storage capacitors Cst2, may increase. For example, the brightness distribution of the display elements arranged in the component area overlapping an optical device may increase. Due to the brightness distribution, the brightness non-uniformity of the display elements arranged in the component area may occur or increase. Also, when the second storage capacitance Cap,st2 is greater than about 5 times the first storage capacitance Cap,st1, it may be difficult for the display elements arranged in the component area overlapping the optical device to represent the brightness gradation.

However, when the second storage capacitance Cap,st2 is about 1.5 times to about 5 times the first storage capacitance Cap,st1 according to one or more embodiments, the brightness distribution of the second display elements DE2 arranged in the second area AR2 overlapping the component 50 (e.g., the optical device) described above with respect to FIG. 2 may decrease. Because the brightness distribution decreases, the brightness non-uniformity of the second display elements DE2 may be reduced (e.g., the brightness uniformity of the second display elements DE2 may improve).

According to one or more embodiments, the second boosting capacitance Cap,bst2 of the second boosting capacitor Cbst2 may be about 1 time to about 5 times the first boosting capacitance Cap,bst1 of the first boosting capacitor Cbst1.

According to one or more embodiments, the ratio of the second boosting capacitance Cap,bst2 to the second storage capacitance Cap,st2 may be greater than the ratio of the first boosting capacitance Cap,bst1 to the first storage capacitance Cap,st1.

According to one or more embodiments, the ratio of the second boosting capacitance Cap,bst2 to the second storage capacitance Cap,st2 may be about 4% to about 9%.

When the ratio of the second boosting capacitance Cap,bst2 to the second storage capacitance Cap,st2 is less than about 4%, representation of the brightness gradation by the second display elements DE2 respectively configured to be driven by the second pixel circuits PC2 including the second storage capacitors Cst2 may become difficult. For example, representation of the brightness gradation by the display elements arranged in the component area overlapping the optical device may become difficult. Also, when the ratio of the second boosting capacitance Cap,bst2 to the second storage capacitance Cap,st2 is greater than about 9%, the brightness distribution of the second display elements DE2 respectively configured to be driven by the second pixel circuits PC2 including the second storage capacitors Cst2 may increase. For example, the brightness distribution of the display elements arranged in the component area overlapping the optical device may increase. Due to the brightness distribution, the brightness non-uniformity of the display elements arranged in the component area may occur or increase.

However, when the ratio of the second boosting capacitance Cap,bst2 to the second storage capacitance Cap,st2 is about 4% to about 5% according to one or more embodiments, the brightness distribution of the second display elements DE2 arranged in the second area AR2 overlapping the component 50 (e.g., the optical device) described above with respect to FIG. 2 may decrease. When the brightness distribution decreases, the brightness non-uniformity of the second display elements DE2 may be reduced (e.g., the brightness uniformity of the second display elements DE2 may improve).

According to one or more embodiments, the ratio of the fourth boosting capacitance Cap,bst4 to the second storage capacitance Cap,st2 may be less than the ratio of the third boosting capacitance Cap,bst3 to the first storage capacitance Cap,st1.

According to one or more embodiments, the ratio of the fourth boosting capacitance Cap,bst4 to the second storage capacitance Cap,st2 may be about 1% to about 3%.

When the ratio of the fourth boosting capacitance Cap,bst4 to the second storage capacitance Cap,st2 is less than about 1%, representation of the brightness gradation by the second display elements DE2 respectively configured to be driven by the second pixel circuits PC2 including the second storage capacitors Cst2 may become difficult. For example, representation of the brightness gradation by the display elements arranged in the component area overlapping the optical device may become difficult. Also, when the ratio of the fourth boosting capacitance Cap,bst4 to the second storage capacitance Cap,st2 is greater than about 3%, the brightness distribution of the second display elements DE2 respectively configured to be driven by the second pixel circuits PC2 including the second storage capacitors Cst2 may increase. For example, the brightness distribution of the display elements arranged in the component area overlapping the optical device may increase. Due to the brightness distribution, the brightness non-uniformity of the display elements arranged in the component area may occur or increase.

However, when the ratio of the fourth boosting capacitance Cap,bst4 to the second storage capacitance Cap,st2 is about 1% to about 3% according to one or more embodiments, the brightness distribution of the second display elements DE2 arranged in the second area AR2 overlapping the component 50 (e.g., the optical device) described above with respect to FIG. 2 may decrease. When the brightness distribution decreases, the brightness non-uniformity of the second display elements DE2 may be reduced (e.g., the brightness uniformity of the second display elements DE2 may improve).

Figure 6:
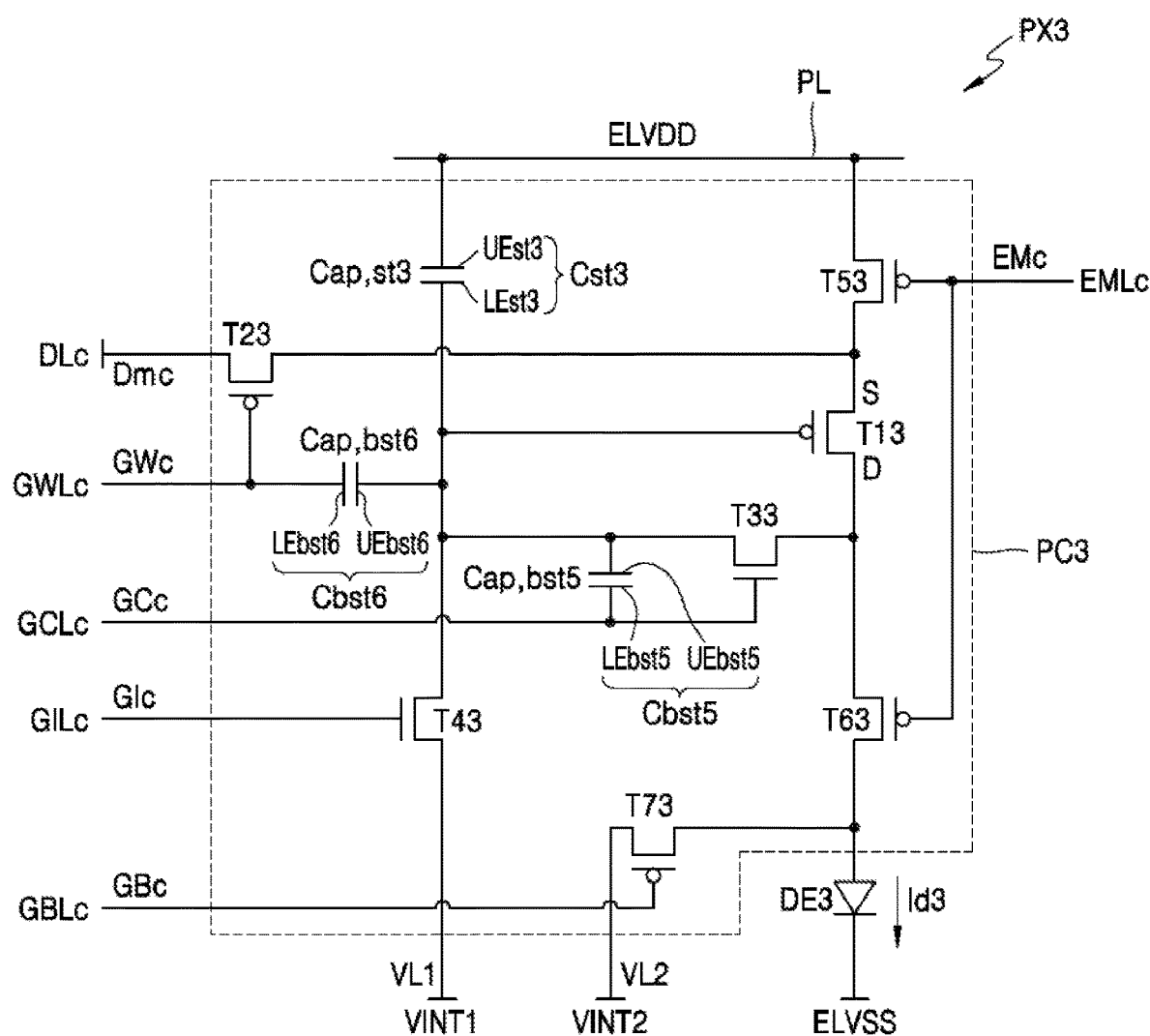
FIG. 6 is an equivalent circuit diagram of a third pixel according to one or more embodiments.

FIG. 6 is an equivalent circuit diagram of a third pixel PX3 according to one or more embodiments.

Referring to FIG. 6, the third pixel PX3 may be connected to: first through fourth scan lines GWLc, GCLc, GILc, and GBLc respectively configured to transmit first through fourth scan signals GWc, GCc, GIc, and GBc; a third data line DLc configured to transmit a third data voltage Dmc; and an emission control line EMLc configured to transmit an emission control signal EMc. The third pixel PX3 may be connected to the power line PL configured to transmit the first driving voltage ELVDD, the first voltage line VL1 configured to transmit the first initialization voltage VINT1, and the second voltage line VL2 configured to transmit the second initialization voltage VINT2. The third pixel PX3 may be connected to the common electrode to which the second driving voltage ELVSS is applied.

The third pixel PX3 may include a third display element DE3 and a third pixel circuit PC3. The third pixel circuit PC3 may include first through seventh transistors T13 through T73, a third storage capacitor Cst3, a fifth boosting capacitor Cbst5, and a sixth boosting capacitor Cbst6. The third display element DE3 may include an organic light-emitting diode having an anode and a cathode. The cathode thereof may be a common electrode to which the second driving voltage ELVSS is applied.

The first transistor T13 may be a driving transistor, a magnitude of a drain current of which is determined according to a gate-source voltage, and the second through seventh transistors T23 through T73 may be switching transistors, which are turned on/off according to the gate-source voltage, in reality, a gate voltage.

The first transistor T13 may be referred to as a third driving transistor, the second transistor T23 may be referred to as a third scan transistor, the third transistor T33 may be referred to as a third compensation transistor, the fourth transistor T43 may be referred to as a third gate initialization transistor, the fifth transistor T53 may be referred to as a third operation control transistor, the sixth transistor T63 may be referred to as a third emission control transistor, and the seventh transistor T73 may be referred to as a third anode initialization transistor.

The first pixel PX1 illustrated in FIG. 4 and the third pixel PX3 illustrated in FIG. 6 may be different from each other in terms of a shape of the capacitor, a capacitance, a shape of the transistor, etc., as described below. However, the connection relationship among the devices, operations, etc. of the first pixel PX1 and the second pixel PX3 may be substantially the same as each other.

The third driving transistor T13 may correspond to the first driving transistor T11 of FIG. 4, the third scan transistor T23 may correspond to the first scan transistor T21 of FIG. 4, the third compensation transistor T33 may correspond to the first compensation transistor T31 of FIG. 4, the third gate initialization transistor T43 may correspond to the first gate initialization transistor T41 of FIG. 4, the third operation control transistor T53 may correspond to the first operation control transistor T51 of FIG. 4, the third emission control transistor T63 may correspond to the first emission control transistor T61 of FIG. 4, and the third anode initialization transistor T73 may correspond to the first anode initialization transistor T71 of FIG. 4.

For example, the third driving transistor T13 may be configured to output a third current Id3 to the third display element DE3 according to the gate-source voltage. The magnitude of the third current Id3 may be determined based on a difference between the gate-source voltage of the third driving transistor T13 and a threshold voltage. The third display element DE3 may receive the third current Id3 from the third driving transistor T13 and may emit light by a brightness based on the magnitude of the third current Id3.

The third storage capacitor Cst3 may correspond to the first storage capacitor Cst1 of FIG. 4, the fifth boosting capacitor Cbst5 may correspond to the first boosting capacitor Cbst1 of FIG. 4, and the sixth boosting capacitor Cbst6 may correspond to the third boosting capacitor Cbst3 of FIG. 4.

For example, the third storage capacitor Cst3 may be connected between the power line PL and a gate of the third driving transistor T13. The third storage capacitor Cst3 may have a third upper storage electrode UEst3 connected to the power line PL and a third lower storage electrode LEst3 connected to the gate of the third driving transistor T13. The third storage capacitor Cst3 may have a third storage capacitance Cap,st3.

The fifth boosting capacitor Cbst5 may be connected between the gate of the third driving transistor T13 and a gate of the third compensation transistor T33. The fifth boosting capacitor Cbst5 may have a fifth upper boosting electrode UEbst5 connected to the gate of the third driving transistor T13 and a third lower boosting electrode LEbst3 connected to the gate of the third compensation transistor T33. The fifth boosting capacitor Cbst5 may have a fifth boosting capacitance Cap,bst5.

The sixth boosting capacitor Cbst6 may be connected between the gate of the third driving transistor T13 and a gate of the third scan transistor T23. The sixth boosting capacitor Cbst6 may have a sixth upper boosting electrode UEbst6 connected to the gate of the third driving transistor T13 and a sixth lower boosting electrode LEbst6 connected to the gate of the third scan transistor T23. The sixth boosting capacitor Cbst6 may have a sixth boosting capacitance Cap,bst6.

According to one or more embodiments, the third storage capacitance Cap,st3 of the third storage capacitor Cst3 may be about 1.5 times to about 5 times the first storage capacitance Cap,st1 of the first storage capacitor Cst1.

When the third storage capacitance Cap,st3 is less than about 1.5 times the first storage capacitance Cap,st1, the brightness distribution of the third display elements DE3 respectively configured to be driven by the third pixel circuits PC3 including the third storage capacitors Cst3, may increase. Due to the brightness distribution, the brightness non-uniformity of the display elements may occur. Also, when the third storage capacitance Cap,st3 is greater than about 5 times the first storage capacitance Cap,st1, it may be difficult for the third display elements DE3 to represent the brightness gradation.

However, when the third storage capacitance Cap,st3 is about 1.5 times to about 5 times the first storage capacitance Cap,st1 according to one or more embodiments, the brightness distribution of the third display elements DE3 arranged in the third area AR3 described above with respect to FIG. 2 may decrease. When the brightness distribution decreases, the brightness non-uniformity of the third display elements DE3 may be reduced (e.g., the brightness uniformity of the second display elements DE2 may improve).

According to one or more embodiments, the fifth boosting capacitance Cap,bst5 of the fifth boosting capacitor Cbst5 may be about 1 time to about 5 times the first boosting capacitance Cap,bst1 of the first boosting capacitor Cbst1.

According to one or more embodiments, the ratio of the fifth boosting capacitance Cap,bst5 to the third storage capacitance Cap,st3 may be greater than the ratio of the first boosting capacitance Cap,bst1 to the first storage capacitance Cap,st1.

According to one or more embodiments, the ratio of the fifth boosting capacitance Cap,bst5 to the third storage capacitance Cap,st3 may be about 4% to about 9%.

When the ratio of the fifth boosting capacitance Cap,bst5 to the third storage capacitance Cap,st3 is less than about 4%, representation of the brightness gradation by the third display elements DE3 respectively configured to be driven by the third pixel circuits PC3 including the third storage capacitors Cst3 may become difficult. Also, when the ratio of the fifth boosting capacitance Cap,bst5 to the third storage capacitance Cap,st3 is greater than about 9%, the brightness distribution of the third display elements DE3 respectively configured to be driven by the third pixel circuits PC3 including the third storage capacitors Cst3 may increase. Due to the brightness distribution, the brightness non-uniformity of the display elements arranged in the component area may occur or increase.

However, when the ratio of the fifth boosting capacitance Cap,bst5 to the third storage capacitance Cap,st3 is about 4% to about 9% according to one or more embodiments, the brightness distribution of the third display elements DE3 arranged in the third area AR3 described above with respect to FIG. 2 may decrease. When the brightness distribution decreases, the brightness non-uniformity of the third display elements DE3 may be reduced (e.g., the brightness uniformity of the second display elements DE2 may improve).

According to one or more embodiments, the ratio of the sixth boosting capacitance Cap,bst6 to the third storage capacitance Cap,st3 may be less than the ratio of the third boosting capacitance Cap,bst3 to the first storage capacitance Cap,st1.

According to one or more embodiments, the ratio of the sixth boosting capacitance Cap,bst6 to the third storage capacitance Cap,st3 may be about 1% to about 3%.

When the ratio of the sixth boosting capacitance Cap,bst6 to the third storage capacitance Cap,st3 is less than about 1%, representation of the brightness gradation by the third display elements DE3 respectively configured to be driven by the third pixel circuits PC3 including the third storage capacitors Cst3 may become difficult. Also, when the ratio of the sixth boosting capacitance Cap,bst6 to the third storage capacitance Cap,st3 is greater than about 3%, the brightness distribution of the third display elements DE3 respectively configured to be driven by the third pixel circuits PC3 including the third storage capacitors Cst3 may increase. Due to the brightness distribution, the brightness non-uniformity of the display elements arranged in the component area may occur or increase.

However, when the ratio of the sixth boosting capacitance Cap,bst6 to the third storage capacitance Cap,st3 is about 1% to about 3% according to one or more embodiments, the brightness distribution of the third display elements DE3 arranged in the third area AR3 described above with respect to FIG. 2 may decrease. When the brightness distribution decreases, the brightness non-uniformity of the third display elements DE3 may be reduced (e.g., the brightness uniformity of the second display elements DE2 may improve).

Figure 7:
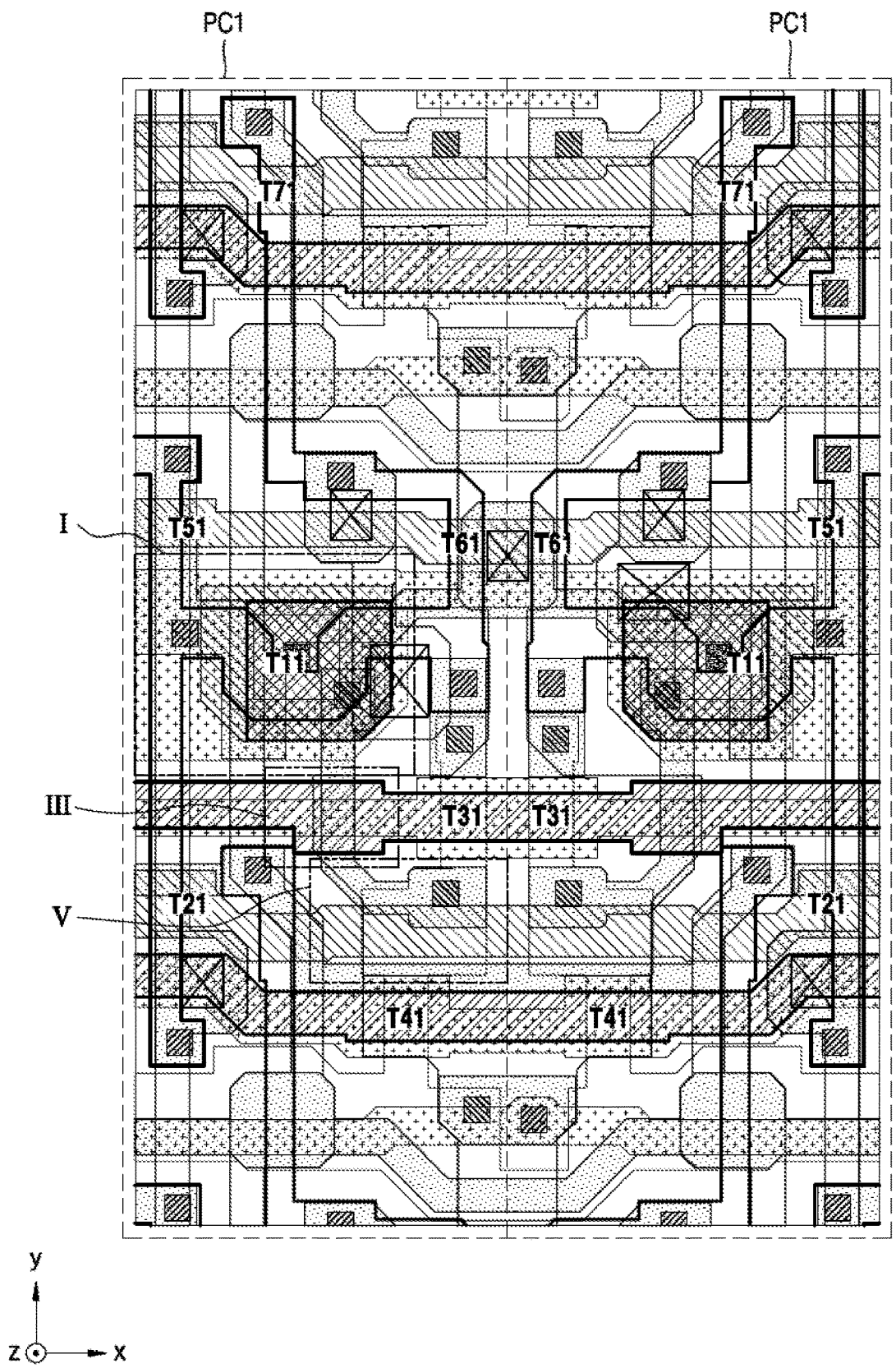
FIG. 7 is a schematic plan view of a first pixel circuit according to one or more embodiments.

FIG. 7 is a schematic plan view of the first pixel circuit PC1 according to one or more embodiments, and FIGS. 8 through 12 are example plan views of one or more layers of FIG. 7.

First, referring to FIG. 7, a display apparatus may include the first pixel circuits PC1 arranged in the first area AR1 (see FIG. 2) and adjacent to each other. According to one or more embodiments, as illustrated in FIG. 7, the adjacent first pixel circuits PC1 may be symmetrical with each other with respect to a virtual line (e.g., a virtual line extending in the ±y direction). According to another embodiment, the adjacent first pixel circuits PC1 may not be symmetrical with each other but may have a structure in which the same pixel circuit is continually repeated.

Hereinafter, for convenience of explanation, one or more semiconductor layers, gate patterns, electrodes, etc. are described based on one first pixel circuit PC1. However, the semiconductor layers, gate patterns, electrodes, etc. may also be symmetrically provided on the adjacent first pixel circuit PC1.

Figure 8:
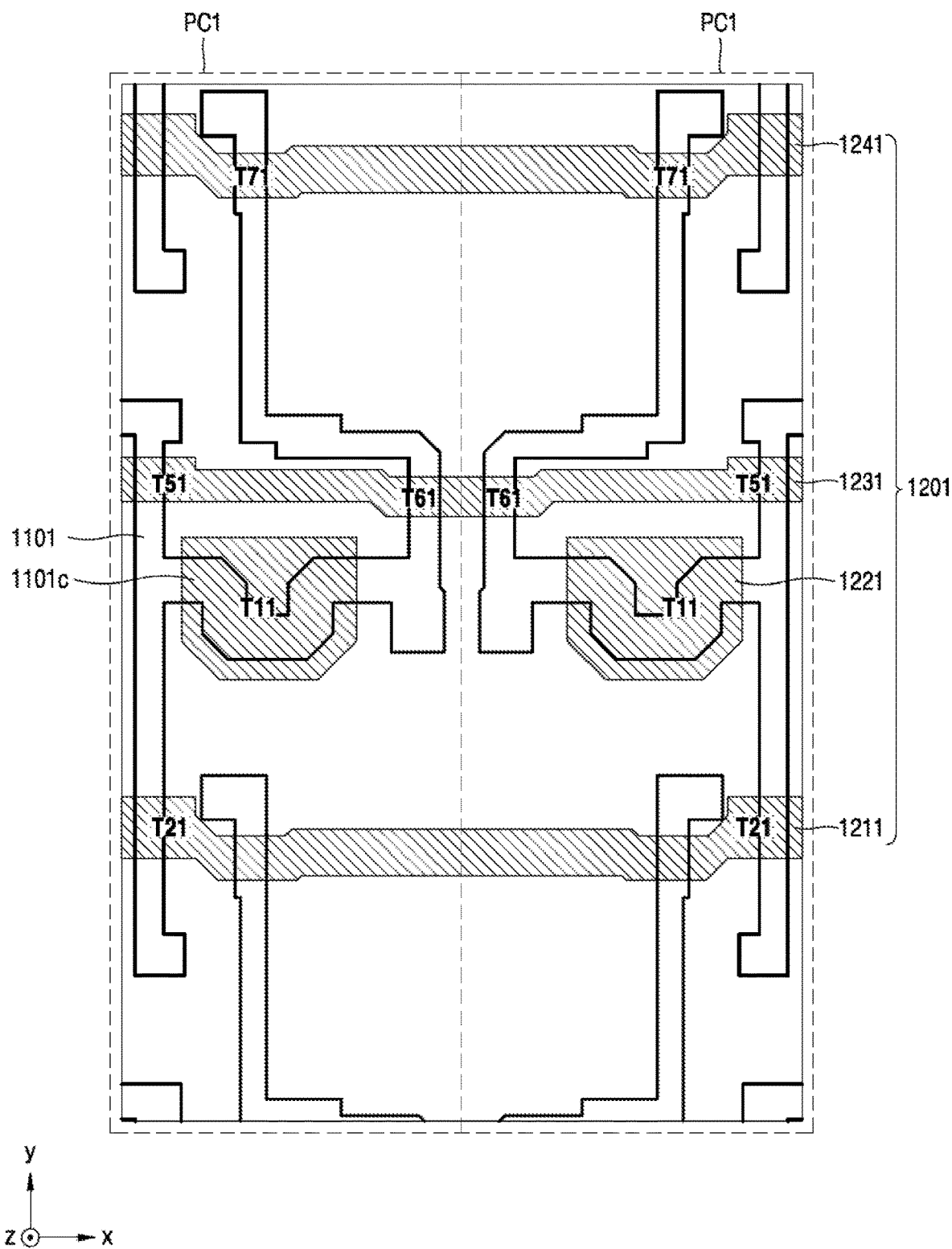
FIGS. 8 through 12 are example plan views of one or more layers of FIG. 7.

Referring to FIG. 8, the first pixel circuit PC1 may include a first semiconductor layer 1101 and a first gate pattern 1221 and may be connected to a first conductive line 1211, a second conductive line 1231, and a third conductive line 1241 extending in a first direction (e.g., a ±x direction). The first conductive line 1211 may correspond to the first scan line GWLa of FIG. 4, the second conductive line 1231 may correspond to the emission control line EMLa of FIG. 4, and the third conductive line 1241 may correspond to the fourth scan line GBLa of FIG. 4.

The first semiconductor layer 1101 may include a silicon semiconductor. For example, the first semiconductor layer 1101 may include amorphous silicon or polysilicon. In more detail, the first semiconductor layer 1101 may include polysilicon crystallized at a low temperature. In one or more embodiments, ions may be injected onto at least a portion of the first semiconductor layer 1101.

The first semiconductor layer 1101 may include a first channel area 1101c overlapping the first gate pattern 1221. The first channel area 1101c may have a shape as illustrated in FIG. 8.

A first conductive layer 1201 including the first gate pattern 1221, the first conductive line 1211, the second conductive line 1231, and the third conductive line 1241 may be arranged on the first semiconductor layer 1101. An insulating layer may be arranged between the first semiconductor layer 1101 and the first conductive layer 1201. The first conductive layer 1201 may include molybdenum (Mo), aluminum (Al), copper (Cu), titanium (Ti), etc., and may include a single layer or multiple layers. For example, the first conductive layer 1201 may include a single Mo layer.

A portion of the first conductive line 1211, the portion overlapping the first semiconductor layer 1101, may function as the gate of the first scan transistor T21. Portions of the second conductive line 1231, the portions overlapping the first semiconductor layer 1101, may function as the gate of the first operation control transistor T51 and the gate of the first emission control transistor T61. A portion of the third conductive line 1241, the portion overlapping the first semiconductor layer 1101, may function as the gate of the first anode initialization transistor T71. The first gate pattern 1221 may correspond to the first lower storage electrode LEst1 of the first storage capacitor Cst1 of FIG. 4 and may function as the gate of the first driving transistor T11. Also, as described below with reference to FIG. 24, a portion of the first conductive line 1211, the portion overlapping a third semiconductor layer 1401, may correspond to the third lower boosting electrode LEbst3 of the third boosting capacitor Cbst3 of FIG. 4.

Figure 9:
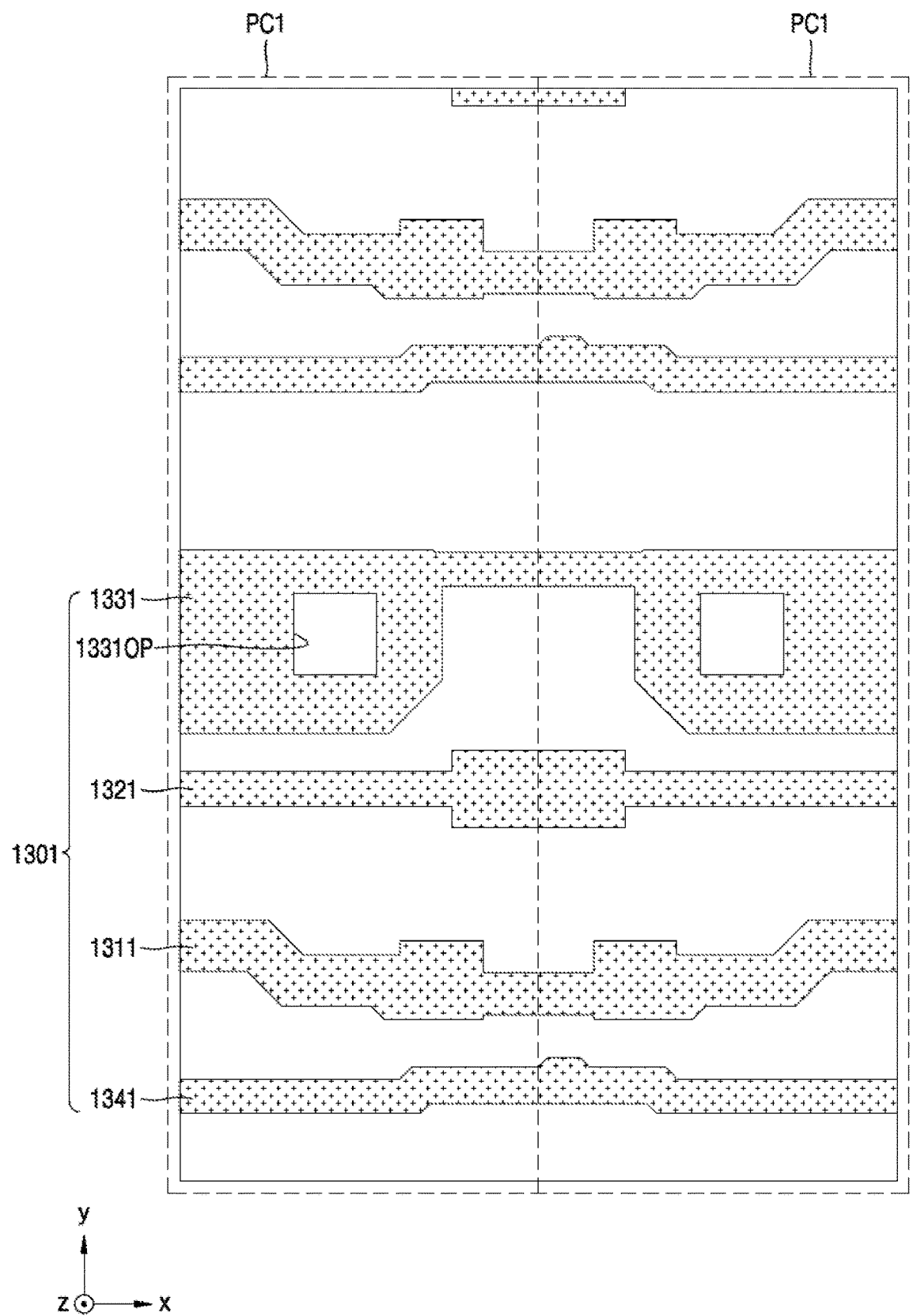

Referring to FIG. 9, the first pixel circuit PC1 may include a first electrode 1331 and may be connected to a fourth conductive line 1311, a fifth conductive line 1321, and a sixth conductive line 1341 extending in a first direction (e.g., a ±x direction). The first electrode 1331 may correspond to the first upper storage electrode UEst1 of the first storage capacitor Cst1 of FIG. 4, the fourth conductive line 1311 may correspond to the third scan line GILa of FIG. 4, the fifth conductive line 1321 may correspond to the second scan line GCLa of FIG. 4, and the sixth conductive line 1341 may correspond to the first voltage line VL1 of FIG. 4.

A second conductive layer 1301 including the first electrode 1331, the fourth conductive line 1311, the fifth conductive line 1321, and the sixth conductive line 1341 may be arranged on the first conductive layer 1201. An insulating layer may be arranged between the first conductive layer 1201 and the second conductive layer 1301. The first electrode 1331 may have an opening 1331OP exposing a portion of the insulating layer. The first electrode 1331 may at least partially overlap the first gate pattern 1221 described above with the insulating layer therebetween. The first electrode 1331 and the first gate pattern 1221 may form the first storage capacitor Cst1 of FIG. 4.

Figure 10:
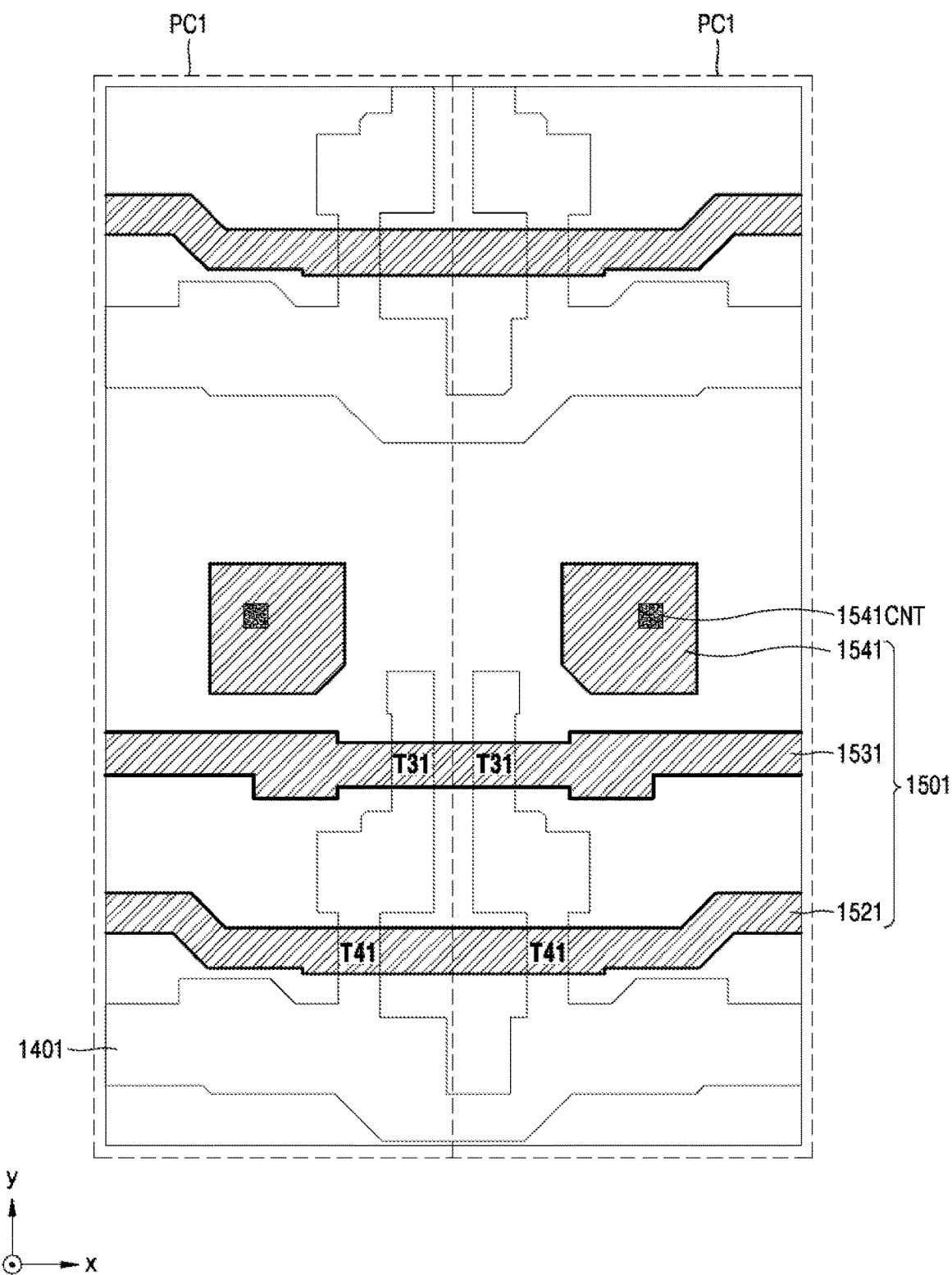

Referring to FIG. 10, the first pixel circuit PC1 may include a third semiconductor layer 1401 and a first connection pattern 1541 and may be connected to a seventh conductive line 1521 and an eighth conductive line 1531 extending in a first direction (e.g., a ±x direction). The seventh conductive line 1521 may correspond to the third scan line GILa of FIG. 4, and the eighth conductive line 1531 may correspond to the second scan line GCLa of FIG. 4. The fourth conductive line 1311 and the seventh conductive line 1521 may form a dual scan line. The fifth conductive line 1321 and the eighth conductive line 1531 may form a dual scan line. Also, as described below with reference to FIG. 22, a portion of the eighth conductive line 1531, the portion overlapping a third connection pattern 1641, may correspond to the first lower boosting electrode LEbst1 of the first boosting capacitor Cbst1 of FIG. 4.

The third semiconductor layer 1401 may be arranged on the second conductive layer 1301. An insulating layer may be arranged between the second conductive layer 1301 and the third semiconductor layer 1401. The third semiconductor layer 1401 may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, the third semiconductor layer 1401 may include an InSnZnO (ITZO) semiconductor layer, an InGaZnO (IGZO) semiconductor layer, etc.

A third conductive layer 1501 including the first connection pattern 1541, the seventh conductive line 1521, and the eighth conductive line 1531 may be arranged on the third semiconductor layer 1401. An insulating layer may be arranged between the third semiconductor layer 1401 and the third conductive layer 1501. The third conductive layer 1501 may include molybdenum (Mo), aluminum (Al), copper (Cu), titanium (Ti), etc., and may include a single layer or multiple layers. For example, the third conductive layer 1501 may include Mo/Ti layers.

A portion of the seventh conductive line 1521, the portion overlapping the third semiconductor layer 1401, may function as the gate of the first gate initialization transistor T41. A portion of the eighth conductive line 1531, the portion overlapping the third semiconductor layer 1401, may function as the gate of the first compensation transistor T31. Also, as described below with reference to FIG. 24, a portion of the third semiconductor layer 1401, the portion overlapping the first conductive line 1211 described above, may correspond to the third upper boosting electrode UEbst3 of the third boosting capacitor Cbst3 of FIG. 4.

The first connection pattern 1541 may be connected to the first gate pattern 1221 of the first conductive layer 1201 through a first contact hole 1541CNT. The first contact hole 1541CNT may penetrate the opening 1331OP of the first electrode 1331 of the second conductive layer 1301.

Figure 11:
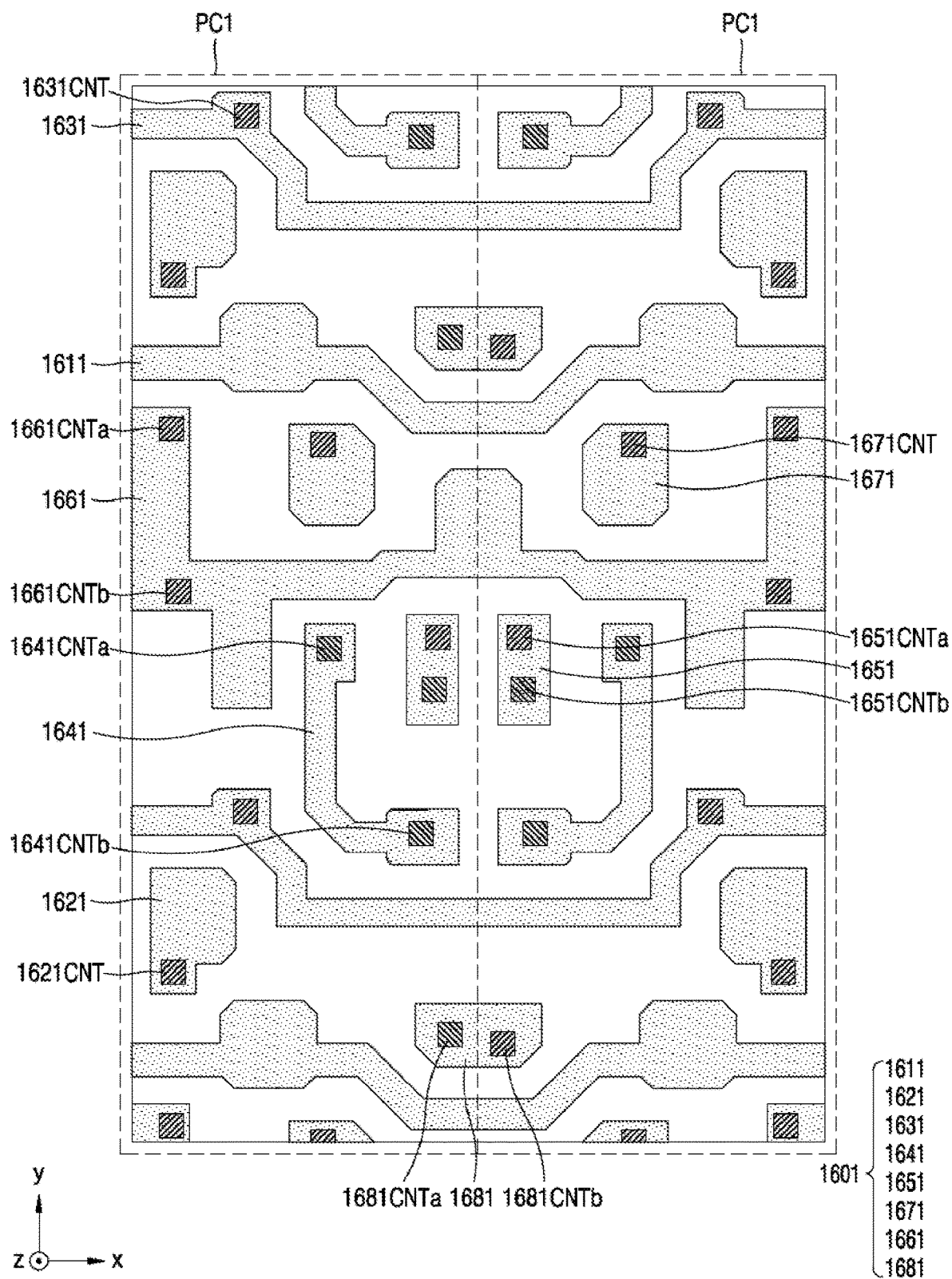

Referring to FIG. 11, the first pixel circuit PC1 may include a second connection pattern 1621, a third connection pattern 1641, a fourth connection pattern 1651, a fifth connection pattern 1671, and a sixth connection pattern 1681 and may be connected to a ninth conductive line 1631 and a tenth conductive line 1661 extending in a first direction (e.g., a ±x direction). The eleventh conductive line 1611 may pass through or extend across the first pixel circuit PC1. The ninth conductive line 1631 may correspond to the second voltage line VL2 of FIG. 4, and the tenth conductive line 1661 may correspond to the power line PL of FIG. 4.

FIG. 11 illustrates that the tenth conductive line 1661 may extend in the first direction (e.g., the ±x direction) and may be connected to the first pixel circuits PC1 arranged in the same row. However, according to another embodiment, the tenth conductive line 1661 may include a plurality of connection patterns. The plurality of connection patterns may be arranged in one first pixel circuit PC1 or in each of the adjacent first pixel circuits PC1.

Also, FIG. 11 illustrates that the eleventh conductive line 1611 passes through or extends across the first pixel circuit PC1. However, according to another embodiment, the eleventh conductive line 1611 may be connected to one or more conductive lines or connection patterns.

A fourth conductive layer 1601 including the second connection pattern 1621, the third connection pattern 1641, the fourth connection pattern 1651, the fifth connection pattern 1671, the sixth connection pattern 1681, the ninth conductive line 1631, the tenth conductive line 1661, and the eleventh conductive line 1611 may be arranged on the third conductive layer 1501. An insulating layer may be arranged between the third conductive layer 1501 and the fourth conductive layer 1601. The fourth conductive layer 1601 may include molybdenum (Mo), aluminum (Al), copper (Cu), titanium (Ti), etc., and may include a single layer or multiple layers. For example, the fourth conductive layer 1601 may include Ti/Al/Ti layers.

The second connection pattern 1621 may be connected to the first semiconductor layer 1101 through a second contact hole 1621CNT. The third connection pattern 1641 may be connected to the first connection pattern 1541 of the third conductive layer 1501 through a 3-1st contact hole 1641CNTa and to the third semiconductor layer 1401 through a 3-2nd contact hole 1641CNTb. The fourth connection pattern 1651 may be connected to the first semiconductor layer 1101 through a 4-1st contact hole 1651CNTa and to the third semiconductor layer 1401 through a 4-2nd contact hole 1651CNTb. The fifth connection pattern 1671 may be connected to the first semiconductor layer 1101 through a fifth contact hole 1671CNT. The sixth connection pattern 1681 may be connected to the third semiconductor layer 1401 through a 6-1st contact hole 1681CNTa and to the sixth conductive line 1341 of the second conductive layer 1301 through a 6-2nd contact hole 1681CNTb. The ninth conductive line 1631 may be connected to the first semiconductor layer 1101 through a seventh contact hole 1631CNT. The tenth conductive line 1661 may be connected to the first semiconductor layer 1101 through an 8-1st contact hole 1661CNTa and to the first electrode 1331 of the second conductive layer 1301 through an 8-2nd contact hole 1661CNTb.

Figure 12:
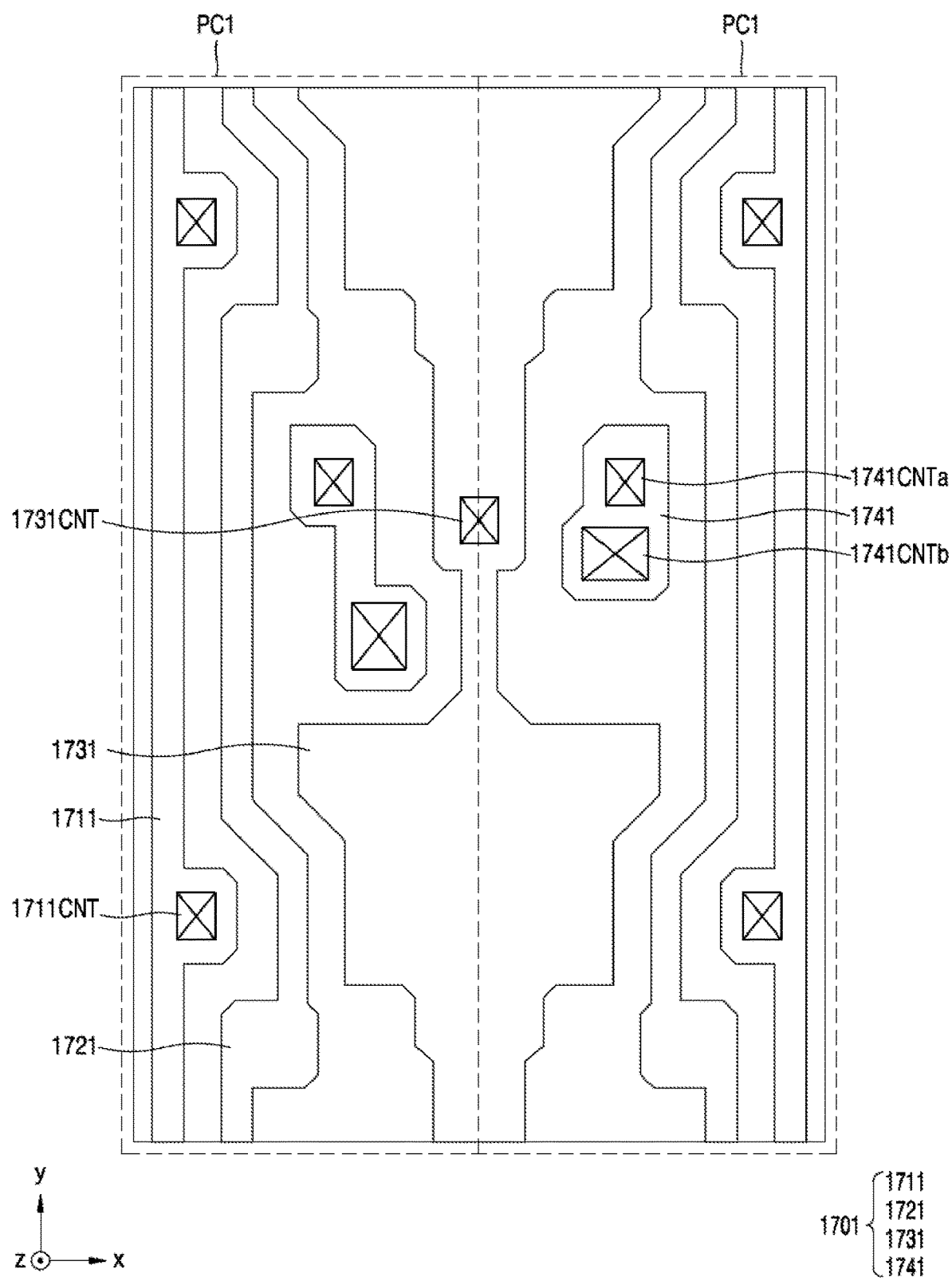

Referring to FIG. 12, the first pixel circuit PC1 may include a seventh connection pattern 1741 and may be connected to a twelfth conductive line 1711 and a thirteenth conductive line 1731 extending in a second direction (e.g., a ±y direction). A fourteenth conductive line 1721 may pass through or extend across the first pixel circuit PC1. The twelfth conductive line 1711 may correspond to the first data line DLa of FIG. 4, and the thirteenth conductive line 1731 may correspond to the power line PL of FIG. 4. The tenth conductive line 1661 and the thirteenth conductive line 1731 may form a power line having a mesh structure.

FIG. 12 illustrates that the fourteenth conductive line 1721 passes through or extends across the first pixel circuit PC1. However, according to another embodiment, the fourteenth conductive line 1721 may be connected to one or more conductive lines or connection patterns. For example, the fourteenth conductive line 1721 may be connected to the eleventh conductive line 1611.

A fifth conductive layer 1701 including the seventh connection pattern 1741, the twelfth conductive line 1711, the thirteenth conductive line 1731, and the fourteenth conductive line 1721 may be arranged on the fourth conductive layer 1601. An insulating layer may be arranged between the fourth conductive layer 1601 and the fifth conductive layer 1701. The fifth conductive layer 1701 may include molybdenum (Mo), aluminum (Al), copper (Cu), titanium (Ti), etc., and may include a single layer or multiple layers. For example, the fifth conductive layer 1701 may include Ti/Al/Ti layers.

The seventh connection pattern 1741 may be connected to the fifth connection pattern 1671 of the fourth conductive layer 1601 through a 9-1st contact hole 1741CNTa and to the anode of the first display element DE1 (see FIG. 4) through a 9-2nd contact hole 1741CNTb. The twelfth conductive line 1711 may be connected to the second connection pattern 1621 of the fourth conductive layer 1601 through a tenth contact hole 1711CNT. The thirteenth conductive line 1731 may be connected to the tenth conductive line 1661 of the fourth conductive layer 1601 through an eleventh contact hole 1731CNT.

Figure 13:
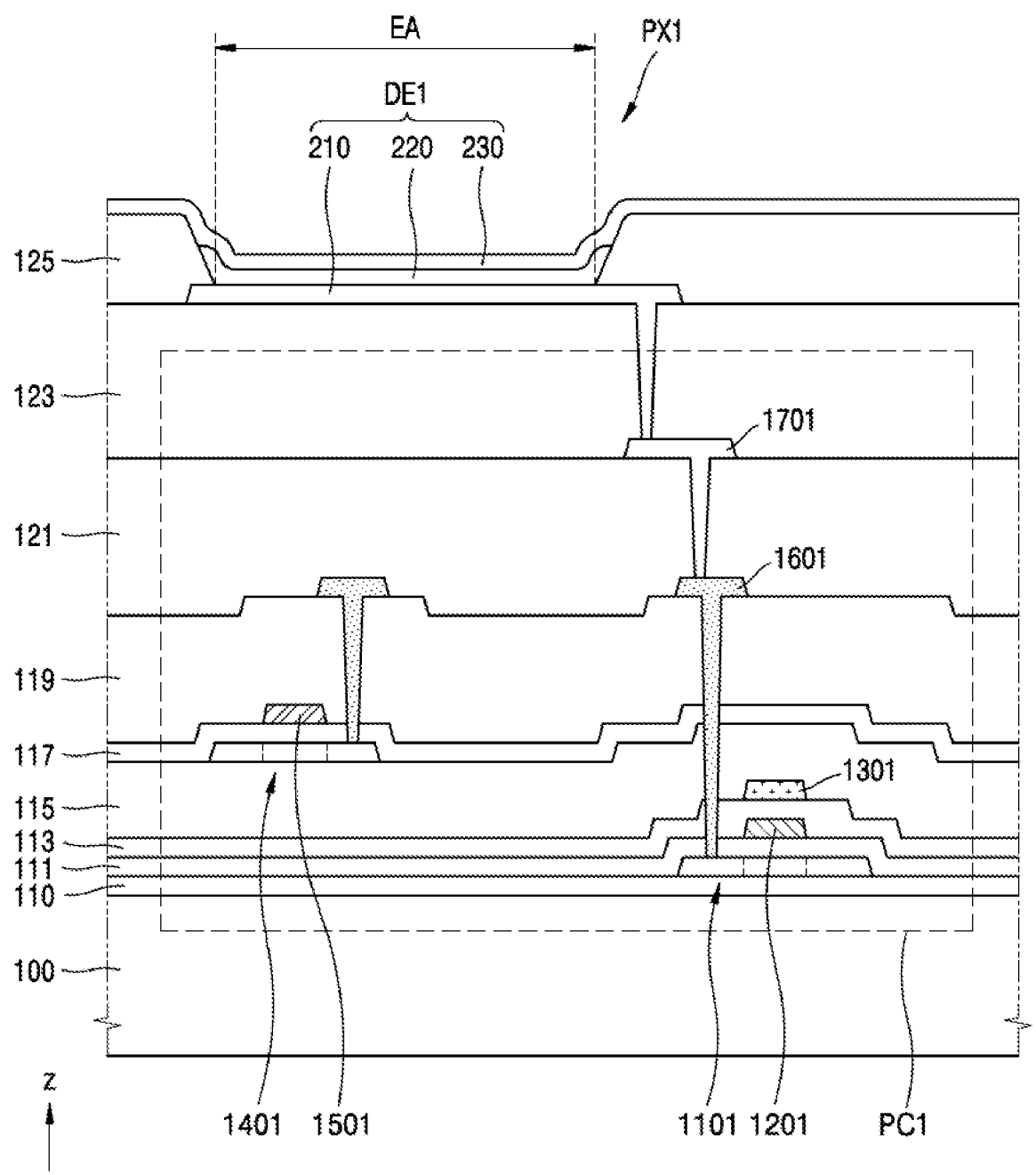
FIG. 13 is a schematic cross-sectional view of a first pixel according to one or more embodiments.

FIG. 13 is a schematic cross-sectional view of the first pixel PX1 according to one or more embodiments. Hereinafter, components included in a display apparatus are described in more detail based on a stack structure by referring to FIG. 13.

The substrate 100 may include a glass material, a ceramic material, a metal material, and/or a flexible or bendable material. In the case where the substrate 100 is flexible or bendable, the substrate 100 may include polymer resins, such as polyethersulfone, polyacrylate, polyetherimide, polyethylene naphthalate, polyethylene terephthalate, polyphenylene sulfide, polyarylate, polyimide, polycarbonate, and/or cellulose acetate propionate.

The substrate 100 may have a single-layer or a multi-layer structure of the materials described above, and when the substrate 200 has a multi-layer structure, the substrate 100 may further include an inorganic layer. In one or more embodiments, the substrate 100 may have a structure of an organic material/an inorganic material/an organic material.

A buffer layer 110 may reduce or block penetration of impurities, moisture, or external materials from below the substrate 100 and may provide a planarized surface for the substrate 100. The buffer layer 110 may include an inorganic material, such as oxide or nitride, an organic material, or an organic and inorganic compound, and may have a single-layer structure or a multi-layer structure including an inorganic material and/or an organic material.

A barrier layer may further be included between the substrate 100 and the buffer layer 110. The barrier layer may prevent, reduce, or minimize the penetration of impurities into the first semiconductor layer 1101 and the third semiconductor layer 1401 from the substrate 100, etc. The barrier layer may include an inorganic material, such as an oxide or a nitride, an organic material, or an organic and inorganic compound and may have a single-layer or multi-layer structure including the inorganic material and the organic material.

The first semiconductor layer 1101 may be arranged on the buffer layer 110. The first semiconductor layer 1101 may include amorphous silicon or polysilicon. The first semiconductor layer 1101 may include a channel area, and a source area and a drain area at opposite sides of the channel area. The source area and the drain area may be areas doped with a dopant. The first semiconductor layer 1101 may include a single layer or multiple layers.

A first insulating layer 111 and a second insulating layer 113 may be stacked on the substrate 100 to cover the first semiconductor layer 1101. The first and second insulating layers 111 and 113 may include $SiO_2$, $SiN_x$, SiON, $Al_2O_3$, $TiO_2$, $Ta_2O_5$, $HfO_2$, and/or $ZnO_x$. $ZnO_x$ may include ZnO and/or $ZnO_2$.

The first conductive layer 1201 may be arranged on the first insulating layer 111. The first conductive layer 1201 may include a conductive material including molybdenum (Mo), aluminum (Al), copper (Cu), titanium (Ti), etc. and may include multiple layers or a single layer including the conductive materials described above.

The second conductive layer 1301 may be arranged on the second insulating layer 113. The second conductive layer 1301 may include a conductive material including molybdenum (Mo), aluminum (Al), copper (Cu), titanium (Ti), etc. and may include multiple layers or a single layer including the conductive materials described above.

A third insulating layer 115 may be arranged on the second insulating layer 113 to cover the second conductive layer 1301. The third insulating layer 115 may include $SiO_2$, $SiN_x$, SiON, $Al_2O_3$, $TiO_2$, $Ta_2O_5$, $HfO_2$, or $ZnO_x$. $ZnO_x$ may include ZnO and/or $ZnO_2$.

The third semiconductor layer 1401 may be arranged on the third insulating layer 115. The third semiconductor layer 1401 may include an oxide semiconductor material. The third semiconductor layer 1401 may include, for example, an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

For example, the third semiconductor layer 1401 may include an ITZO semiconductor layer, an IGZO semiconductor layer, etc. The oxide semiconductor may have a large band gap (about 3.1 eV), a high carrier mobility, and a low leakage current, and thus, even when a driving time is increased, a voltage drop may not be large. Thus, even in a low frequency operation, there may be a less luminance change due to a voltage drop.

The third semiconductor layer 1401 may include a channel area, and a source area and a drain area at opposite sides of the channel area. The third semiconductor layer 1401 may include a single layer or multiple layers.

A fourth insulating layer 117 may be arranged on the third semiconductor layer 1401. The fourth insulating layer 117 may include $SiO_2$, $SiN_x$, SiON, $Al_2O_3$, $TiO_2$, $Ta_2O_5$, $HfO_2$, or $ZnO_x$. $ZnO_x$ may include ZnO and/or $ZnO_2$.

FIG. 13 illustrates that the fourth insulating layer 117 may be arranged on the entire surface of the substrate 100 to cover the third semiconductor layer 1401. However, according to another embodiment, the fourth insulating layer 117 may be patterned to overlap a portion of the third semiconductor layer 1401. For example, the fourth insulating layer 117 may be patterned to overlap the channel area of the third semiconductor layer 1401.

The third conductive layer 1501 may be arranged on the fourth insulating layer 117. The third conductive layer 1501 may include a conductive material including molybdenum (Mo), aluminum (Al), copper (Cu), titanium (Ti), etc. and may include multiple layers or a single layer including the conductive materials described above.

A fifth insulating layer 119 may be arranged on the fourth insulating layer 117 to cover the third conductive layer 1501. The fifth insulating layer 119 may include $SiO_2$, $SiN_x$, SiON, $Al_2O_3$, $TiO_2$, $Ta_2O_5$, $HfO_2$, or $ZnO_x$. $ZnO_x$ may include ZnO and/or $ZnO_2$.

The fourth conductive layer 1601 may be arranged on the fifth insulating layer 119. The fourth conductive layer 1601 may include a conductive material including molybdenum (Mo), aluminum (Al), copper (Cu), titanium (Ti), etc. and may include multiple layers or a single layer including the conductive materials described above.

A first planarization layer 121 and a second planarization layer 123 may be stacked on the fifth insulating layer 119. The first and second planarization layers 121 and 123 may include a single layer or multiple layers including an organic material and may provide a flat upper surface. The first and second planarization layers 121 and 123 may include benzocyclobutene (BCB), polyimide, hexamethyldisiloxane (HMDSO), polymethylmethacrylate (PMMA), or a general-purpose polymer, such as polystyrene (PS), a polymer derivate having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof.

The fifth conductive layer 1701 may be arranged between the first and second planarization layers 121 and 123. The fifth conductive layer 1701 may include a conductive material including molybdenum (Mo), aluminum (Al), copper (Cu), titanium (Ti), etc. and may include multiple layers or a single layer including the conductive materials described above.

FIG. 13 illustrates that two planarization layers are arranged on the fifth insulating layer 119. However, according to another embodiment, the number of planarization layers arranged on the fifth insulating layer 119 may be three or more. According to another embodiment, one planarization layer may be arranged on the fifth insulating layer 119.

The first display element DE1 connected (e.g., electrically connected) to the first pixel circuit PC1 may be arranged on the second planarization layer 123. The display element DE1 may include a pixel electrode 210, an intermediate layer 220 including an organic emission layer, and an opposite electrode 230. The first pixel PX1 may be realized by the first display element DE1.

The pixel electrode 210 may include a transmissive (or transflective) electrode or a reflection electrode. In one or more embodiments, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), and a compound thereof, and a transparent or semi-transparent electrode layer on the reflective layer. The transparent or semi-transparent electrode layer may include at least one selected from the group consisting of ITO, IZO, ZnO, $In_2O_3$, IGO, and AZO. In one or more embodiments, the pixel electrode 210 may include ITO/Ag/ITO.

A pixel-defining layer 125 may be arranged on the second planarization layer 123. Also, the pixel-defining layer 125 may increase a distance between the edge of the pixel electrode 210 and the opposite electrode 230 above the pixel electrode 210 so as to prevent or substantially prevent arcs, etc. from occurring at the edge of the pixel electrode 210.

The pixel-defining layer 125 may be formed by spin coating, etc. by including at least one organic insulating material selected from the group consisting of polyimide, polyamide, acryl resins, BCB, and phenol resins. The pixel-defining layer 125 may include an organic insulating material. In one or more embodiments, the pixel-defining layer 125 may include an inorganic insulating material, such as silicon nitride, silicon oxynitride, or silicon oxide. In one or more embodiments, the pixel-defining layer 125 may include an organic insulating material and an inorganic insulating material. In one or more embodiments, the pixel-defining layer 125 may include a light-shielding material and may be provided in a black color. The light-shielding material may include a resin or paste including carbon black, a carbon nano-tube, and a black dye, a metal particle, such as nickel (Ni), aluminum (Al), molybdenum (Mo), and an alloy thereof, a metal oxide particle (e.g., chromium oxide), a metal nitride particle (e.g., chromium nitride), and/or the like. When the pixel-defining layer 125 includes the light-shielding material, reflection of external light due to metal structures arranged below the pixel-defining layer 125 may be reduced.

The intermediate layer 220 may be arranged in an opening formed by the pixel-defining layer 125. An emission area EA of the first display element DE1 may be defined by the opening. The intermediate layer 220 may include an organic emission layer. The organic emission layer may include an organic material including a fluorescent or phosphorescent material for emitting red, green, blue, or white light. The organic emission layer may include a low molecular-weight organic material or a high molecular-weight organic material. Also, a functional layer, such as a hole transport layer (HTL), a hole injection layer (HIL), an electron transport layer (ETL), or an electron injection layer (EIL), may be selectively further arranged above and below the organic emission layer.

The intermediate layer 220 may be arranged to correspond to each of the plurality of pixel electrodes 210. However, the intermediate layer 220 is not limited thereto. The intermediate layer 220 may be integrally formed throughout the plurality of pixel electrodes 210. Like this, the intermediate layer 220 may have various suitable modifications.

The opposite electrode 230 may include a transmissive electrode or a reflection electrode. In one or more embodiments, the opposite electrode 230 may include a transparent or semi-transparent electrode and may include a metal thin-film having a low work function, such as lithium (Li), calcium (Ca), LiF/Ca, LiF/Al, aluminum (Al), silver (Ag), magnesium (Mg), and a compound thereof. Also, a TCO layer including ITO, IZO, ZnO, $In_2O_3$, etc. may further be arranged above the metal thin-film. The opposite electrode 230 may be arranged in the entire display area and may be arranged above the intermediate layer 220 and the pixel-defining layer 125. The opposite electrode 230 may be integrally formed with respect to the plurality of first display elements DE1 and may correspond to the plurality of the pixel electrode 210.

The first display element DE1 may be covered by an encapsulation layer. The encapsulation layer may include at least one organic encapsulation layer and at least one inorganic encapsulation layer. The at least one inorganic encapsulation layer may include at least one inorganic material from among aluminum oxide, titanium oxide, tantalum oxide, hafnium oxide, zinc oxide, silicon oxide, silicon nitride, and silicon oxynitride. The at least one inorganic encapsulation layer may include a single layer or multiple layers including the materials described above. The at least one organic encapsulation layer may include a polymer-based material. The polymer-based material may include acryl-based resins, such as polymethylmethacrylate and polyacrylic acid, epoxy-based resins, polyimide, polyethylene, etc. According to one or more embodiments, the at least one organic encapsulation layer may include acrylate polymers.

Figure 14:
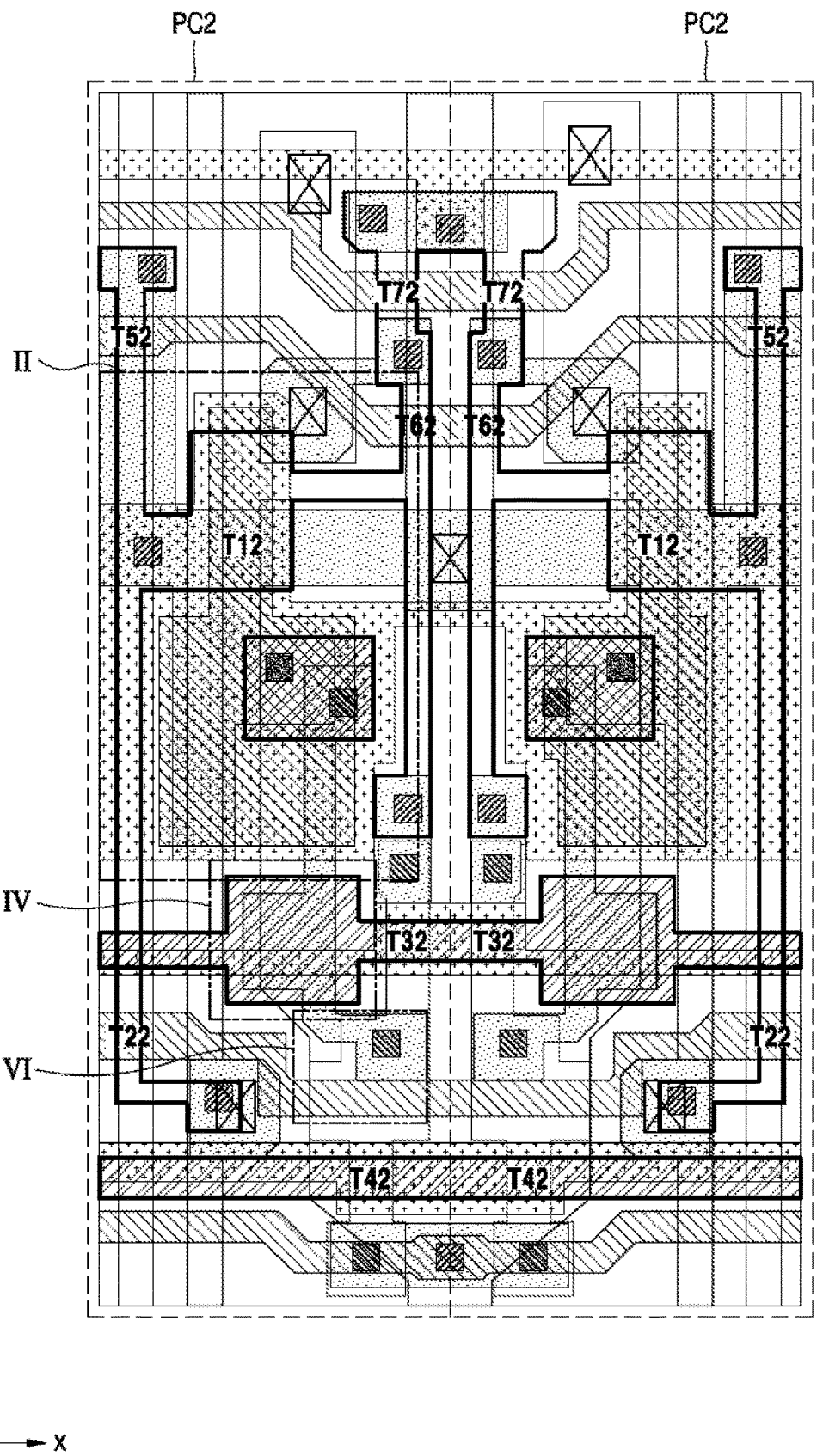
FIG. 14 is a schematic plan view of a second pixel circuit according to one or more embodiments.

FIG. 14 is a schematic plan view of the second pixel circuit PC2 according to one or more embodiments, and FIGS. 15 through 19 are example plan views of one or more layers of FIG. 14. FIGS. 14 through 19 illustrate the second pixel circuit PC2 of FIG. 5 as an example. However, the aspects of FIGS. 14 through 19 may be likewise applied to the third pixel circuit PC3 of FIG. 6.

First, referring to FIG. 14, a display apparatus may include the second pixel circuits PC2 arranged in the third area AR3 (see FIG. 2) and adjacent to each other. According to one or more embodiments, as illustrated in FIG. 14, the adjacent second pixel circuits PC2 may be symmetrical with each other with respect to a virtual line (e.g., a virtual line extending in the ±y direction). According to another embodiment, the adjacent second pixel circuits PC2 may not be symmetrical with each other but may have a structure in which the same pixel circuit is continually repeated.

Hereinafter, for convenience of explanation, one or more semiconductor layers, gate patterns, electrodes, etc. are described based on one second pixel circuit PC2. However, the semiconductor layers, gate patterns, electrodes, etc. may also be symmetrically provided on the adjacent second pixel circuit PC2.

Figure 15:
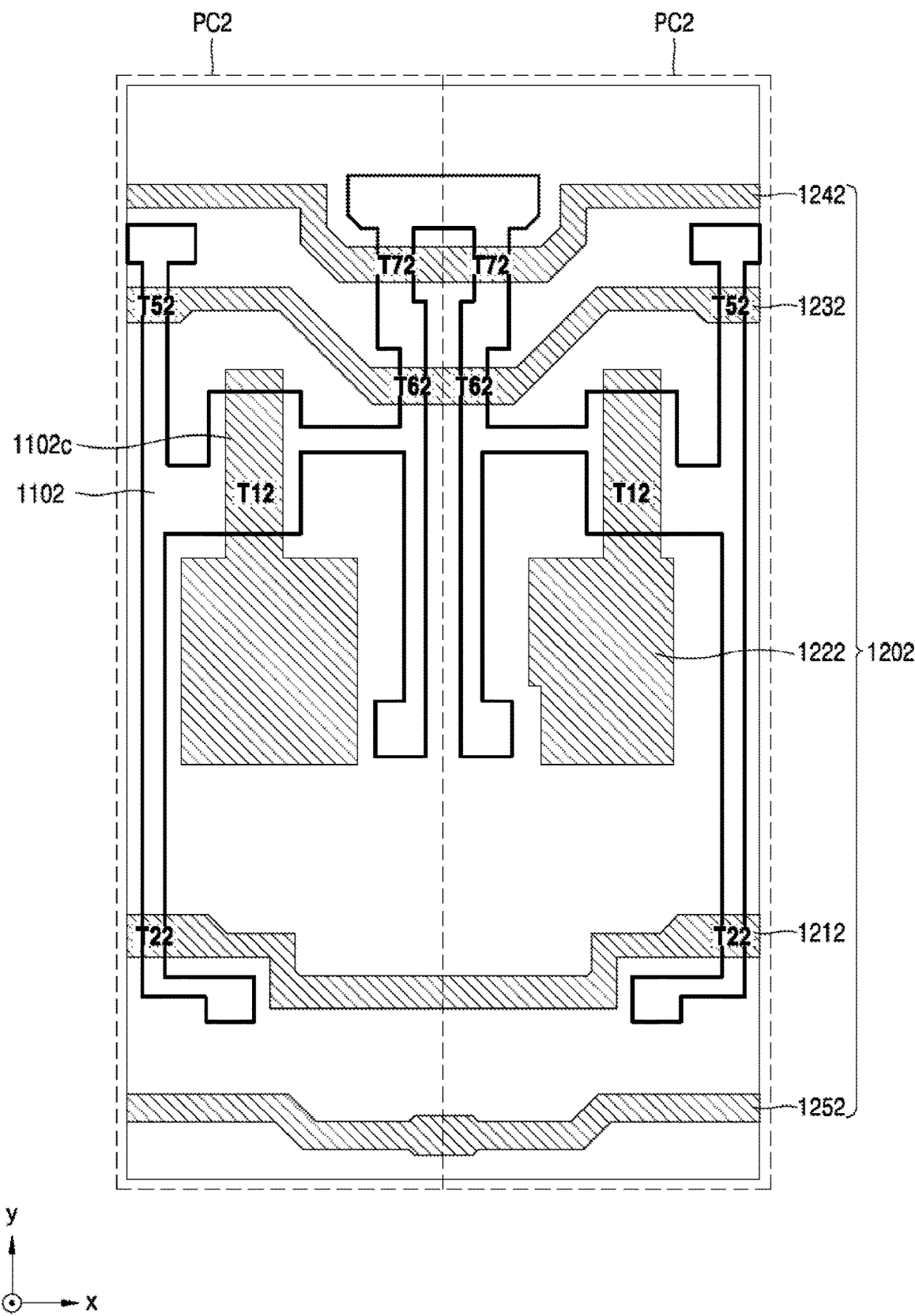
FIGS. 15 through 19 are example plan views of one or more layers of FIG. 14.

Referring to FIG. 15, the second pixel circuit PC2 may include a second semiconductor layer 1102 and a second gate pattern 1222 and may be connected to a fifteenth conductive line 1212, a sixteenth conductive line 1232, a seventeenth conductive line 1242, and an eighteenth conductive line 1252 extending in a first direction (e.g., a ±x direction). The fifteenth conductive line 1212 may correspond to the first scan line GWLb of FIG. 5, the sixteenth conductive line 1232 may correspond to the emission control line EMLb of FIG. 5, the seventeenth conductive line 1242 may correspond to the fourth scan line GBLb of FIG. 5, and the eighteenth conductive line 1252 may correspond to the first voltage line VL1 of FIG. 5.

The second semiconductor layer 1102 may include a silicon semiconductor. For example, the second semiconductor layer 1102 may include amorphous silicon or polysilicon. In more detail, the second semiconductor layer 1102 may include polysilicon crystallized at a low temperature. In one or more embodiments, ions may be injected onto at least a portion of the second semiconductor layer 1102.

The second semiconductor layer 1102 may include a second channel area 1102c overlapping the second gate pattern 1222. The second channel area 1102c may have a square shape as illustrated in FIG. 15.

When the first channel area 1101c illustrated in FIG. 8 is compared with the second channel area 1102c illustrated in FIG. 15, the second channel area 1102c may have a greater channel width and a shorter channel length than the first channel area 1101c.

A sixth conductive layer 1202 including the second gate pattern 1222, the fifteenth conductive line 1212, the sixteenth conductive line 1232, the seventeenth conductive line 1242, and the eighteenth conductive line 1252 may be arranged on the second semiconductor layer 1102. An insulating layer may be arranged between the second semiconductor layer 1102 and the sixth conductive layer 1202. The second semiconductor layer 1102 and the sixth conductive layer 1202 may be arranged on or at the same layers as the first semiconductor layer 1101 and the first conductive layer 1201, respectively, that are described above with reference to FIG. 8. The sixth conductive layer 1202 may include molybdenum (Mo), aluminum (Al), copper (Cu), titanium (Ti), etc., and may include a single layer or multiple layers. For example, the sixth conductive layer 1202 may include a single Mo layer.

A portion of the fifteenth conductive line 1212, the portion overlapping the second semiconductor layer 1102, may function as the gate of the second scan transistor T22. Portions of the sixteenth conductive line 1232, the portions overlapping the second semiconductor layer 1102, may function as the gate of the second operation control transistor T52 and the gate of the second emission control transistor T62. A portion of the seventeenth conductive line 1242, the portion overlapping the second semiconductor layer 1102, may function as the gate of the second anode initialization transistor T72. The second gate pattern 1222 may correspond to the second lower storage electrode LEst2 of the second storage capacitor Cst2 of FIG. 5 and may function as the gate of the second driving transistor T12. Also, as described below with reference to FIG. 25, a portion of the fifteenth conductive line 1212, the portion overlapping a fourth semiconductor layer 1402, may correspond to the fourth lower boosting electrode LEbst4 of the fourth boosting capacitor Cbst4 of FIG. 5.

According to one or more embodiments, an area of the second gate pattern 1222 may vary according to a wavelength range of the light emitted from the second display element DE2 (see FIG. 2) configured to be driven by the second pixel circuit PC2. For example, an area of the second gate pattern 1222 included in the second pixel circuit PC2 configured to drive the second display element DE2 emitting blue light may be greater than an area of the second gate pattern 1222 included in the second pixel circuit PC2 configured to drive the second display element DE2 emitting red light. The area of the second gate pattern 1222 included in the second pixel circuit PC2 configured to drive the second display element DE2 emitting red light may be greater than an area of the second gate pattern 1222 included in the second pixel circuit PC2 configured to drive the second display element DE2 emitting green light.

According to one or more embodiments, the second gate pattern 1222 may extend from the second channel area 1102c in a −y direction. For example, as illustrated in FIG. 15, the second gate pattern 1222 may extend from the second channel area 1102c to a 16-1st contact hole 1652CNTa described below and illustrated in FIG. 18.

Figure 16:
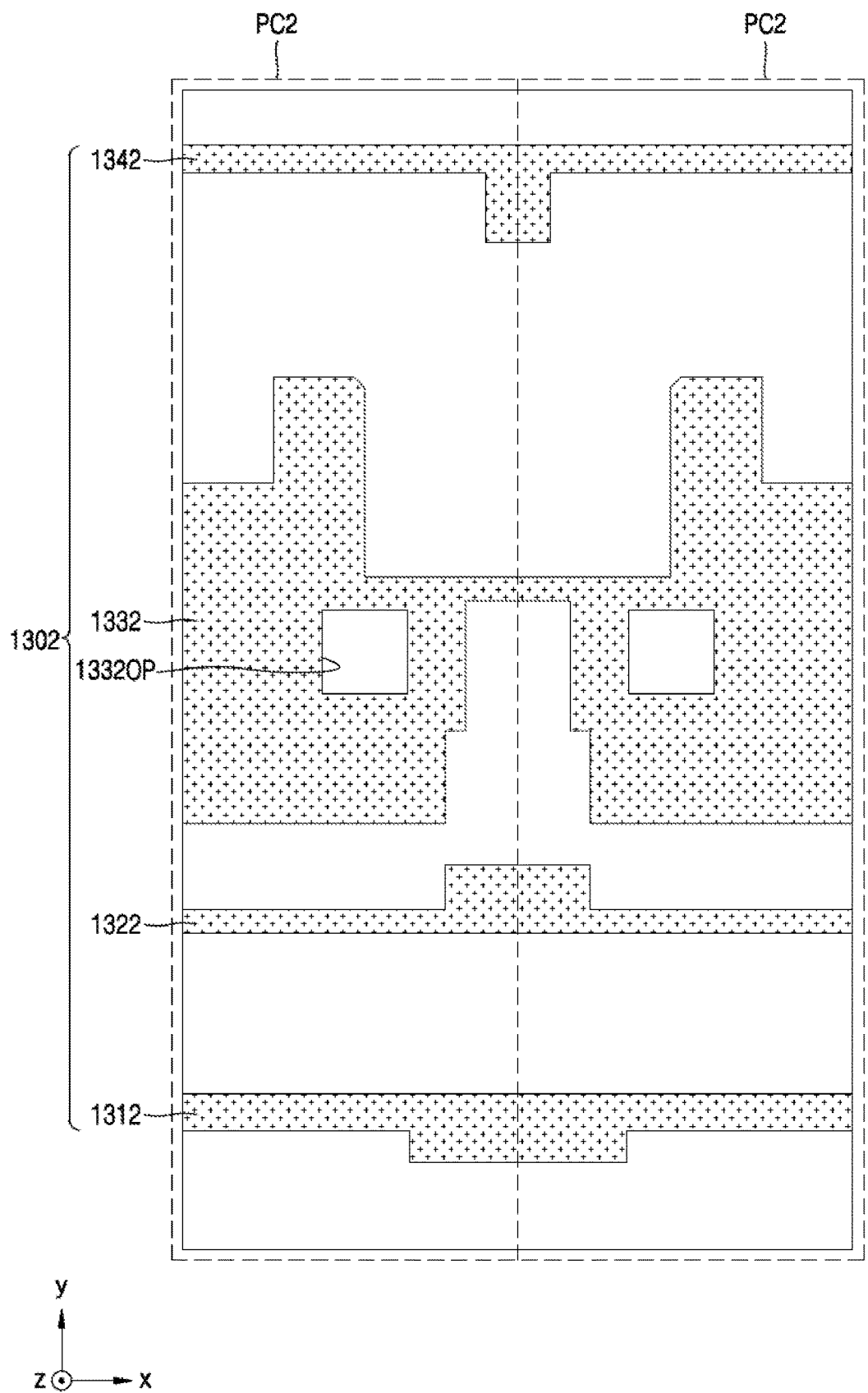

Referring to FIG. 16, the second pixel circuit PC2 may include a second electrode 1332 and may be connected to a nineteenth conductive line 1312, a twentieth conductive line 1322, and a twenty-first conductive line 1342 extending in a first direction (e.g., a ±x direction). The second electrode 1332 may correspond to the second upper storage electrode UEst2 of the second storage capacitor Cst2 of FIG. 5, the nineteenth conductive line 1312 may correspond to the third scan line GILb of FIG. 5, the twentieth conductive line 1322 may correspond to the second scan line GCLb of FIG. 5, and the twenty-first conductive line 1342 may correspond to the second voltage line VL2 of FIG. 5.

A seventh conductive layer 1302 including the second electrode 1332, the nineteenth conductive line 1312, the twentieth conductive line 1322, and the twenty-first conductive line 1342 may be arranged on the sixth conductive layer 1202. An insulating layer may be arranged between the sixth conductive layer 1202 and the seventh conductive layer 1302. The seventh conductive layer 1302 may be arranged on or at the same layer as the second conductive layer 1301 described above with reference to FIG. 9. The second electrode 1332 may have an opening 13320P exposing a portion of the insulating layer. The second electrode 1332 may at least partially overlap the second gate pattern 1222 described above with the insulating layer therebetween. The second electrode 1332 and the second gate pattern 1222 may form the second storage capacitor Cst2 of FIG. 5.

Figure 17:
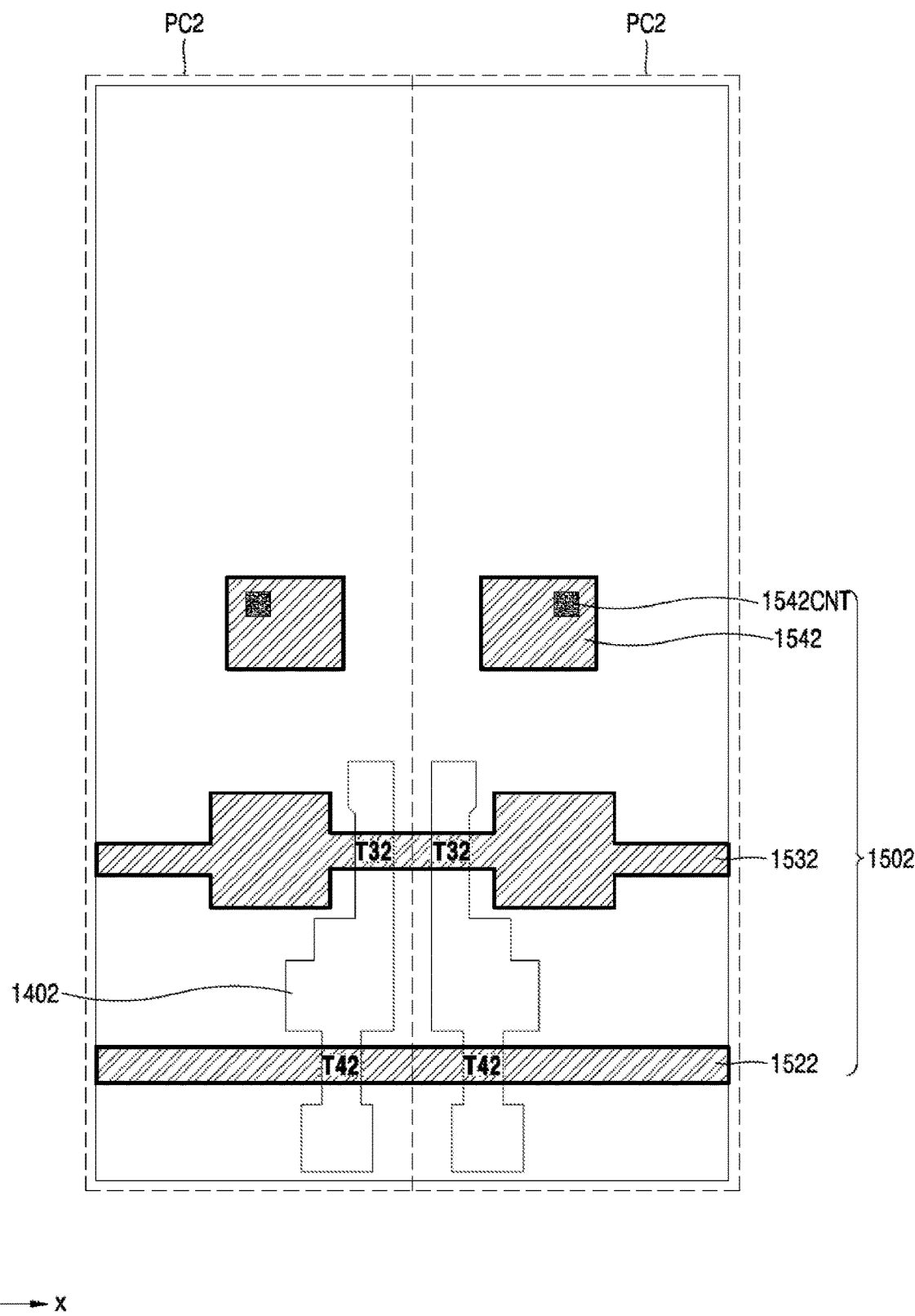

Referring to FIG. 17, the second pixel circuit PC2 may include the fourth semiconductor layer 1402 and an eighth connection pattern 1542 and may be connected to a twenty-second conductive line 1522 and a twenty-third conductive line 1532 extending in a first direction (e.g., a ±x direction). The twenty-second conductive line 1522 may correspond to the third scan line GILb of FIG. 5, and the twenty-third conductive line 1532 may correspond to the second scan line GCLb of FIG. 5. The nineteenth conductive line 1312 and the twenty-second conductive line 1522 may form a dual scan line. The twentieth conductive line 1322 and the twenty-third conductive line 1532 may form a dual scan line. Also, as described below with reference to FIG. 23, a portion of the twenty-third conductive line 1532, the portion overlapping an eleventh connection pattern 1642, may correspond to the second lower boosting electrode LEbst2 of the second boosting capacitor Cbst2 of FIG. 5.

The fourth semiconductor layer 1402 may be arranged on the seventh conductive layer 1302. An insulating layer may be arranged between the seventh conductive layer 1302 and the fourth semiconductor layer 1402. The fourth semiconductor layer 1402 may be arranged on or at the same layer as the third semiconductor layer 1401 described above with reference to FIG. 10. The fourth semiconductor layer 1402 may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, the fourth semiconductor layer 1402 may include an ITZO semiconductor layer, an IGZO semiconductor layer, etc.

An eighth conductive layer 1502 including the eighth connection pattern 1542, the twenty-second conductive line 1522, and the twenty-third conductive line 1532 may be arranged on the fourth semiconductor layer 1402. An insulating layer may be arranged between the fourth semiconductor layer 1402 and the eighth conductive layer 1502. The eighth conductive layer 1502 may be arranged on or at the same layer as the third conductive layer 1501 described above with reference to FIG. 10. The eighth conductive layer 1502 may include molybdenum (Mo), aluminum (Al), copper (Cu), titanium (Ti), etc., and may include a single layer or multiple layers. For example, the eighth conductive layer 1502 may include Mo/Ti layers.

A portion of the twenty-second conductive line 1522, the portion overlapping the fourth semiconductor layer 1402, may function as the gate of the second gate initialization transistor T42. A portion of the twenty-third conductive line 1532, the portion overlapping the fourth semiconductor layer 1402, may function as the gate of the second compensation transistor T32. Also, as described below with reference to FIG. 25, a portion of the fourth semiconductor layer 1402, the portion overlapping the fifteenth conductive line 1212 described above, may correspond to the fourth upper boosting electrode UEbst4 of the fourth boosting capacitor Cbst4 of FIG. 5.

The eighth connection pattern 1542 may be connected to the second gate pattern 1222 of the sixth conductive layer 1202 through a twelfth contact hole 1542CNT. The twelfth contact hole 1542CNT may penetrate the opening 13320P of the second electrode 1332 of the seventh conductive layer 1302.

Figure 18:
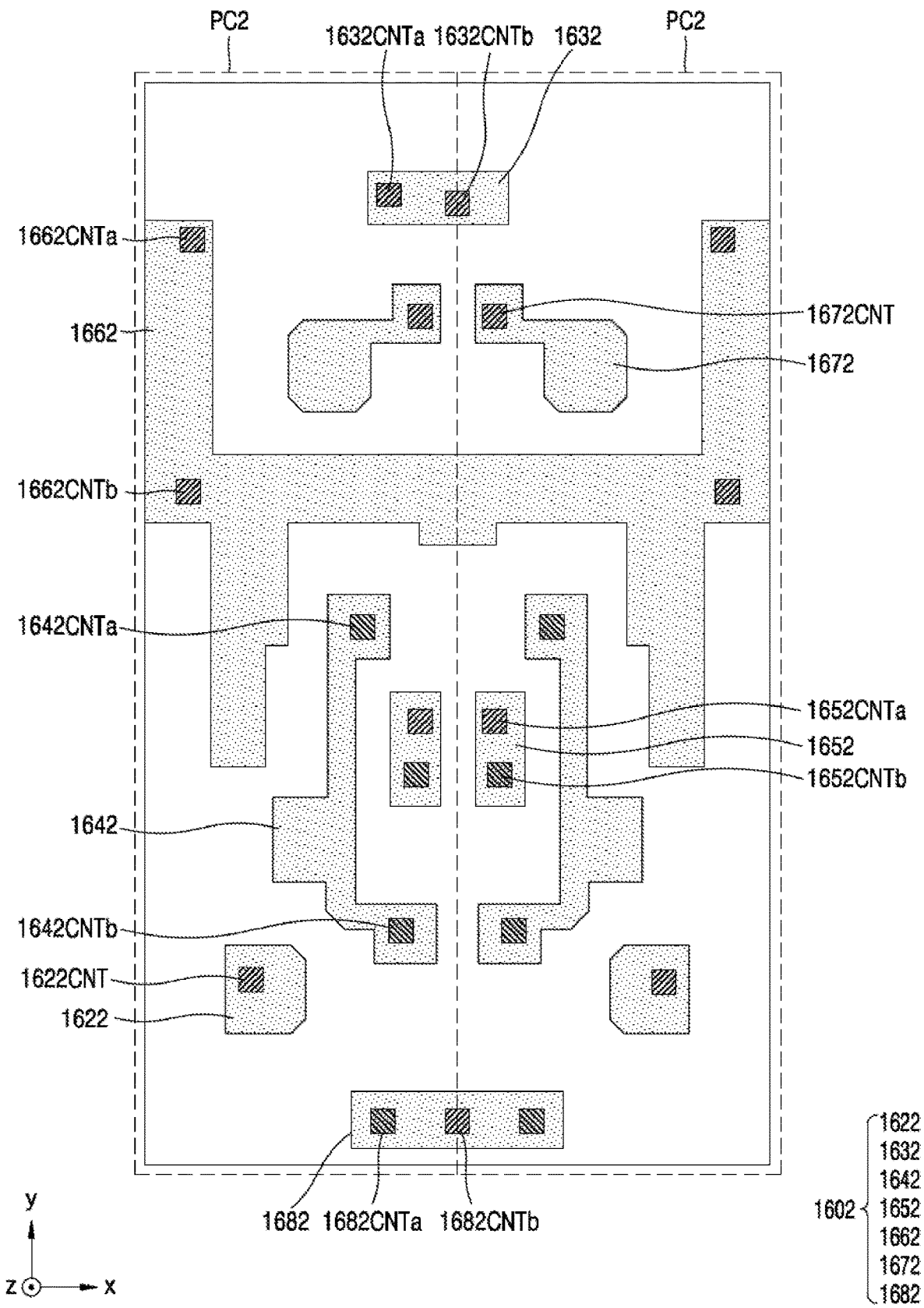

Referring to FIG. 18, the second pixel circuit PC2 may include a ninth connection pattern 1622, a tenth connection pattern 1632, the eleventh connection pattern 1642, a twelfth connection pattern 1652, a thirteenth connection pattern 1672, and a fourteenth connection pattern 1682 and may be connected to a twenty-fourth conductive line 1662 extending in a first direction (e.g., a ±x direction). The twenty-fourth conductive line 1662 may correspond to the power line PL of FIG. 5.

FIG. 18 illustrates that the twenty-fourth conductive line 1662 may extend in the first direction (e.g., the ±x direction) and may be connected to the second pixel circuits PC2 arranged in the same row. However, according to another embodiment, the twenty-fourth conductive line 1662 may include a plurality of connection patterns. The plurality of connection patterns may be arranged in one second pixel circuit PC2 or in each of the adjacent second pixel circuits PC2.

A ninth conductive layer 1602 including the ninth connection pattern 1622, the tenth connection pattern 1632, the eleventh connection pattern 1642, the twelfth connection pattern 1652, the thirteenth connection pattern 1672, the fourteenth connection pattern 1682, and the twenty-fourth conductive line 1662 may be arranged on the eighth conductive layer 1502. An insulating layer may be arranged between the eighth conductive layer 1502 and the ninth conductive layer 1602. The ninth conductive layer 1602 may be arranged on or at the same layer as the fourth conductive layer 1601 described above with reference to FIG. 11. The ninth conductive layer 1602 may include molybdenum (Mo), aluminum (Al), copper (Cu), titanium (Ti), etc., and may include a single layer or multiple layers. For example, the ninth conductive layer 1602 may include Ti/Al/Ti layers.

The ninth connection pattern 1622 may be connected to the second semiconductor layer 1102 through a thirteenth contact hole 1622CNT. The tenth connection pattern 1632 may be connected to the second semiconductor layer 1102 through a 14-1st contact hole 1632CNTa and to the twenty-first conductive line 1342 through a 14-2nd contact hole 1632CNTb. The eleventh connection pattern 1642 may be connected to the eighth connection pattern 1542 of the eighth conductive layer 1502 through a 15-1st contact hole 1642CNTa and to the fourth semiconductor layer 1402 through a 15-2nd contact hole 1642CNTb. The twelfth connection pattern 1652 may be connected to the second semiconductor layer 1102 through a 16-1st contact hole 1652CNTa and to the fourth semiconductor layer 1402 through a 16-2nd contact hole 1652CNTb. The thirteenth connection pattern 1672 may be connected to the second semiconductor layer 1102 through a seventeenth contact hole 1672CNT. The fourteenth connection pattern 1682 may be connected to the fourth semiconductor layer 1402 through an 18-1st contact hole 1682CNTa and to the eighteenth conductive line 1252 of the sixth conductive layer 1202 through an 18-2nd contact hole 1682CNTb. The twenty-fourth conductive line 1662 may be connected to the second semiconductor layer 1102 through an 19-1st contact hole 1662CNTa and to the second electrode 1332 of the seventh conductive layer 1302 through a 19-2nd contact hole 1662CNTb.

According to one or more embodiments, the twenty-fourth conductive line 1662 may extend from the 19-2nd contact hole 1662CNTb in a −y direction. For example, as illustrated in FIG. 18, the twenty-fourth conductive line 1662 may extend from the 19-2nd contact hole 1662CNTb to a region between the 16-1st contact hole 1652CNTa and the 16-2nd contact hole 1652CNTb. A portion of the twenty-fourth conductive line 1662 extending in the −y direction may shield a semiconductor layer and a peripheral metal layer (e.g., a data line) to reduce signal coupling due to a parasitic capacitance between the semiconductor layer and the peripheral metal layer. Also, a portion of the twenty-fourth conductive line 1662 extending in the −y direction may overlap the peripheral metal layer (e.g., the data line), and thus, the charge time of the pixel circuit may be sufficiently secured, and by securing the charge time of the pixel circuit, the brightness deviation of the display panel may be reduced.

Figure 19:
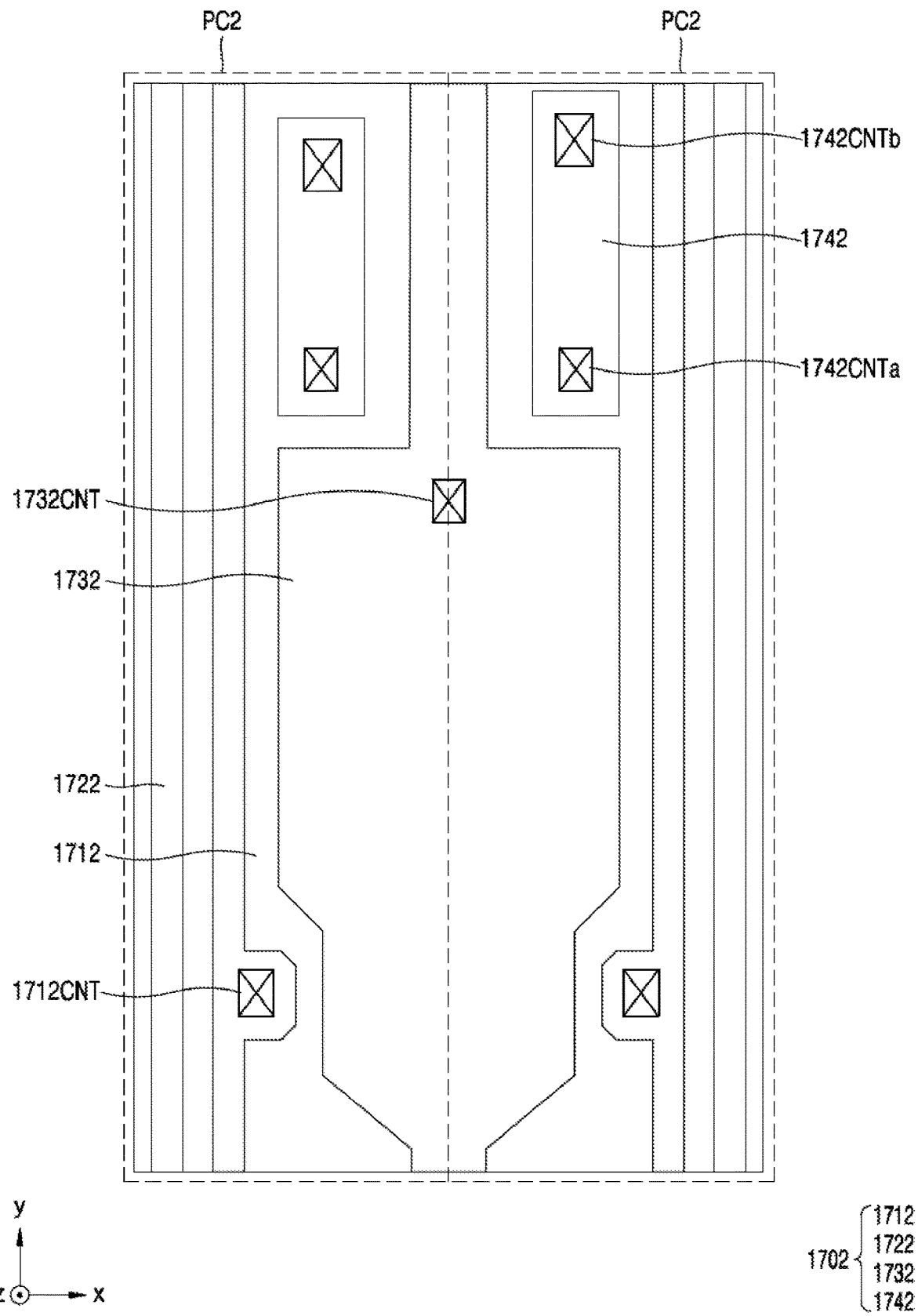

Referring to FIG. 19, the second pixel circuit PC2 may include a fifteenth connection pattern 1742 and may be connected to a twenty-fifth conductive line 1712 and a twenty-sixth conductive line 1732 extending in a second direction (e.g., a ±y direction). A twenty-seventh conductive line 1722 may pass through or extend across the second pixel circuit PC2. The twenty-fifth conductive line 1712 may correspond to the second data line DLb of FIG. 5, and the twenty-sixth conductive line 1732 may correspond to the power line PL of FIG. 5. The twenty-fourth conductive line 1662 and the twenty-sixth conductive line 1732 may form a power line having a mesh structure.

A tenth conductive layer 1702 including the fifteenth connection pattern 1742, the twenty-fifth conductive line 1712, the twenty-sixth conductive line 1732, and the twenty-seventh conductive line 1722 may be arranged on the ninth conductive layer 1602. An insulating layer may be arranged between the ninth conductive layer 1602 and the tenth conductive layer 1702. The tenth conductive layer 1702 may be arranged on or at the same layer as the fifth conductive layer 1701 described above with reference to FIG. 12. The tenth conductive layer 1702 may include molybdenum (Mo), aluminum (Al), copper (Cu), titanium (Ti), etc., and may include a single layer or multiple layers. For example, the tenth conductive layer 1702 may include Ti/Al/Ti layers.

The fifteenth connection pattern 1742 may be connected to the thirteenth connection pattern 1672 of the ninth conductive layer 1602 through a 20-1st contact hole 1742CNTa and to the anode of the second display element DE2 (see FIG. 5) through a 20-2nd contact hole 1742CNTb. The twenty-fifth conductive line 1712 may be connected to the ninth connection pattern 1622 of the ninth conductive layer 1602 through a twenty-first contact hole 1712CNT. The twenty-sixth conductive line 1732 may be connected to the twenty-fourth conductive line 1662 of the ninth conductive layer 1602 through a twenty-second contact hole 1732CNT.

Figure 20:
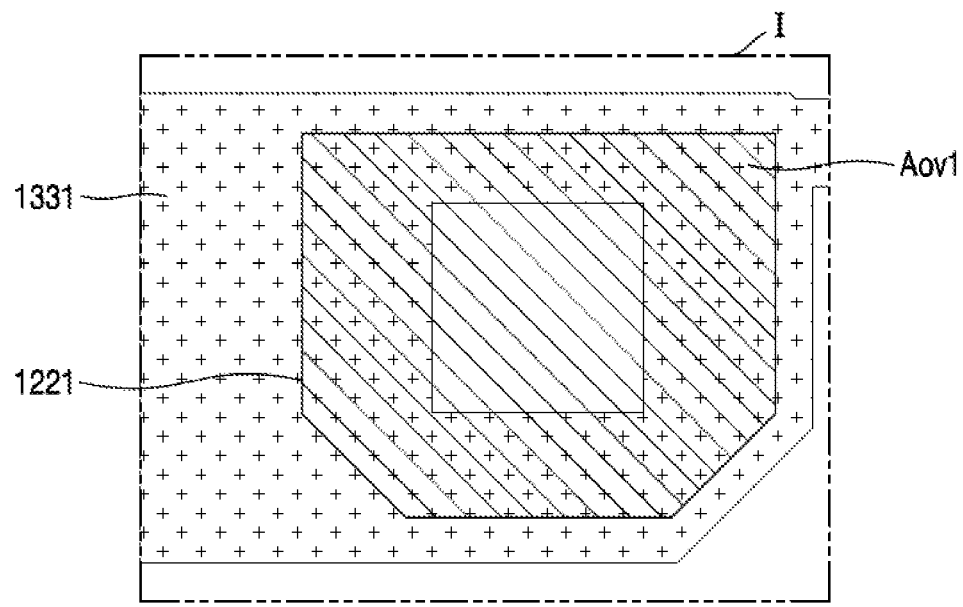
FIG. 20 is an enlarged example plan view of a region I of FIG. 7.

FIG. 20 is an enlarged example plan view of a region I of FIG. 7. FIG. 20 illustrates some components of FIG. 7.

Referring to FIG. 20, the first gate pattern 1221 and the first electrode 1331 may overlap each other. The first gate pattern 1221 and the first electrode 1331 may overlap each other with the second insulating layer 113 described above with reference to FIG. 13 therebetween and may form a storage capacitance. In this case, the second insulating layer 113 may function as a dielectric layer of the storage capacitor.

The first gate pattern 1221 may correspond to the first lower storage electrode LEst1 of the first storage capacitor Cst1 of FIG. 4, and the first electrode 1331 may correspond to the first upper storage electrode UEst1 of the first storage capacitor Cst1 of FIG. 4, and thus, it may be understood that the first lower storage electrode LEst1 and the first upper storage electrode UEst1 may overlap each other with the second insulating layer 113 therebetween and may form the first storage capacitance Cap,st1 of FIG. 4.

Figure 21:
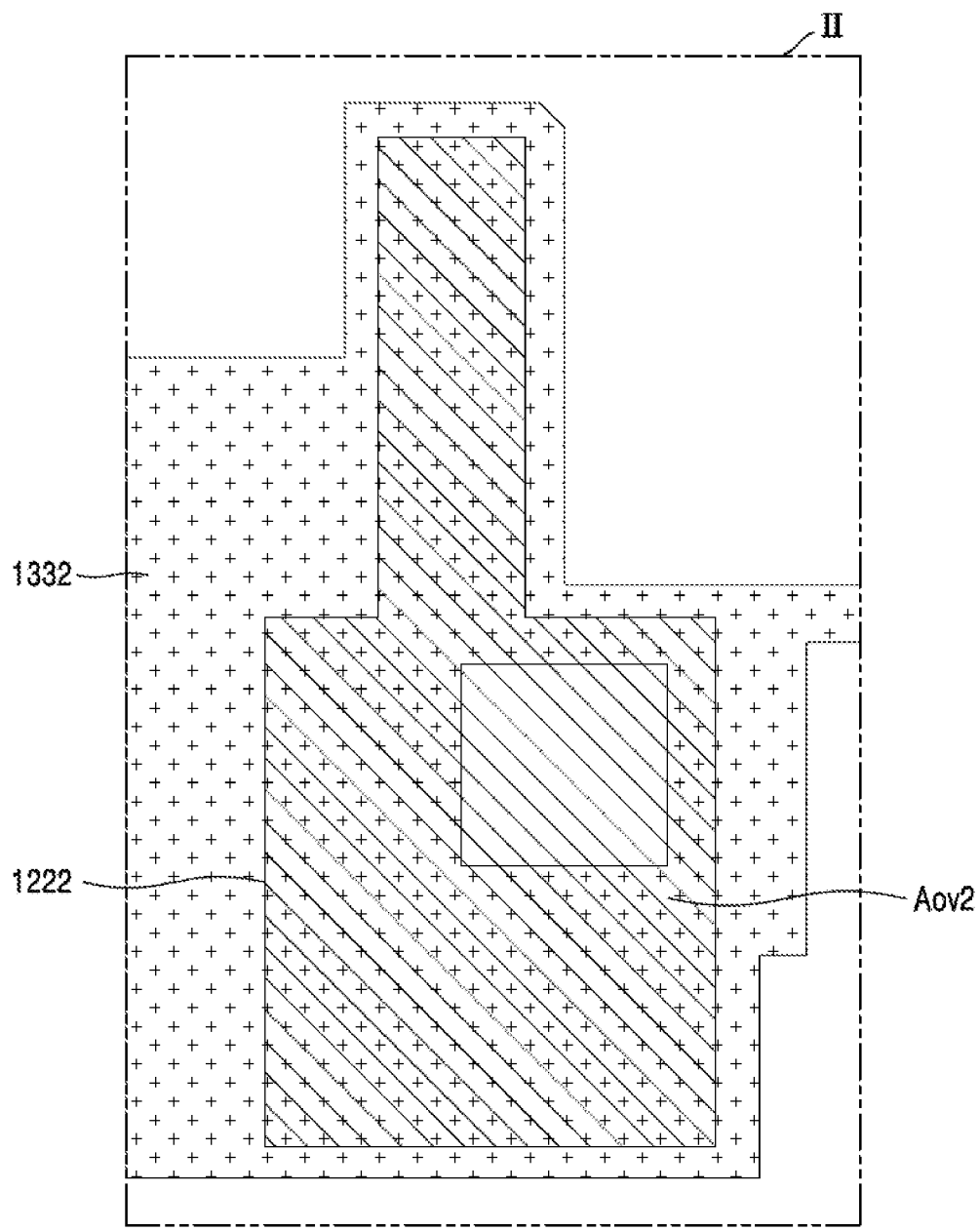
FIG. 21 is an enlarged example plan view of a region II of FIG. 14.

FIG. 21 is an enlarged example plan view of a region II of FIG. 14. FIG. 21 illustrates some components of FIG. 14.

Referring to FIG. 21, the second gate pattern 1222 and the second electrode 1332 may overlap each other. The second gate pattern 1222 and the second electrode 1332 may overlap each other with the second insulating layer 113 described above with reference to FIG. 13 therebetween and may form a storage capacitance. In this case, the second insulating layer 113 may function as a dielectric layer of the storage capacitor.

The second gate pattern 1222 may correspond to the second lower storage electrode LEst2 of the second storage capacitor Cst2 of FIG. 5, and the second electrode 1332 may correspond to the second upper storage electrode UEst2 of the second storage capacitor Cst2 of FIG. 5, and thus, it may be understood that the second lower storage electrode LEst2 and the second upper storage electrode UEst2 may overlap each other with the second insulating layer 113 therebetween and may form the second storage capacitance Cap,st2 of FIG. 5.

Referring to FIGS. 20 and 21 together, a second overlapping area Aov2 of the second gate pattern 1222 and the second electrode 1332 may be about twice to about four times a first overlapping area Aov1 of the first gate pattern 1221 and the first electrode 1331. In other words, the second overlapping area Aov2 of the second lower storage electrode LEst2 and the second upper storage electrode UEst2 may be about twice to about four times the first overlapping area Aov1 of the first lower storage electrode LEst1 and the first upper storage electrode UEst1.

When the second overlapping area Aov2 is less than about twice the first overlapping area Aov1, the brightness distribution of the second display elements DE2 respectively configured to be driven by the second pixel circuits PC2 including the second storage capacitors Cst2, may increase. For example, the brightness distribution of the display elements arranged in the component area overlapping the optical device may increase. Due to the brightness distribution, the brightness non-uniformity of the display elements arranged in the component area may occur or increase. Also, when the second overlapping area Aov2 is greater than about four times the first overlapping area Aov1, it may be difficult for the display elements arranged in the component area overlapping the optical device to represent the brightness gradation.

However, when the second overlapping area Aov2 is about twice to about four times the first overlapping area Aov1 according to one or more embodiments, the brightness distribution of the second display elements DE2 arranged in the second area AR2 overlapping the component 50 (e.g., the optical device) described above with respect to FIG. 2 may decrease. When the brightness distribution decreases, the brightness non-uniformity of the second display elements DE2 may be reduced (e.g., the brightness uniformity of the second display elements DE2 may improve).

The descriptions are given based on the first pixel circuit PC1 of FIG. 4 and the second pixel circuit PC2 of FIG. 5. However, the same aspects may be applied to the third pixel circuit PC3 of FIG. 6. For example, an overlapping area of the third lower storage electrode LEst3 and the third upper storage electrode UEst3 of FIG. 6 may be about twice to about four times the first overlapping area Aov1 of the first lower storage electrode LEst1 and the first upper storage electrode UEst1.

Figure 22:
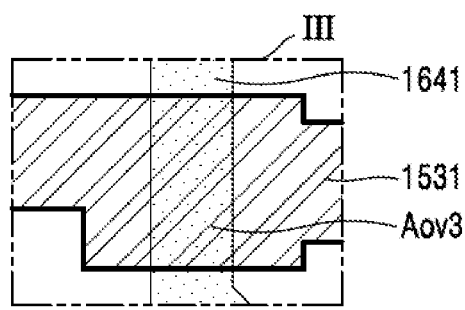
FIG. 22 is an enlarged example plan view of a region III of FIG. 7.

FIG. 22 is an enlarged example plan view of a region III of FIG. 7. FIG. 22 illustrates some components of FIG. 7.

Referring to FIG. 22, the eighth conductive line 1531 and the third connection pattern 1641 may overlap each other. The eighth conductive line 1531 and the third connection pattern 1641 may overlap each other with the fifth insulating layer 119 described above with reference to FIG. 13 therebetween and may form a boosting capacitance. In this case, the fifth insulating layer 119 may function as a dielectric layer of the boosting capacitor.

The eighth conductive line 1531 may correspond to the first lower boosting electrode LEbst1 of the first boosting capacitor Cbst1 of FIG. 4, and the third connection pattern 1641 may correspond to the first upper boosting electrode UEbst1 of the first boosting capacitor Cbst1 of FIG. 4, and thus, it may be understood that the first lower boosting electrode LEbst1 and the first upper boosting electrode UEbst1 may overlap each other with the fifth insulating layer 119 therebetween and may form the first boosting capacitance Cap,bst1 of FIG. 4.

Figure 23:
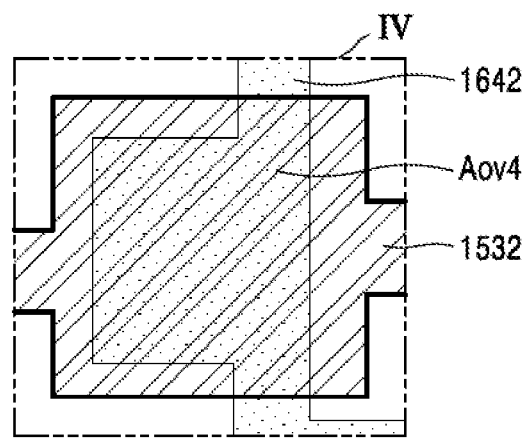
FIG. 23 is an enlarged example plan view of a region IV of FIG. 14.

FIG. 23 is an enlarged example plan view of a region IV of FIG. 14. FIG. 23 illustrates some components of FIG. 14.

Referring to FIG. 23, the twenty-third conductive line 1532 and the eleventh connection pattern 1642 may overlap each other. The twenty-third conductive line 1532 and the eleventh connection pattern 1642 may overlap each other with the fifth insulating layer 119 described above with reference to FIG. 13 therebetween and may form a boosting capacitance. In this case, the fifth insulating layer 119 may function as a dielectric layer of the boosting capacitor.

The twenty-third conductive line 1532 may correspond to the second lower boosting electrode LEbst2 of the second boosting capacitor Cbst2 of FIG. 5, and the eleventh connection pattern 1642 may correspond to the second upper boosting electrode UEbst2 of the second boosting capacitor Cbst2 of FIG. 5, and thus, it may be understood that the second lower boosting electrode LEbst2 and the second upper boosting electrode UEbst2 may overlap each other with the fifth insulating layer 119 therebetween and may form the second boosting capacitance Cap,bst2 of FIG. 5.

Referring to FIGS. 22 and 23 together, a fourth overlapping area Aov4 of the twenty-third conductive line 1532 and the eleventh connection pattern 1642 may be about five times to about eight times a third overlapping area Aov3 of the eighth conductive line 1531 and the third connection pattern 1641. In other words, the fourth overlapping area Aov4 of the second lower boosting electrode LEbst2 and the second upper boosting electrode UEbst2 may be about five times to about eight times the third overlapping area Aov3 of the first lower boosting electrode LEbst1 and the first upper boosting electrode UEbst1.

When the fourth overlapping area Aov4 is less than about five times the third overlapping area Aov3, it may be difficult for the display elements arranged in the component area overlapping the optical device to represent the brightness gradation. Also, when the fourth overlapping area Aov4 is greater than about eight times the third overlapping area Aov3, the brightness distribution of the second display elements DE2 respectively configured to be driven by the second pixel circuits PC2 including the second boosting capacitors Cbst2, may increase. For example, the brightness distribution of the display elements arranged in the component area overlapping the optical device may increase. Due to the brightness distribution, the brightness non-uniformity of the display elements arranged in the component area may occur or increase.

However, when the fourth overlapping area Aov4 is about five times to about eight times the third overlapping area Aov3 according to one or more embodiments, the brightness distribution of the second display elements DE2 arranged in the second area AR2 overlapping the component 50 (e.g., the optical device) described above with respect to FIG. 2 may decrease. When the brightness distribution decreases, the brightness non-uniformity of the second display elements DE2 may be reduced (e.g., the brightness uniformity of the second display elements DE2 may improve).

The descriptions are given based on the first pixel circuit PC1 of FIG. 4 and the second pixel circuit PC2 of FIG. 5. However, the same aspects may be applied to the third pixel circuit PC3 of FIG. 6. For example, an overlapping area of the fifth lower boosting electrode LEbst5 and the fifth upper boosting electrode UEbst5 of FIG. 6 may be about five times to about eight times the third overlapping area Aov3 of the first lower boosting electrode LEbst1 and the first upper boosting electrode UEbst1.

Figure 24:
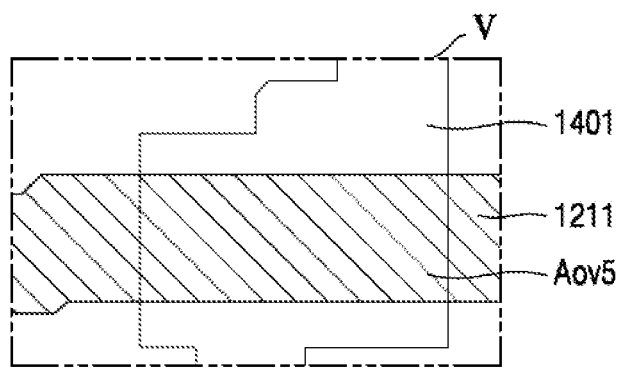
FIG. 24 is an enlarged example plan view of a region V of FIG. 7.

FIG. 24 is an enlarged example plan view of a region V of FIG. 7. FIG. 24 illustrates some components of FIG. 7.

Referring to FIG. 24, the first conductive line 1211 and the third semiconductor layer 1401 may overlap each other. The first conductive line 1211 and the third semiconductor layer 1401 may overlap each other with the second insulating layer 113 and the third insulating layer 115 described above with reference to FIG. 13 therebetween and may form a boosting capacitance. In this case, the second and third insulating layers 113 and 115 may function as dielectric layers of the boosting capacitor.

The first conductive line 1211 may correspond to the third lower boosting electrode LEbst3 of the third boosting capacitor Cbst3 of FIG. 4, and the third semiconductor layer 1401 may correspond to the third upper boosting electrode UEbst3 of the third boosting capacitor Cbst3 of FIG. 4, and thus, it may be understood that the third lower boosting electrode LEbst3 and the third upper boosting electrode UEbst3 may overlap each other with the second and third insulating layers 113 and 115 therebetween and may form the third boosting capacitance Cap,bst3 of FIG. 4.

Figure 25:
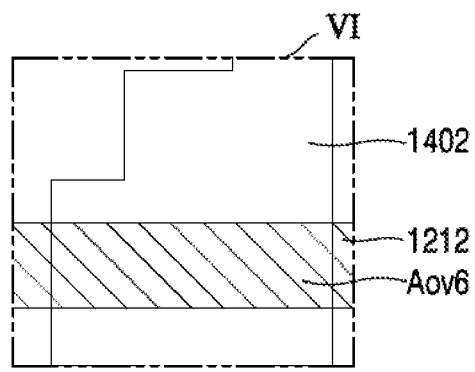
FIG. 25 is an enlarged example plan view of a region VI of FIG. 14.

FIG. 25 is an enlarged example plan view of a region VI of FIG. 14. FIG. 25 illustrates some components of FIG. 14.

Referring to FIG. 25, the fifteenth conductive line 1212 and the fourth semiconductor layer 1402 may overlap each other. The fifteenth conductive line 1212 and the fourth semiconductor layer 1402 may overlap each other with the second insulating layer 113 and the third insulating layer 115 described above with reference to FIG. 13 therebetween and may form a boosting capacitance. In this case, the second and third insulating layers 113 and 115 may function as dielectric layers of the boosting capacitor.

The fifteenth conductive line 1212 may correspond to the fourth lower boosting electrode LEbst4 of the fourth boosting capacitor Cbst4 of FIG. 5, and the fourth semiconductor layer 1402 may correspond to the fourth upper boosting electrode UEbst4 of the fourth boosting capacitor Cbst4 of FIG. 5, and thus, it may be understood that the fourth lower boosting electrode LEbst4 and the fourth upper boosting electrode UEbst4 may overlap each other with the second and third insulating layers 113 and 115 therebetween and may form the fourth boosting capacitance Cap,bst4 of FIG. 5.

Referring to FIGS. 24 and 25 together, a sixth overlapping area Aov6 of the fifteenth conductive line 1212 and the fourth semiconductor layer 1402 may be about six times to about nine times a fifth overlapping area Aov5 of the first conductive line 1211 and the third semiconductor layer 1401. In other words, the sixth overlapping area Aov6 of the fourth lower boosting electrode LEbst4 and the fourth upper boosting electrode UEbst4 may be about six times to about nine times the fifth overlapping area Aov5 of the third lower boosting electrode LEbst3 and the third upper boosting electrode UEbst3.

When the sixth overlapping area Aov6 is less than about six times the fifth overlapping area Aov5, it may be difficult for the display elements arranged in the component area overlapping the optical device to represent the brightness gradation. Also, when the sixth overlapping area Aov6 is greater than about nine times the fifth overlapping area Aov5, the brightness distribution of the second display elements DE2 respectively configured to be driven by the second pixel circuits PC2 including the fourth boosting capacitors Cbst4, may increase. For example, the brightness distribution of the display elements arranged in the component area overlapping the optical device may increase. Due to the brightness distribution, the brightness non-uniformity of the display elements arranged in the component area may occur or increase.

However, when the sixth overlapping area Aov6 is about six times to about nine times the fifth overlapping area Aov5 according to one or more embodiments, the brightness distribution of the second display elements DE2 arranged in the second area AR2 overlapping the component 50 (e.g., the optical device) described above with respect to FIG. 2 may decrease. When the brightness distribution decreases, the brightness non-uniformity of the second display elements DE2 may be reduced (e.g., the brightness uniformity of the second display elements DE2 may improve).

The descriptions are given based on the first pixel circuit PC1 of FIG. 4 and the second pixel circuit PC2 of FIG. 5. However, the same aspects may be applied to the third pixel circuit PC3 of FIG. 6. For example, an overlapping area of the sixth lower boosting electrode LEbst5 and the sixth upper boosting electrode UEbst6 of FIG. 6 may be about six times to about nine times the third overlapping area Aov3 of the first lower boosting electrode LEbst1 and the first upper boosting electrode UEbst1.

Figure 26:
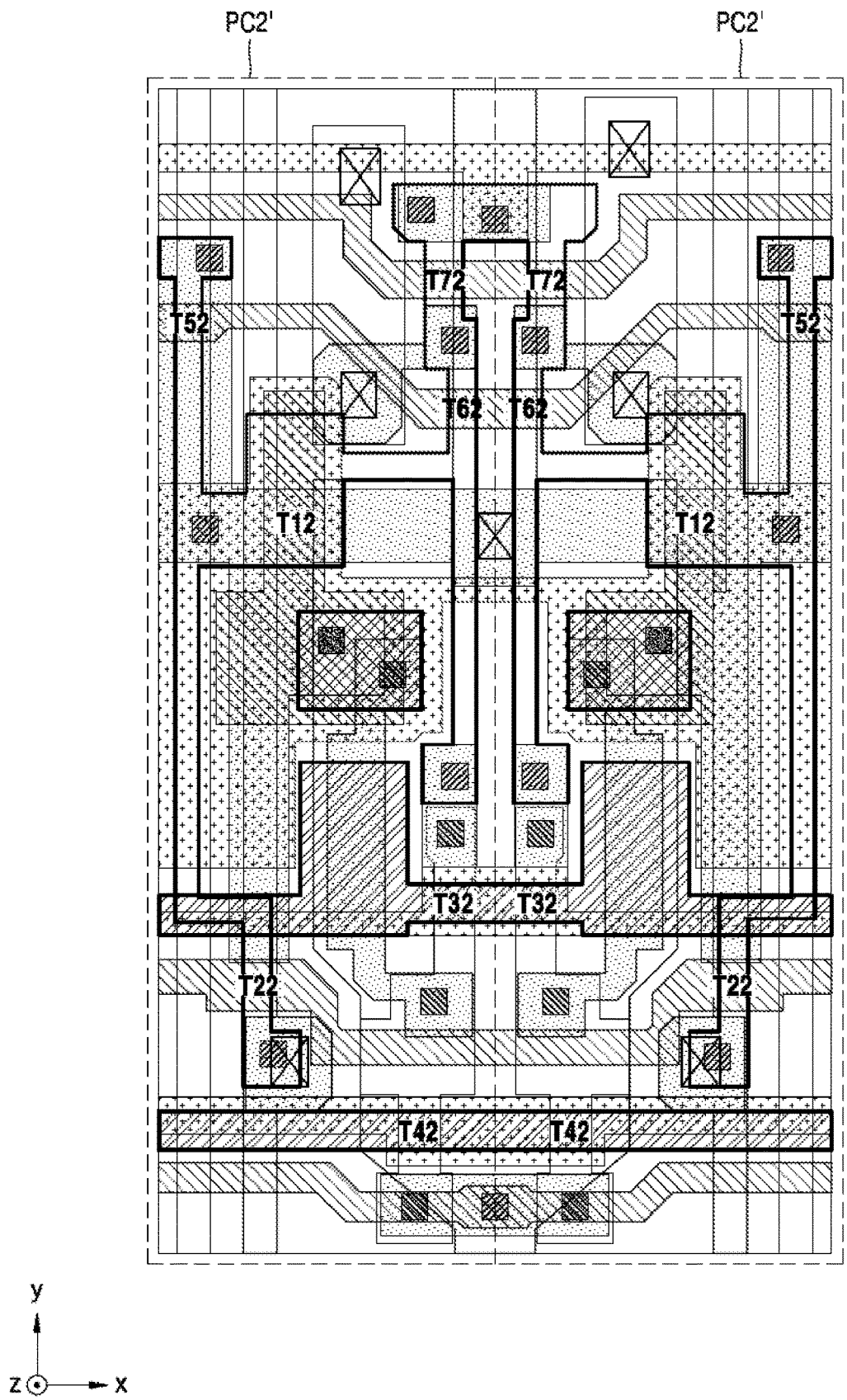
FIG. 26 is a schematic plan view of a second pixel circuit according to another embodiment.

FIG. 26 is a schematic plan view of a second pixel circuit PC2' according to another embodiment, and FIGS. 27 through 31 are example plan views of one or more layers of FIG. 26. FIGS. 26 through 31 illustrate the second pixel circuit PC2', which is an example of the second pixel circuit PC2 of FIG. 5, according to another embodiment. However, the aspects of FIGS. 26 through 31 may be likewise applied to the third pixel circuit PC3 of FIG. 6.

First, referring to FIG. 26, a display apparatus may include the second pixel circuits PC2' arranged in the third area AR3 (see FIG. 2) and adjacent to each other. According to one or more embodiments, as illustrated in FIG. 26, the adjacent second pixel circuits PC2' may be symmetrical with each other with respect to a virtual line (e.g., a virtual line extending in the ±y direction). According to another embodiment, the adjacent second pixel circuits PC2' may not be symmetrical with each other but may have a structure in which the same pixel circuit is continually repeated.

Hereinafter, for convenience of explanation, one or more semiconductor layers, gate patterns, electrodes, etc. are described based on one second pixel circuit PC2'. However, the semiconductor layers, gate patterns, electrodes, etc. may also be symmetrically provided on the adjacent second pixel circuit PC2'.

Figure 27:
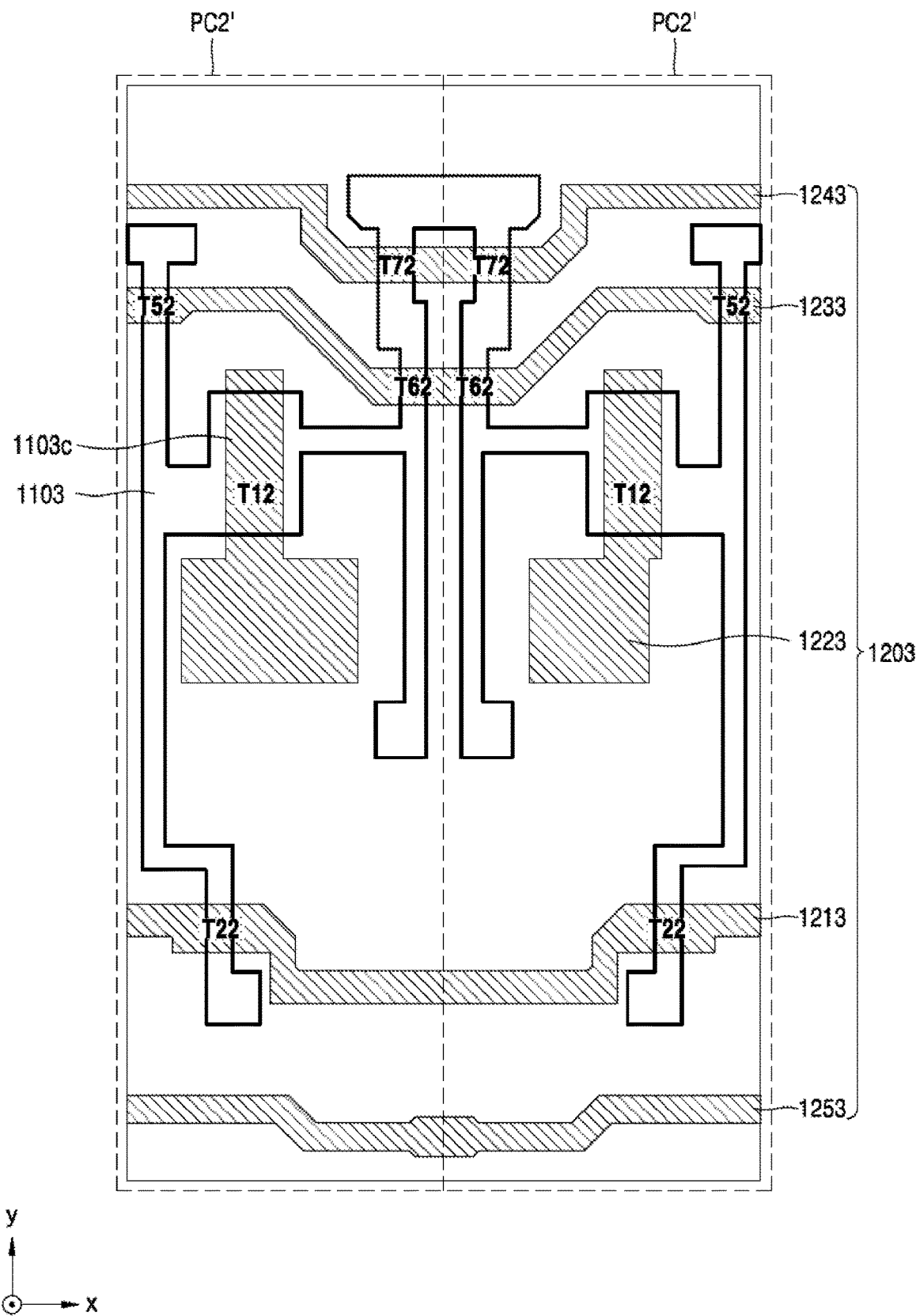
FIGS. 27 through 31 are example plan views of one or more layers of FIG. 26.

Referring to FIG. 27, the second pixel circuit PC2' may include a fifth semiconductor layer 1103 and a third gate pattern 1223 and may be connected to a twenty-eighth conductive line 1213, a twenty-ninth conductive line 1233, a thirtieth conductive line 1243, and a thirty-first conductive line 1253 extending in a first direction (e.g., a ±x direction). The twenty-eighth conductive line 1213 may correspond to the first scan line GWLb of FIG. 5, the twenty-ninth conductive line 1233 may correspond to the emission control line EMLb of FIG. 5, the thirtieth conductive line 1243 may correspond to the fourth scan line GBLb of FIG. 5, and the thirty-first conductive line 1253 may correspond to the first voltage line VL1 of FIG. 5.

The fifth semiconductor layer 1103 may include a silicon semiconductor. For example, the fifth semiconductor layer 1103 may include amorphous silicon or polysilicon. In more detail, the fifth semiconductor layer 1103 may include polysilicon crystallized at a low temperature. In one or more embodiments, ions may be injected onto at least a portion of the fifth semiconductor layer 1103.

The fifth semiconductor layer 1103 may include a third channel area 1103c overlapping the third gate pattern 1223. The third channel area 1103c may have a square shape as illustrated in FIG. 27.

When the first channel area 1101c illustrated in FIG. 8 is compared with the third channel area 1103c illustrated in FIG. 27, the third channel area 1103c may have a greater channel width and a shorter channel length than the first channel area 1101c.

An eleventh conductive layer 1203 including the third gate pattern 1223, the twenty-eighth conductive line 1213, the twenty-ninth conductive line 1233, the thirtieth conductive line 1243, and the thirty-first conductive line 1253 may be arranged on the fifth semiconductor layer 1103. An insulating layer may be arranged between the fifth semiconductor layer 1103 and the eleventh conductive layer 1203. The fifth semiconductor layer 1103 and the eleventh conductive layer 1203 may be arranged on or at the same layers as the first semiconductor layer 1101 and the first conductive layer 1201, respectively, that are described above with reference to FIG. 8. The eleventh conductive layer 1203 may include molybdenum (Mo), aluminum (Al), copper (Cu), titanium (Ti), etc., and may include a single layer or multiple layers. For example, the eleventh conductive layer 1203 may include a single Mo layer.

A portion of the twenty-eighth conductive line 1213, the portion overlapping the fifth semiconductor layer 1103, may function as the gate of the second scan transistor T22. Portions of the twenty-ninth conductive line 1233, the portions overlapping the fifth semiconductor layer 1103, may function as the gate of the second operation control transistor T52 and the gate of the second emission control transistor T62. A portion of the thirtieth conductive line 1243, the portion overlapping the fifth semiconductor layer 1103, may function as the gate of the second anode initialization transistor T72. The third gate pattern 1223 may correspond to the second lower storage electrode LEst2 of the second storage capacitor Cst2 of FIG. 5 and may function as the gate of the second driving transistor T12. Also, a portion of the twenty-eighth conductive line 1213, the portion overlapping a sixth semiconductor layer 1403 illustrated in FIG. 29 to be described below may correspond to the fourth lower boosting electrode LEbst4 of the fourth boosting capacitor Cbst4 of FIG. 5.

According to one or more embodiments, an area of the third gate pattern 1223 may vary according to a wavelength range of the light emitted from the second display element DE2 (see FIG. 2) configured to be driven by the second pixel circuit PC2'. For example, an area of the third gate pattern 1223 included in the second pixel circuit PC2' configured to drive the second display element DE2 emitting blue light may be greater than an area of the third gate pattern 1223 included in the second pixel circuit PC2' configured to drive the second display element DE2 emitting red light. The area of the third gate pattern 1223 included in the second pixel circuit PC2' configured to drive the second display element DE2 emitting red light may be greater than an area of the third gate pattern 1223 included in the second pixel circuit PC2' configured to drive the second display element DE2 emitting green light.

According to one or more embodiments, the third gate pattern 1223 may extend from the third channel area 1103c in a −y direction. For example, as illustrated in FIG. 27, the third gate pattern 1223 may extend from the third channel area 1103c to a 26-1st contact hole 1643CNTa illustrated in FIG. 18 described below.

Figure 28:
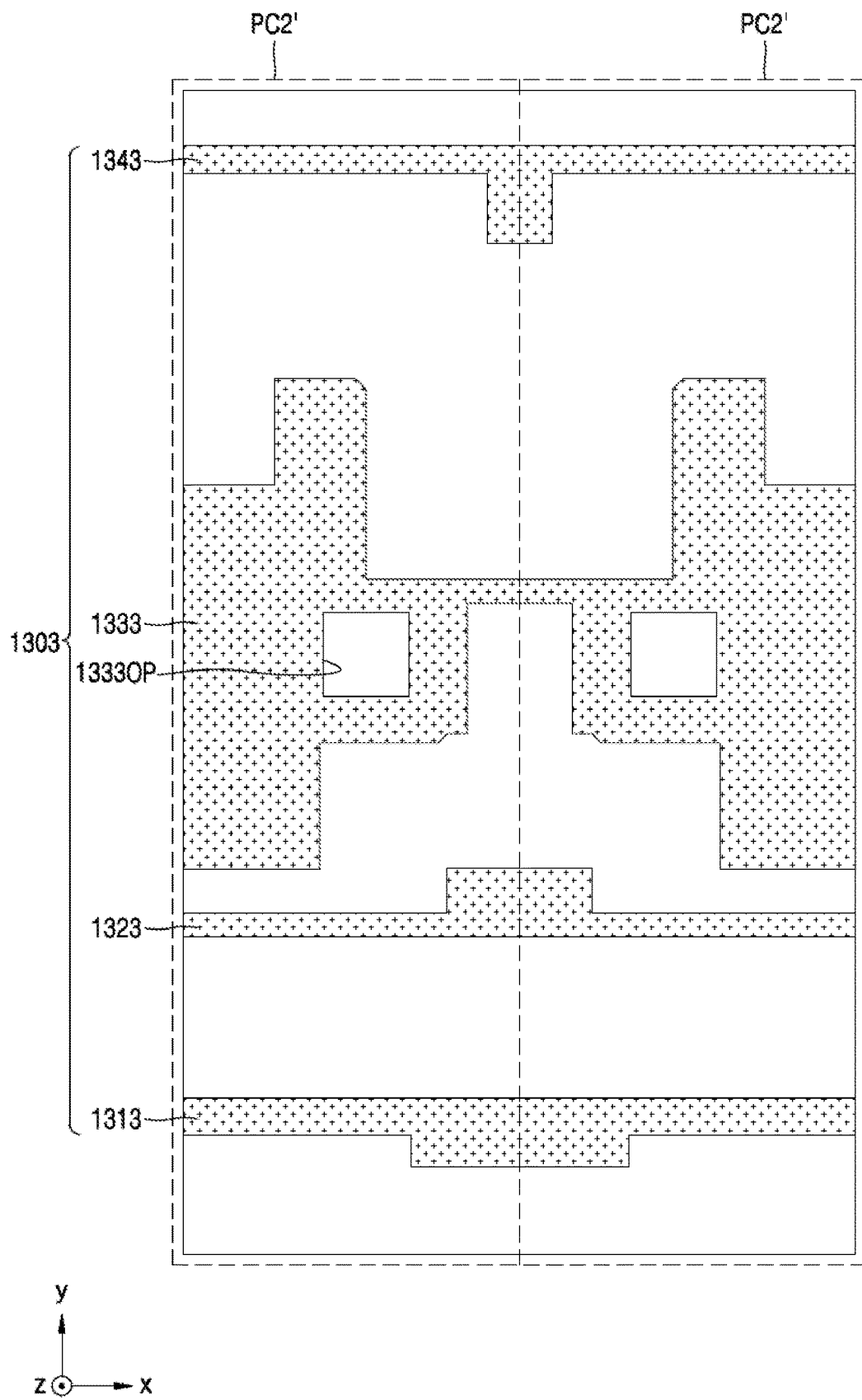

Referring to FIG. 28, the second pixel circuit PC2' may include a third electrode 1333 and may be connected to a thirty-second conductive line 1313, a thirty-third conductive line 1323, and a thirty-fourth conductive line 1343 extending in a first direction (e.g., a ±x direction). The third electrode 1333 may correspond to the second upper storage electrode UEst2 of the second storage capacitor Cst2 of FIG. 5, the thirty-second conductive line 1313 may correspond to the third scan line GILb of FIG. 5, the thirty-third conductive line 1323 may correspond to the second scan line GCLb of FIG. 5, and the thirty-fourth conductive line 1343 may correspond to the second voltage line VL2 of FIG. 5.

A twelfth conductive layer 1303 including the third electrode 1333, the thirty-second conductive line 1313, the thirty-third conductive line 1323, and the thirty-fourth conductive line 1343 may be arranged on the eleventh conductive layer 1203. An insulating layer may be arranged between the eleventh conductive layer 1203 and the twelfth conductive layer 1303. The twelfth conductive layer 1303 may be arranged on or at the same layer as the second conductive layer 1301 described above with reference to FIG. 9. The third electrode 1333 may have an opening 1333OP exposing a portion of the insulating layer. The third electrode 1333 may at least partially overlap the third gate pattern 1223 described above with the insulating layer therebetween. The third electrode 1333 and the third gate pattern 1223 may form the second storage capacitor Cst2 of FIG. 5.

Figure 29:
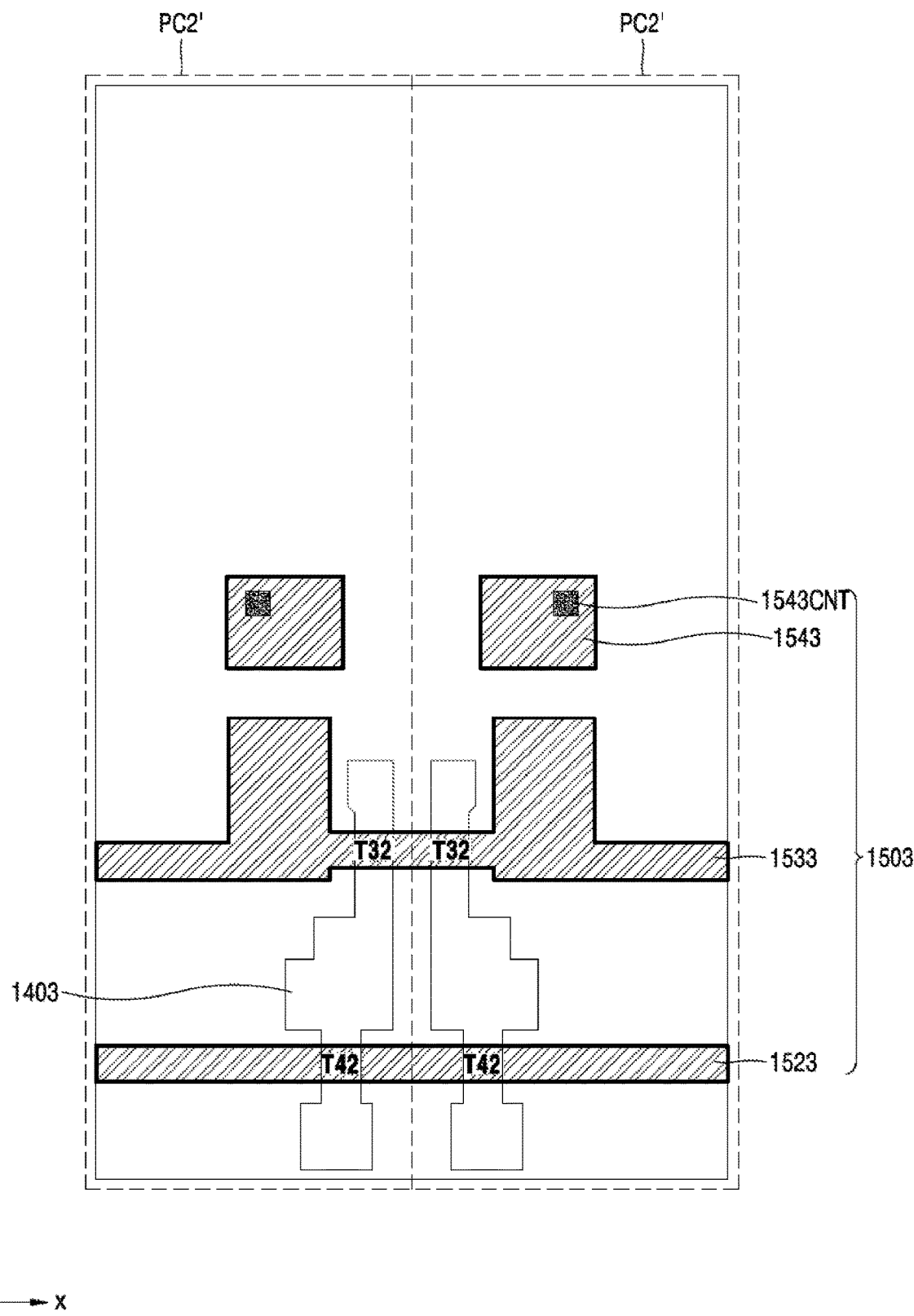

Referring to FIG. 29, the second pixel circuit PC2' may include the sixth semiconductor layer 1403 and a sixteenth connection pattern 1543 and may be connected to a thirty-fifth conductive line 1523 and a thirty-sixth conductive line 1533 extending in a first direction (e.g., a ±x direction). The thirty-fifth conductive line 1523 may correspond to the third scan line GILb of FIG. 5, and the thirty-sixth conductive line 1533 may correspond to the second scan line GCLb of FIG. 5. The thirty-second conductive line 1313 and the thirty-fifth conductive line 1523 may form a dual scan line. The thirty-third conductive line 1323 and the thirty-sixth conductive line 1533 may form a dual scan line. Also, a portion of the thirty-sixth conductive line 1533, the portion overlapping a nineteenth connection pattern 1643 illustrated in FIG. 30 to be described below may correspond to the second lower boosting electrode LEbst2 of the second boosting capacitor Cbst2 of FIG. 5.

The sixth semiconductor layer 1403 may be arranged on the twelfth conductive layer 1303. An insulating layer may be arranged between the twelfth conductive layer 1303 and the sixth semiconductor layer 1403. The sixth semiconductor layer 1403 may be arranged on or at the same layer as the third semiconductor layer 1401 described above with reference to FIG. 10. The sixth semiconductor layer 1403 may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, the sixth semiconductor layer 1403 may include an ITZO semiconductor layer, an IGZO semiconductor layer, etc.

A thirteenth conductive layer 1503 including the sixteenth connection pattern 1543, the thirty-fifth conductive line 1523, and the thirty-sixth conductive line 1533 may be arranged on the sixth semiconductor layer 1403. An insulating layer may be arranged between the sixth semiconductor layer 1403 and the thirteenth conductive layer 1503. The thirteenth conductive layer 1503 may be arranged on or at the same layer as the third conductive layer 1501 described above with reference to FIG. 10. The thirteenth conductive layer 1503 may include molybdenum (Mo), aluminum (Al), copper (Cu), titanium (Ti), etc., and may include a single layer or multiple layers. For example, the thirteenth conductive layer 1503 may include Mo/Ti layers.

A portion of the thirty-fifth conductive line 1523, the portion overlapping the sixth semiconductor layer 1403, may function as the gate of the second gate initialization transistor T42. A portion of the thirty-sixth conductive line 1533, the portion overlapping the sixth semiconductor layer 1403, may function as the gate of the second compensation transistor T32. Also, a portion of the sixth semiconductor layer 1403, the portion overlapping the twenty-eighth conductive line 1213 described above may correspond to the fourth upper boosting electrode UEbst4 of the fourth boosting capacitor Cbst4 of FIG. 5.

The sixteenth connection pattern 1543 may be connected to the third gate pattern 1223 of the eleventh conductive layer 1203 through a twenty-third contact hole 1543CNT. The twenty-third contact hole 1543CNT may penetrate the opening 1333OP of the third electrode 1333 of the twelfth conductive layer 1303.

Figure 30:
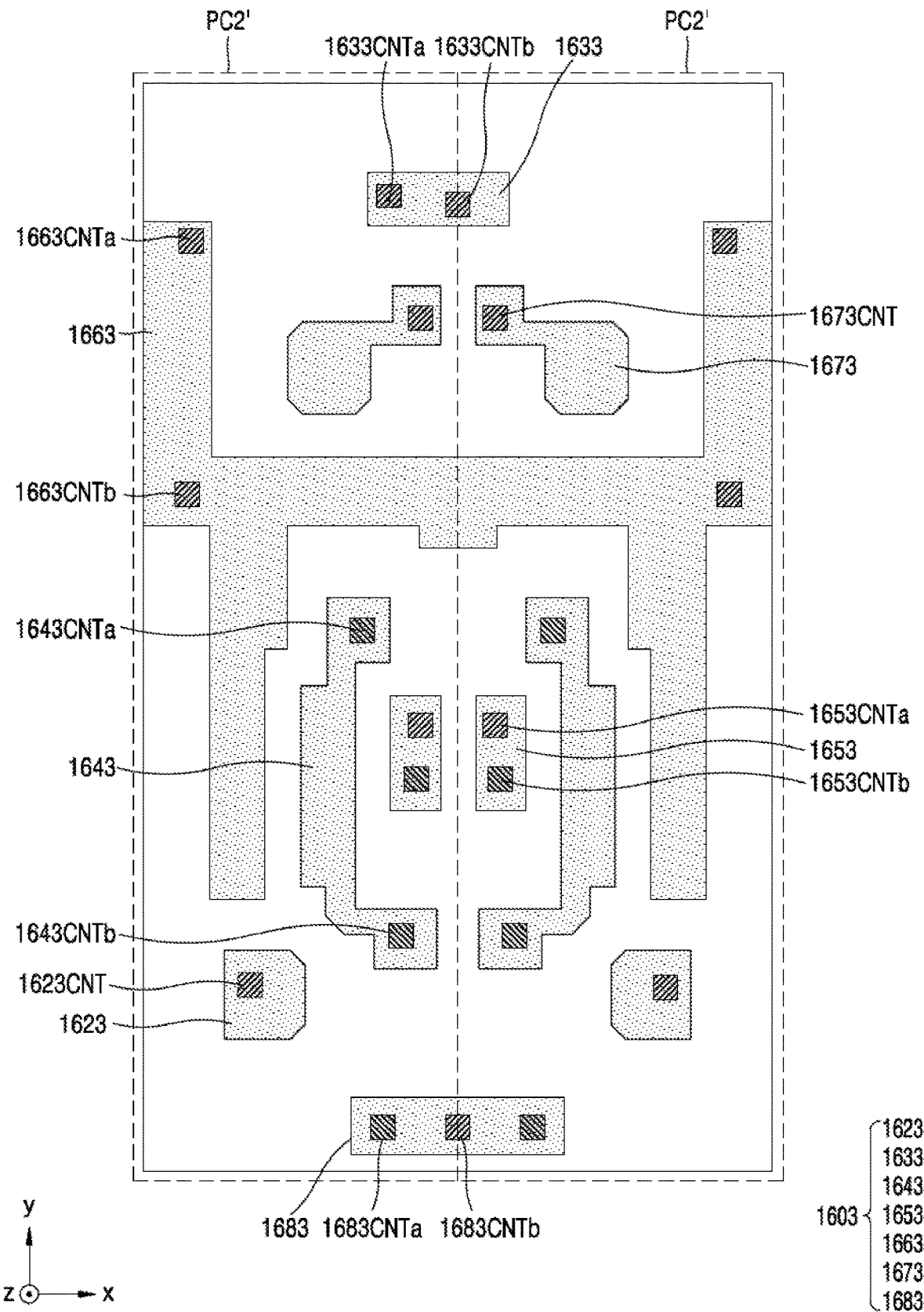

Referring to FIG. 30, the second pixel circuit PC2' may include a seventeenth connection pattern 1623, an eighteenth connection pattern 1633, the nineteenth connection pattern 1643, a twentieth connection pattern 1653, a twenty-first connection pattern 1673, and a twenty-second connection pattern 1683 and may be connected to a thirty-seventh conductive line 1663 extending in a first direction (e.g., a ±x direction). The thirty-seventh conductive line 1663 may correspond to the power line PL of FIG. 5.

FIG. 30 illustrates that the thirty-seventh conductive line 1663 may extend in the first direction (e.g., the ±x direction) and may be connected to the second pixel circuits PC2' arranged in the same row. However, according to another embodiment, the thirty-seventh conductive line 1663 may include a plurality of connection patterns. The plurality of connection patterns may be arranged in one second pixel circuit PC2' or in each of the adjacent second pixel circuits PC2'.

A fourteenth conductive layer 1603 including the seventeenth connection pattern 1623, the eighteenth connection pattern 1633, the nineteenth connection pattern 1643, the twentieth connection pattern 1653, the twenty-first connection pattern 1673, the twenty-second connection pattern 1683, and the thirty-seventh conductive line 1663 may be arranged on the thirteenth conductive layer 1503. An insulating layer may be arranged between the thirteenth conductive layer 1503 and the fourteenth conductive layer 1603. The fourteenth conductive layer 1603 may be arranged on or at the same layer as the fourth conductive layer 1601 described above with reference to FIG. 11. The fourteenth conductive layer 1603 may include molybdenum (Mo), aluminum (Al), copper (Cu), titanium (Ti), etc., and may include a single layer or multiple layers. For example, the fourteenth conductive layer 1603 may include Ti/Al/Ti layers.

The seventeenth connection pattern 1623 may be connected to the fifth semiconductor layer 1103 through a twenty-fourth contact hole 1623CNT. The eighteenth connection pattern 1633 may be connected to the fifth semiconductor layer 1103 through a 25-1st contact hole 1633CNTa and to the thirty-fourth conductive line 1343 through a 25-2nd contact hole 1633CNTb. The nineteenth connection pattern 1643 may be connected to the sixteenth connection pattern 1543 of the thirteenth conductive layer 1503 through a 26-1st contact hole 1643CNTa and to the sixth semiconductor layer 1403 through a 26-2nd contact hole 1643CNTb. The twentieth connection pattern 1653 may be connected to the fifth semiconductor layer 1103 through a 27-1st contact hole 1653CNTa and to the sixth semiconductor layer 1403 through a 27-2nd contact hole 1653CNTb. The twenty-first connection pattern 1673 may be connected to the fifth semiconductor layer 1103 through a twenty-eighth contact hole 1673CNT. The twenty-second connection pattern 1683 may be connected to the sixth semiconductor layer 1403 through a 29-1st contact hole 1683CNTa and to the thirty-first conductive line 1253 of the eleventh conductive layer 1203 through a 29-2nd contact hole 1683CNTb. The thirty-seventh conductive line 1663 may be connected to the fifth semiconductor layer 1103 through a 30-1st contact hole 1663CNTa and to the third electrode 1333 of the twelfth conductive layer 1303 through a 30-2nd contact hole 1663CNTb.

According to one or more embodiments, the thirty-seventh conductive line 1663 may extend from the 30-2nd contact hole 1663CNTb in a −y direction. For example, as illustrated in FIG. 30, the thirty-seventh conductive line 1663 may extend from the 30-2nd contact hole 1663CNTb approximately to the 26-2nd contact hole 1643CNTb. A portion of the thirty-seventh conductive line 1663 extending in the −y direction may shield a semiconductor layer and a peripheral metal layer (e.g., a data line) to reduce signal coupling due to a parasitic capacitance between the semiconductor layer and the peripheral metal layer. Also, a portion of the thirty-seventh conductive line 1663 extending in the −y direction may overlap the peripheral metal layer (e.g., the data line), and thus, the charge time of the pixel circuit may be sufficiently secured, and by securing the charge time of the pixel circuit, the brightness deviation of the display panel may be reduced.

Figure 31:
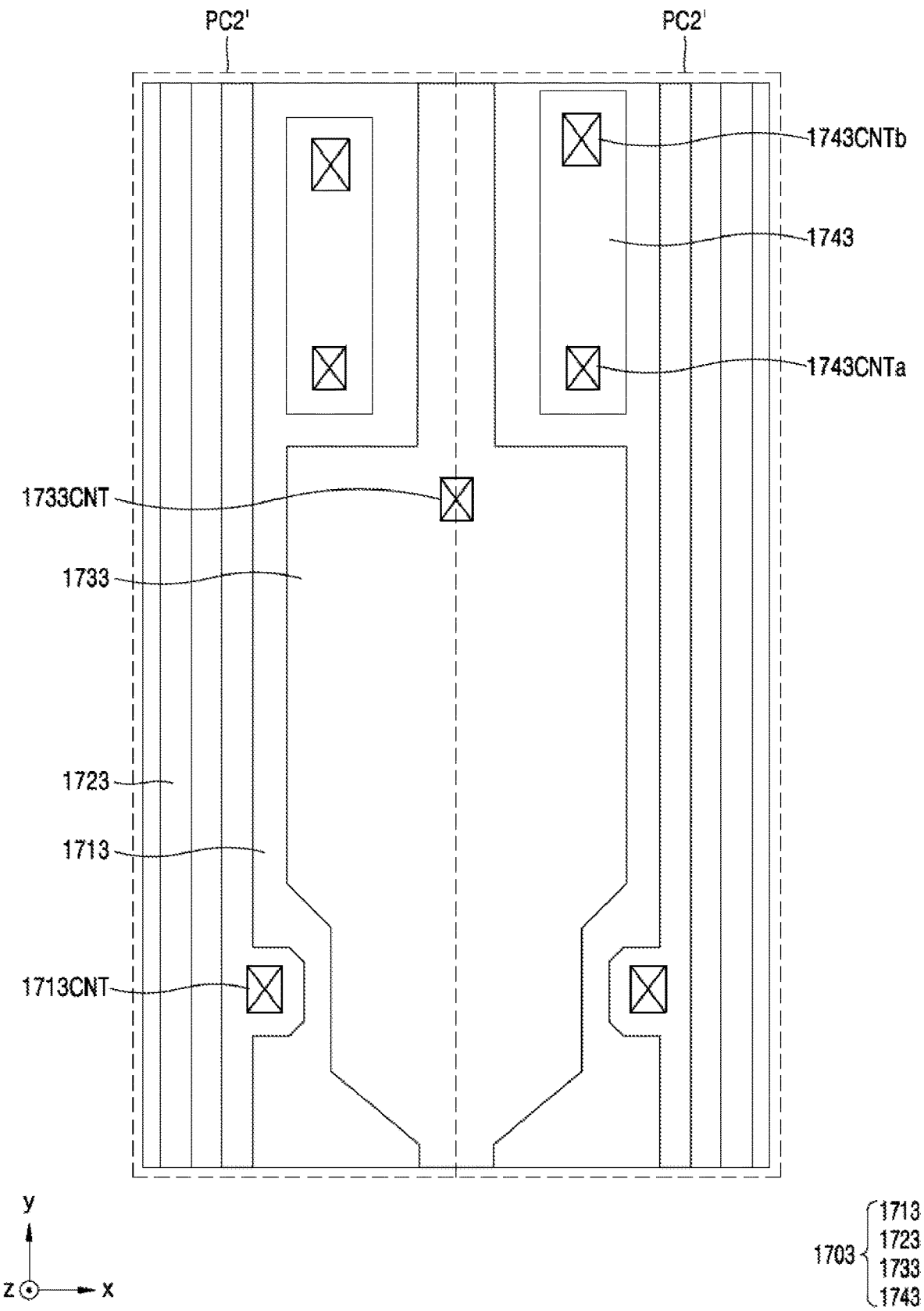

Referring to FIG. 31, the second pixel circuit PC2' may include a twenty-third connection pattern 1743 and may be connected to a thirty-eighth conductive line 1713 and a thirty-ninth conductive line 1733 extending in a second direction (e.g., a ±y direction). A fortieth conductive line 1723 may pass through or extend across the second pixel circuit PC2'. The thirty-eighth conductive line 1713 may correspond to the second data line DLb of FIG. 5, and the thirty-ninth conductive line 1733 may correspond to the power line PL of FIG. 5. The thirty-seventh conductive line 1663 and the thirty-ninth conductive line 1733 may form a power line having a mesh structure.

A fifteenth conductive layer 1703 including the twenty-third connection pattern 1743, the thirty-eighth conductive line 1713, the thirty-ninth conductive line 1733, and the fortieth conductive line 1723 may be arranged on the fourteenth conductive layer 1603. An insulating layer may be arranged between the fourteenth conductive layer 1603 and the fifteenth conductive layer 1703. The fifteenth conductive layer 1703 may be arranged on or at the same layer as the fifth conductive layer 1701 described above with reference to FIG. 12. The fifteenth conductive layer 1703 may include molybdenum (Mo), aluminum (Al), copper (Cu), titanium (Ti), etc., and may include a single layer or multiple layers. For example, the fifteenth conductive layer 1703 may include Ti/Al/Ti layers.

The twenty-third connection pattern 1743 may be connected to the twenty-first connection pattern 1673 of the fourteenth conductive layer 1603 through a 31-1st contact hole 1743CNTa and to the anode of the second display element DE2 (see FIG. 5) through a 31-2nd contact hole 1743CNTb. The thirty-eighth conductive line 1713 may be connected to the seventeenth connection pattern 1623 of the fourteenth conductive layer 1603 through a thirty-second contact hole 1713CNT. The thirty-ninth conductive line 1733 may be connected to the thirty-seventh conductive line 1663 of the fourteenth conductive layer 1603 through a thirty-third contact hole 1733CNT.

Figure 32:
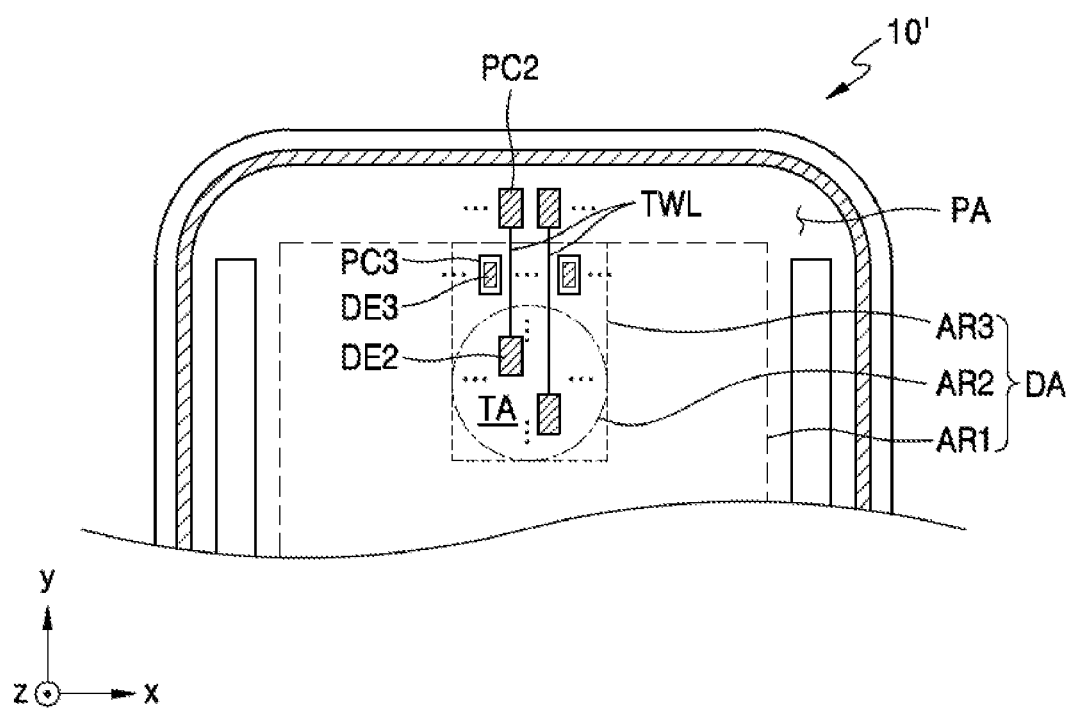
FIG. 32 is a schematic plan view of a display panel, which may be included in the display apparatus of FIG. 1, according to another embodiment.

FIG. 32 is a schematic plan view of a display panel 10', which may be included in the display apparatus 1 of FIG. 1, according to another embodiment. FIG. 32 is a modified embodiment of FIG. 3 and is different from FIG. 3 in terms of the third area and the second pixel circuit. Hereinafter, FIG. 3 is to be referred to for the same aspects, and different aspects are mainly described.

Referring to FIG. 32, unlike FIG. 3 described above, the third area AR3 of the display panel 10' may extend toward the peripheral area PA. At least a portion of the third area AR3 may be arranged between the second area AR2 and the peripheral area PA.

Also, unlike FIG. 3 described above, the second pixel circuits PC2 may be arranged in the peripheral area PA. According to another embodiment, some of the second pixel circuits PC2 may be arranged in the peripheral area PA, and the others may be arranged in the third area AR3.

The descriptions above are mainly given with respect to the display apparatus. However, the disclosure is not limited thereto. In other words, a method of manufacturing the display apparatus may also be included in the scope of the disclosure.

As described above, according to the one or more of the above embodiments, a display apparatus in which a display area is expanded may be realized. However, the scope of the disclosure is not limited to the effect as described above.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims and equivalents thereof.

What is claimed is:

1. A display apparatus comprising:
    a first pixel circuit;
    a first display element connected to the first pixel circuit;
    a second pixel circuit;
    a second display element connected to the second pixel circuit;
    a first area, in which the first pixel circuit and the first display element are arranged;
    a second area, in which the second display element is arranged, the second area being at least partially surrounded by the first area and having a light transmittance that is greater than a light transmittance of the first area; and
    a third area, which is between the first area and the second area, and in which the second pixel circuit is arranged,
    wherein the first pixel circuit comprises:
        a first driving transistor configured to control a first current flowing to the first display element; and
        a first storage capacitor comprising a first lower storage electrode connected to a gate of the first driving transistor and a first upper storage electrode overlapping the first lower storage electrode,
    wherein the second pixel circuit comprises:
        a second driving transistor configured to control a second current flowing to the second display element; and
        a second storage capacitor comprising a second lower storage electrode connected to a gate of the second driving transistor and a second upper storage electrode overlapping the second lower storage electrode, and
    wherein a second overlapping area of the second lower storage electrode and the second upper storage electrode is about twice to about four times a first overlapping area of the first lower storage electrode and the first upper storage electrode.

2. The display apparatus of claim 1, wherein the first storage capacitor has a first storage capacitance, and
    wherein the second storage capacitor has a second storage capacitance, the second storage capacitance being about one and a half times to about five times the first storage capacitance.

3. The display apparatus of claim 1, wherein the first driving transistor comprises a first semiconductor layer and the first lower storage electrode on the first semiconductor layer and functioning as the gate of the first driving transistor,
    wherein the second driving transistor comprises a second semiconductor layer and the second lower storage electrode on the second semiconductor layer and functioning as the gate of the second driving transistor,
    wherein the first semiconductor layer comprises a first channel area overlapping the first lower storage electrode and having a $\Omega$ shape, and
    wherein the second semiconductor layer comprises a second channel area overlapping the second lower storage electrode and having a square shape.

4. The display apparatus of claim 1, further comprising:
    a third pixel circuit in the third area; and
    a third display element in the third area and connected to the third pixel circuit, wherein the third pixel circuit comprises:
a third driving transistor configured to control a third current flowing to the third display element; and
a third storage capacitor having a third lower storage electrode connected to a gate of the third driving transistor and a third upper storage electrode overlapping the third lower storage electrode, and
wherein a third overlapping area of the third lower storage electrode and the third upper storage electrode is about twice to about four times the first overlapping area.

5. A display apparatus comprising:
a first pixel circuit;
a first display element connected to the first pixel circuit;
a second pixel circuit;
a second display element connected to the second pixel circuit,
wherein the first pixel circuit comprises:
a first driving transistor configured to control a first current flowing to the first display element;
a first storage capacitor comprising a first lower storage electrode connected to a gate of the first driving transistor and a first upper storage electrode overlapping the first lower storage electrode;
a first compensation transistor configured to connect a drain of the first driving transistor with the gate of the first driving transistor in response to a first scan signal; and
a first boosting capacitor comprising a first upper boosting electrode connected to the gate of the first driving transistor and a first lower boosting electrode connected to a gate of the first compensation transistor and overlapping the first upper boosting electrode,
wherein the second pixel circuit comprises:
a second driving transistor configured to control a second current flowing to the second display element;
a second storage capacitor comprising a second lower storage electrode connected to a gate of the second driving transistor and a second upper storage electrode overlapping the second lower storage electrode;
a second compensation transistor configured to connect a drain of the second driving transistor with the gate of the second driving transistor in response to a second scan signal; and
a second boosting capacitor comprising a second upper boosting electrode connected to the gate of the second driving transistor and a second lower boosting electrode connected to a gate of the second compensation transistor and overlapping the second upper boosting electrode,
wherein a second overlapping area of the second lower storage electrode and the second upper storage electrode is about twice to about four times a first overlapping area of the first lower storage electrode and the first upper storage electrode, and
wherein a fourth overlapping area of the second upper boosting electrode and the second lower boosting electrode is about five times to about eight times a third overlapping area of the first upper boosting electrode and the first lower boosting electrode.

6. The display apparatus of claim 5, wherein the first boosting capacitor has a first boosting capacitance, and
wherein the second boosting capacitor has a second boosting capacitance, the second boosting capacitance being about one to about five times the first boosting capacitance.

7. The display apparatus of claim 5, wherein the first storage capacitor has a first storage capacitance,
wherein the second storage capacitor has a second storage capacitance,
wherein the first boosting capacitor has a first boosting capacitance,
wherein the second boosting capacitor has a second boosting capacitance, and
wherein a ratio of the second boosting capacitance to the second storage capacitance is greater than a ratio of the first boosting capacitance to the first storage capacitance.

8. The display apparatus of claim 5, wherein the second storage capacitor has a second storage capacitance,
wherein the second boosting capacitor has a second boosting capacitance, and
wherein a ratio of the second boosting capacitance to the second storage capacitance is about 4% to about 9%.

9. The display apparatus of claim 5, wherein the first pixel circuit further comprises:
a first scan transistor configured to transmit a first data voltage to the first driving transistor in response to a third scan signal; and
a third boosting capacitor having a third upper boosting electrode connected to the gate of the first driving transistor and a third lower boosting electrode connected to a gate of the first scan transistor and overlapping the third upper boosting electrode,
wherein the second pixel circuit further comprises:
a second scan transistor configured to transmit a second data voltage to the second driving transistor in response to a fourth scan signal; and
a fourth boosting capacitor having a fourth upper boosting electrode connected to the gate of the second driving transistor and a fourth lower boosting electrode connected to a gate of the second scan transistor and overlapping the fourth upper boosting electrode, and
wherein a sixth overlapping area of the fourth upper boosting electrode and the fourth lower boosting electrode is about six times to about nine times a fifth overlapping area of the third upper boosting electrode and the third lower boosting electrode.

10. The display apparatus of claim 9, wherein the first storage capacitor has a first storage capacitance,
wherein the second storage capacitor has a second storage capacitance,
wherein the third boosting capacitor has a third boosting capacitance,
wherein the fourth boosting capacitor has a fourth boosting capacitance, and
wherein a ratio of the fourth boosting capacitance to the second storage capacitance is less than a ratio of the third boosting capacitance to the first storage capacitance.

11. The display apparatus of claim 9, wherein the second storage capacitor has a second storage capacitance,
wherein the fourth boosting capacitor has a fourth boosting capacitance, and
wherein a ratio of the fourth boosting capacitance to the second storage capacitance is about 1% to about 3%.

12. The display apparatus of claim 9, wherein conductive types of the first compensation transistor and the second compensation transistor are opposite to conductive types of the first scan transistor and the second scan transistor.

\* \* \* \* \*